(12) United States Patent
Yamazaki et al.

(10) Patent No.: US 10,504,924 B2
(45) Date of Patent: Dec. 10, 2019

(54) SEMICONDUCTOR DEVICE AND DISPLAY DEVICE INCLUDING THE SEMICONDUCTOR DEVICE

(71) Applicant: Semiconductor Energy Laboratory Co., Ltd., Atsugi-shi, Kanagawa-ken (JP)

(72) Inventors: Shunpei Yamazaki, Setagaya (JP); Yasutaka Nakazawa, Tochigi (JP); Yasuharu Hosaka, Tochigi (JP); Kenichi Okazaki, Tochigi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/583,325

(22) Filed: May 1, 2017

(65) Prior Publication Data

US 2017/0323908 A1 Nov. 9, 2017

(30) Foreign Application Priority Data

May 9, 2016 (JP) .................. 2016-094012

(51) Int. Cl.
*H01L 21/02* (2006.01)
*H01L 29/66* (2006.01)
(Continued)

(52) U.S. Cl.
CPC ...... *H01L 27/1225* (2013.01); *H01L 27/1255* (2013.01); *H01L 29/7869* (2013.01); *H01L 29/78696* (2013.01); *H01L 29/78648* (2013.01)

(58) Field of Classification Search
CPC .......... H01L 29/7869; H01L 29/66969; H01L 29/518; H01L 29/513; H01L 29/4908;
(Continued)

(56) References Cited

U.S. PATENT DOCUMENTS 8,222,092 B2   7/2012   Yamazaki et al.
8,426,868 B2   4/2013   Akimoto et al.
(Continued)

FOREIGN PATENT DOCUMENTS

JP       2014-007399 A       1/2014

OTHER PUBLICATIONS

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.
(Continued)

*Primary Examiner* — Mary A Wilczewski
*Assistant Examiner* — Tsz K Chiu
(74) *Attorney, Agent, or Firm* — Robinson Intellectual Property Law Office; Eric J. Robinson

(57) ABSTRACT

In a transistor including an oxide semiconductor film, field-effect mobility and reliability are improved. A semiconductor device includes a gate electrode, an insulating film over the gate electrode, an oxide semiconductor film over the insulating film, and a pair of electrodes over the oxide semiconductor film. The oxide semiconductor film includes a first oxide semiconductor film and a second oxide semiconductor film over the first oxide semiconductor film. The first oxide semiconductor film is formed using In oxide or In—Zn oxide. The second oxide semiconductor film is formed using In-M-Zn oxide (M is Al, Ga, or Y) and includes a region where the number of In atoms is 40% or more and 50% or less and the number of M atoms is 5% or more and 30% or less of the total number of In, M, and Zn atoms.

10 Claims, 30 Drawing Sheets

(51) Int. Cl.
*H01L 29/786* (2006.01)
*H01L 27/12* (2006.01)

(58) Field of Classification Search
CPC .............. H01L 29/42356; H01L 29/24; H01L 21/02274; H01L 21/0217; H01L 21/02164; H01L 29/78696; H01L 29/1033; H01L 29/26; H01L 29/045; H01L 29/04; H01L 29/247; H01L 29/78693
See application file for complete search history.

(56) References Cited

U.S. PATENT DOCUMENTS

| | | | |
|---|---|---|---|
| 8,633,492 B2 | 1/2014 | Akimoto et al. | |
| 8,759,167 B2 | 6/2014 | Akimoto et al. | |
| 9,136,390 B2 | 9/2015 | Yamazaki et al. | |
| 9,209,314 B2 | 12/2015 | Takemura | |
| 9,281,412 B2 | 3/2016 | Takemura | |
| 9,349,874 B2 | 5/2016 | Akimoto et al. | |
| 9,406,760 B2 | 8/2016 | Shimomura et al. | |
| 9,472,683 B2 | 10/2016 | Takemura | |
| 9,496,408 B2 | 11/2016 | Yamazaki et al. | |
| 9,559,174 B2 | 1/2017 | Shimomura et al. | |
| 9,711,651 B2 | 7/2017 | Yamazaki et al. | |
| 9,735,281 B2 * | 8/2017 | Kim | H01L 29/7869 |
| 9,893,202 B2 * | 2/2018 | Koezuka | H01L 21/02557 |
| 2011/0210328 A1 | 9/2011 | Yamazaki et al. | |
| 2011/0212571 A1 | 9/2011 | Yamazaki et al. | |
| 2011/0215318 A1 | 9/2011 | Yamazaki et al. | |
| 2011/0309411 A1 | 12/2011 | Takemura | |
| 2013/0248858 A1 * | 9/2013 | Morita | C23C 14/086 257/43 |
| 2013/0320334 A1 * | 12/2013 | Yamazaki | H01L 29/7869 257/43 |
| 2014/0077205 A1 * | 3/2014 | Yamazaki | H01L 29/66969 257/43 |
| 2014/0151686 A1 * | 6/2014 | Yamazaki | H01L 29/66969 257/43 |
| 2016/0163866 A1 * | 6/2016 | Kim | H01L 29/7869 257/43 |
| 2016/0190232 A1 * | 6/2016 | Yamazaki | H01L 29/7869 257/43 |
| 2016/0247930 A1 | 8/2016 | Akimoto et al. | |
| 2017/0033229 A1 | 2/2017 | Yamazaki et al. | |
| 2017/0141233 A1 | 5/2017 | Shimomura et al. | |
| 2017/0309749 A1 * | 10/2017 | Kim | H01L 29/7869 |
| 2019/0115474 A1 | 4/2019 | Yamazaki | |

OTHER PUBLICATIONS

Wager.J, "Oxide TFTs: A Progress Report", Information Display, 2016, vol. 32, No. 1, pp. 16-21.

* cited by examiner

600

SEMICONDUCTOR DEVICE AND DISPLAY DEVICE INCLUDING THE SEMICONDUCTOR DEVICE

BACKGROUND OF THE INVENTION

1. Field of the Invention

One embodiment of the present invention relates to a semiconductor device including an oxide semiconductor film. Another embodiment of the present invention relates to a display device including the semiconductor device.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter. In particular, one embodiment of the present invention relates to a semiconductor device, a display device, a light-emitting device, a power storage device, a memory device, a driving method thereof, or a manufacturing method thereof.

In this specification and the like, a semiconductor device generally means a device that can function by utilizing semiconductor characteristics. A semiconductor element such as a transistor, a semiconductor circuit, an arithmetic device, and a memory device are each an embodiment of a semiconductor device. An imaging device, a display device, a liquid crystal display device, a light-emitting device, an electro-optical device, a power generation device (including a thin film solar cell, an organic thin film solar cell, and the like), and an electronic device may each include a semiconductor device.

2. Description of the Related Art

As a semiconductor material that can be used in a transistor, an oxide semiconductor has been attracting attention. For example, Patent Document 1 discloses a semiconductor device whose field-effect mobility (in some cases, simply referred to as mobility or μFE) is improved by stacking a plurality of oxide semiconductor layers, among which the oxide semiconductor layer serving as a channel contains indium and gallium where the proportion of indium is higher than the proportion of gallium.

Non-Patent Document 1 discloses that an oxide semiconductor containing indium, gallium, and zinc has a homologous series represented by $In_{1-x}Ga_{1+x}O_3(ZnO)_m$ (x is a number which satisfies $-1 \leq x \leq 1$, and m is a natural number). Furthermore, Non-Patent Document 1 discloses a solid solution range of a homologous series. For example, in the solid solution range of the homologous series in the case where m=1, x ranges from −0.33 to 0.08, and in the solid solution range of the homologous series in the case where m=2, x ranges from −0.68 to 0.32.

REFERENCE

Patent Document

[Patent Document 1] Japanese Published Patent Application No. 2014-007399

Non-Patent Document

[Non-Patent Document 1] M. Nakamura, N. Kimizuka, and T. Mohri, "The Phase Relations in the $In_2O_3$—$Ga_2ZnO_4$—ZnO System at 1350° C.", *J. Solid State Chem.*, Vol. 93, 1991, pp. 298-315.

SUMMARY OF THE INVENTION

The field-effect mobility of a transistor that uses an oxide semiconductor film as a channel region is preferably as high as possible. However, when the field-effect mobility is increased, the transistor has a problem with its characteristics, that is, the transistor tends to be normally-on. Note that "normally-on" means a state in which a channel exists without application of a voltage to a gate electrode and a current flows through the transistor.

Furthermore, in a transistor that uses an oxide semiconductor film in a channel region, oxygen vacancies formed in the oxide semiconductor film adversely affect the transistor characteristics. For example, oxygen vacancies formed in the oxide semiconductor film are bonded to hydrogen to serve as a carrier supply source. The carrier supply source generated in the oxide semiconductor film causes a change in the electrical characteristics, typically, shift in the threshold voltage, of the transistor including the oxide semiconductor film.

Too many oxygen vacancies in an oxide semiconductor film, for example, shift the threshold voltage of the transistor in the negative direction, causing normally-on characteristics. Thus, it is preferable that a channel region in an oxide semiconductor film especially include few oxygen vacancies or include oxygen vacancies such that normally-on characteristics are not caused.

In view of the foregoing problems, an object of one embodiment of the present invention is to improve field-effect mobility and reliability in a transistor including an oxide semiconductor film. Another object of one embodiment of the present invention is to prevent a change in electrical characteristics of a transistor including an oxide semiconductor film and to improve reliability of the transistor. Another object of one embodiment of the present invention is to provide a semiconductor device with low power consumption. Another object of one embodiment of the present invention is to provide a novel semiconductor device. Another object of one embodiment of the present invention is to provide a novel display device.

Note that the description of the above object does not disturb the existence of other objects. One embodiment of the present invention does not necessarily achieve all of these objects. Objects other than the above objects will be apparent from and can be derived from the description of the specification and the like.

One embodiment of the present invention is a semiconductor device including an oxide semiconductor film. The semiconductor device includes a gate electrode, an insulating film over the gate electrode, the oxide semiconductor film over the insulating film, and a pair of electrodes over the oxide semiconductor film. The oxide semiconductor film includes a first oxide semiconductor film and a second oxide semiconductor film over the first oxide semiconductor film. The first oxide semiconductor film is formed using In oxide or In—Zn oxide. The second oxide semiconductor film is formed using In-M-Zn oxide (M is Al, Ga, or Y). The second oxide semiconductor film includes a region where the number of In atoms is greater than or equal to 40% and less than or equal to 50% of the total number of In, M, and Zn atoms, and a region where the number of M atoms is greater than or equal to 5% and less than or equal to 30% of the total number of In, M, and Zn atoms.

In the above embodiment, the second oxide semiconductor film preferably includes a region whose sheet resistance is higher than or equal to $1 \times 10^2$ Ω/square and lower than $1 \times 10^6$ Ω/square in a region in contact with the pair of electrodes.

In either of the above embodiments, it is preferable that a peak be observed at around $2\theta=31°$ not in the first oxide semiconductor film but in the second oxide semiconductor film when a crystal structure of the oxide semiconductor film is measured by XRD analysis.

In any of the above embodiments, the first oxide semiconductor film preferably includes a region not containing M.

In any of the above embodiments, when an atomic ratio of In to M to Zn is x:y:z and x is 4, the second oxide semiconductor film preferably includes a region where y is higher than or equal to 1.5 and lower than or equal to 2.5 and z is higher than or equal to 2 and lower than or equal to 4. Moreover, the atomic ratio of In to M to Zn is preferably 4:2:3 or in the neighborhood thereof.

In any of the above embodiments, when an atomic ratio of In to M to Zn is x:y:z and x is 5, the second oxide semiconductor film preferably includes a region where y is higher than or equal to 0.5 and lower than or equal to 1.5 and z is higher than or equal to 5 and lower than or equal to 7. Moreover, the atomic ratio of In to M to Zn is preferably 5:1:6 or in the neighborhood thereof.

Another embodiment of the present invention is a display device which includes the semiconductor device according to any one of the above-described embodiments, and a display element. Another embodiment of the present invention is a display module which includes the display device and a touch sensor. Another embodiment of the present invention is an electronic device which includes the semiconductor device according to any one of the above-described embodiments, the above-described display device, or the above-described display module, and an operation key or a battery.

One embodiment of the present invention can improve field-effect mobility and reliability in a transistor including an oxide semiconductor film. One embodiment of the present invention can prevent a change in electrical characteristics of a transistor including an oxide semiconductor film and improve the reliability of the transistor. One embodiment of the present invention can provide a semiconductor device with low power consumption. One embodiment of the present invention can provide a novel semiconductor device. One embodiment of the present invention can provide a novel display device.

Note that the description of these effects does not preclude the existence of other effects. One embodiment of the present invention does not necessarily have all of these effects. Other effects will be apparent from and can be derived from the description of the specification, the drawings, the claims, and the like.

DETAILED DESCRIPTION OF THE INVENTION

Figure 1A:
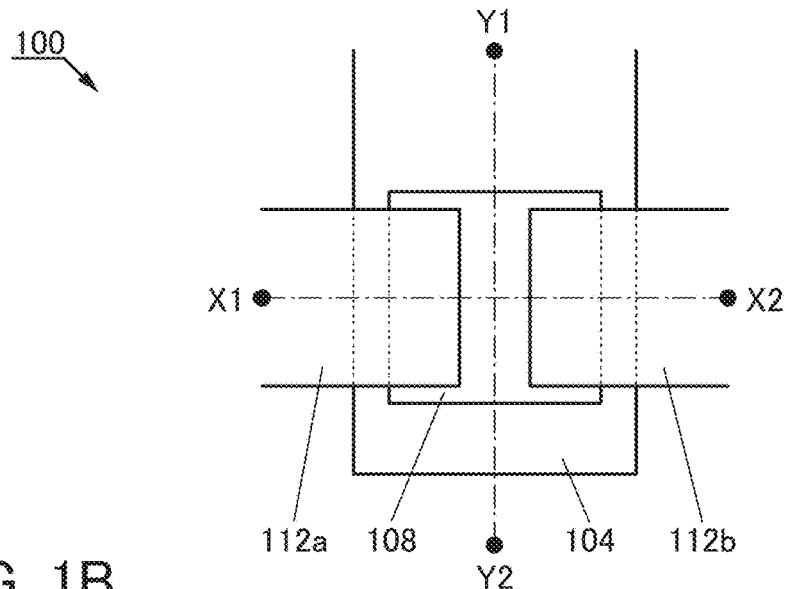
FIGS. 1A to 1C are a top view and cross-sectional views illustrating a semiconductor device.

Hereinafter, embodiments will be described with reference to drawings. However, the embodiments can be implemented in many different modes, and it will be readily appreciated by those skilled in the art that modes and details thereof can be changed in various ways without departing from the spirit and scope of the present invention. Thus, the present invention should not be interpreted as being limited to the following description of the embodiments.

In the drawings, the size, the layer thickness, or the region is exaggerated for clarity in some cases. Therefore, embodiments of the present invention are not limited to such a scale. Note that the drawings are schematic views showing ideal examples, and embodiments of the present invention are not limited to shapes or values shown in the drawings.

Note that in this specification, ordinal numbers such as "first", "second", and "third" are used in order to avoid confusion among components, and the terms do not limit the components numerically.

Note that in this specification, terms for describing arrangement, such as "over", "above", "under", and "below", are used for convenience in describing a positional relation between components with reference to drawings. Further, the positional relation between components is changed as appropriate in accordance with a direction in which the components are described. Thus, the positional relation is not limited to that described with a term used in this specification and can be explained with another term as appropriate depending on the situation.

In this specification and the like, a transistor is an element having at least three terminals of a gate, a drain, and a source. In addition, the transistor has a channel region between a drain (a drain terminal, a drain region, or a drain electrode) and a source (a source terminal, a source region, or a source electrode), and current can flow between the source and the drain through the channel region. Note that in this specification and the like, a channel region refers to a region through which current mainly flows.

Further, functions of a source and a drain might be switched when transistors having different polarities are employed or a direction of current flow is changed in circuit operation, for example. Therefore, the terms "source" and "drain" can be switched in this specification and the like.

Note that in this specification and the like, the expression "electrically connected" includes the case where components are connected through an "object having any electric function". There is no particular limitation on an "object having any electric function" as long as electric signals can be transmitted and received between components that are connected through the object. Examples of an "object having any electric function" are a switching element such as a transistor, a resistor, an inductor, a capacitor, and elements with a variety of functions as well as an electrode and a wiring.

In this specification and the like, the term "parallel" means that the angle formed between two straight lines is greater than or equal to −10° and less than or equal to 10°, and accordingly also covers the case where the angle is greater than or equal to −5° and less than or equal to 5°. The term "perpendicular" means that the angle formed between two straight lines is greater than or equal to 80° and less than or equal to 100°, and accordingly also covers the case where the angle is greater than or equal to 85° and less than or equal to 95°.

In this specification and the like, the terms "film" and "layer" can be interchanged with each other. For example, the term "conductive layer" can be changed into the term "conductive film" in some cases. Also, the term "insulating film" can be changed into the term "insulating layer" in some cases.

Unless otherwise specified, the off-state current in this specification and the like refers to a drain current of a transistor in the off state (also referred to as non-conduction state and cutoff state). Unless otherwise specified, the off state of an n-channel transistor means that a gate-source voltage $V_{gs}$ is lower than the threshold voltage $V_{th}$, and the off state of a p-channel transistor means that the gate-source voltage $V_{gs}$ is higher than the threshold voltage $V_{th}$. For example, the off-state current of an n-channel transistor sometimes refers to a drain current that flows when the gate-source voltage $V_{gs}$ is lower than the threshold voltage $V_{th}$.

The off-state current of a transistor depends on $V_{gs}$ in some cases. Thus, "the off-state current of a transistor is lower than or equal to I" may mean "there is $V_{gs}$ with which the off-state current of the transistor becomes lower than or equal to I". Furthermore, "the off-state current of a transistor" means "the off-state current in an off state at predetermined $V_{gs}$", "the off-state current in an off state at $V_{gs}$ in a predetermined range", "the off-state current in an off state at $V_{gs}$ with which sufficiently reduced off-state current is obtained", or the like.

As an example, the assumption is made of an n-channel transistor where the threshold voltage $V_{th}$ is 0.5 V and the drain current is $1 \times 10^{-9}$ A at $V_{gs}$ of 0.5 V, $1 \times 10^{-13}$ A at $V_{gs}$ of 0.1 V, $1 \times 10^{-19}$ A at $V_{gs}$ of −0.5 V, and $1 \times 10^{-22}$ A at $V_{gs}$ of −0.8 V. The drain current of the transistor is $1 \times 10^{-19}$ A or lower at $V_{gs}$ of −0.5 V or at $V_{gs}$ in the range of −0.8 V to −0.5 V; therefore, it may be said that the off-state current of the transistor is $1 \times 10^{-19}$ A or lower. Since there is $V_{gs}$ at which the drain current of the transistor is $1 \times 10^{-22}$ A or lower, it may be said that the off-state current of the transistor is $1 \times 10^{-22}$ A or lower.

In this specification and the like, the off-state current of a transistor with a channel width W is sometimes represented by a current value in relation to the channel width W or by a current value per given channel width (e.g., 1 μm). In the latter case, the off-state current may be expressed in the unit with the dimension of current per length (e.g., A/μm).

The off-state current of a transistor depends on temperature in some cases. Unless otherwise specified, the off-state current in this specification may be an off-state current at room temperature, 60° C., 85° C., 95° C., or 125° C. Alternatively, the off-state current may be an off-state current at a temperature at which the reliability required in a semiconductor device or the like including the transistor is ensured or a temperature at which the semiconductor device or the like including the transistor is used (e.g., temperature in the range of 5° C. to 35° C.). The description "an off-state current of a transistor is lower than or equal to I" may refer to a situation where there is $V_{gs}$ at which the off-state current of a transistor is lower than or equal to I at room temperature, 60° C., 85° C., 95° C., 125° C., a temperature at which the reliability required in a semiconductor device or the like including the transistor is ensured, or a temperature at which the semiconductor device or the like including the transistor is used (e.g., temperature in the range of 5° C. to 35° C.).

The off-state current of a transistor depends on a drain-source voltage $V_{ds}$ in some cases. Unless otherwise specified, the off-state current in this specification may be an off-state current at $V_{ds}$ of 0.1 V, 0.8 V, 1 V, 1.2 V, 1.8 V, 2.5 V, 3 V, 3.3 V, 10 V, 12 V, 16 V, or 20 V. Alternatively, the off-state current might be an off-state current at $V_{ds}$ at which the required reliability of a semiconductor device or the like including the transistor is ensured or $V_{ds}$ at which the semiconductor device or the like including the transistor is used. The description "an off-state current of a transistor is lower than or equal to I" may refer to a situation where there is $V_{gs}$ at which the off-state current of a transistor is lower than or equal to I at $V_{ds}$ of 0.1 V, 0.8 V, 1 V, 1.2 V, 1.8 V, 2.5 V, 3 V, 3.3 V, 10 V, 12 V, 16 V, or 20 V, $V_{ds}$ at which the required reliability of a semiconductor device or the like including the transistor is ensured, or $V_{ds}$ at which the semiconductor device or the like including the transistor is used.

In the above description of off-state current, a drain may be replaced with a source. That is, the off-state current sometimes refers to a current that flows through a source of a transistor in the off state.

In this specification and the like, the term "leakage current" sometimes expresses the same meaning as off-state current. In this specification and the like, the off-state current sometimes refers to a current that flows between a source and a drain when a transistor is off, for example.

In this specification and the like, the threshold voltage of a transistor refers to a gate voltage ($V_g$) at which a channel is formed in the transistor. Specifically, in a graph where the horizontal axis represents the gate voltage ($V_g$) and the vertical axis represents the square root of drain current ($I_d$), the threshold voltage of a transistor may refer to a gate voltage ($V_g$) at the intersection of the square root of drain current ($I_d$) of 0 ($I_d$=0 A) and an extrapolated straight line that is tangent with the highest inclination to a plotted curve ($V_g$–$\sqrt{I_d}$ characteristics). Alternatively, the threshold voltage of a transistor may refer to a gate voltage ($V_g$) at which the value of $I_d$ [A]×L [μm]/W[μm] is $1\times10^{-9}$ [A] where L is channel length and W is channel width.

In this specification and the like, a "semiconductor" can have characteristics of an "insulator" when the conductivity is sufficiently low, for example. Further, a "semiconductor" and an "insulator" cannot be strictly distinguished from each other in some cases because a border between the "semiconductor" and the "insulator" is not clear. Accordingly, a "semiconductor" in this specification and the like can be called an "insulator" in some cases. Similarly, an "insulator" in this specification and the like can be called a "semiconductor" in some cases. An "insulator" in this specification and the like can be called a "semi-insulator" in some cases.

In this specification and the like, a "semiconductor" can have characteristics of a "conductor" when the conductivity is sufficiently high, for example. Further, a "semiconductor" and a "conductor" cannot be strictly distinguished from each other in some cases because a border between the "semiconductor" and the "conductor" is not clear. Accordingly, a "semiconductor" in this specification and the like can be called a "conductor" in some cases. Similarly, a "conductor" in this specification and the like can be called a "semiconductor" in some cases.

In this specification and the like, an impurity in a semiconductor refers to an element that is not a main component of a semiconductor film. For example, an element with a concentration of lower than 0.1 atomic % is an impurity. If a semiconductor contains an impurity, the density of states (DOS) may be formed therein, the carrier mobility may be decreased, or the crystallinity may be decreased, for example. In the case where the semiconductor includes an oxide semiconductor, examples of the impurity which changes the characteristics of the semiconductor include Group 1 elements, Group 2 elements, Group 13 elements, Group 14 elements, Group 15 elements, and transition metals other than the main components; specific examples are hydrogen (also included in water), lithium, sodium, silicon, boron, phosphorus, carbon, and nitrogen. When the semiconductor is an oxide semiconductor, oxygen vacancies may be formed by entry of impurities such as hydrogen, for example. Furthermore, in the case where the semiconductor includes silicon, examples of the impurity which changes the characteristics of the semiconductor include oxygen, Group 1 elements except oxygen and hydrogen, Group 2 elements, Group 13 elements, and Group 15 elements.

Embodiment 1

In this embodiment, a semiconductor device of one embodiment of the present invention and a manufacturing method thereof will be described with reference to FIGS. 1A to 1C, FIGS. 2A to 2C, FIGS. 3A to 3C, FIGS. 4A to 4C, FIGS. 5A to 5C, FIGS. 6A to 6C, FIGS. 7A to 7C, FIGS. 8A to 8C, FIGS. 9A to 9C, FIGS. 10A and 10B, and FIGS. 11A and 11B.

<1-1. Structural Example 1 of Semiconductor Device>

Figure 1B:
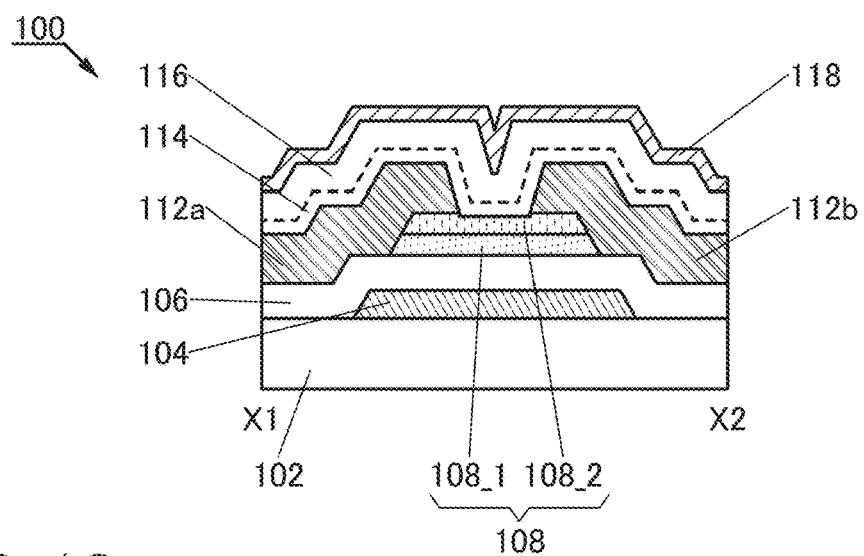
Figure 1C:
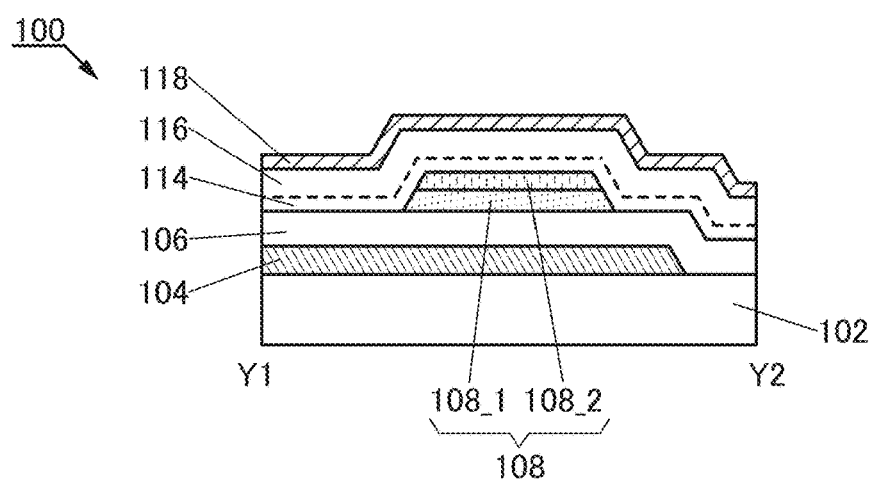

FIG. 1A is a plan view of a transistor 100 that is a semiconductor device of one embodiment of the present invention. FIG. 1B is a cross-sectional view taken along a dashed dotted line X1-X2 in FIG. 1A, and FIG. 1C is a cross-sectional view taken along a dashed dotted line Y1-Y2 in FIG. 1A. Note that in FIG. 1A, some components of the transistor 100 (e.g., an insulating film serving as a gate insulating film) are not illustrated to avoid complexity. Furthermore, the direction of the dashed dotted line X1-X2 may be referred to as a channel length direction, and the direction of the dashed dotted line Y1-Y2 may be referred to as a channel width direction. As in FIG. 1A, some components are not illustrated in some cases in plan views of transistors described below.

The transistor 100 includes a conductive film 104 over a substrate 102, an insulating film 106 over the substrate 102 and the conductive film 104, an oxide semiconductor film 108 over the insulating film 106, a conductive film 112a over the oxide semiconductor film 108, and a conductive film 112b over the oxide semiconductor film 108. Furthermore, an insulating film 114, an insulating film 116 over the insulating film 114, and an insulating film 118 over the insulating film 116 are formed over the transistor 100, specifically over the oxide semiconductor film 108, the conductive film 112a, and the conductive film 112b.

Note that the transistor 100 is what is called a channel-etched transistor.

Furthermore, the oxide semiconductor film 108 includes an oxide semiconductor film 108_1 over the insulating film 106 and an oxide semiconductor film 108_2 over the oxide semiconductor film 108_1. Note that the oxide semiconductor film 108_1 includes In oxide or In—Zn oxide. In addition, the oxide semiconductor film 108_2 includes In-M-Zn oxide (M is Al, Ga, or Y).

The oxide semiconductor film 108_2 includes a region where the number of In atoms is greater than or equal to 40% and less than or equal to 50% of the total number of In, M, and Zn atoms, and a region where the number of M atoms is greater than or equal to 5% and less than or equal to 30% of the total number of In, M, and Zn atoms. The oxide semiconductor film 108_2 including the above regions can have high crystallinity and a high carrier density.

Specifically, the atomic ratio of In to M to Zn in the oxide semiconductor film 108_2 is preferably 4:2:3 or in the neighborhood thereof or 5:1:6 or in the neighborhood thereof. Here, "4:2:3 or in the neighborhood thereof" means that, in the case where the atomic ratio of In to M to Zn is x:y:z and x is 4, y is higher than or equal to 1.5 and lower than or equal to 2.5 and z is higher than or equal to 2 and lower than or equal to 4. Moreover, "5:1:6 or in the neighborhood thereof" means that, in the case where the atomic ratio of In to M to Zn is x:y:z and x is 5, y is higher than or equal to 0.5 and lower than or equal to 1.5 and z is higher than or equal to 5 and lower than or equal to 7.

The oxide semiconductor film 108_2 preferably includes a region whose sheet resistance is higher than or equal to $1\times10^2$ Ω/sq. and lower than $1\times10^6$ Ω/sq. in a region in contact with the conductive films 112a and 112b. When the oxide semiconductor film 108_2 includes such a region, the contact resistance between the oxide semiconductor film 108_2 and the conductive films 112a and 112b can be reduced.

In particular, the oxide semiconductor film 108_1 is preferably formed using In—Zn oxide. The In—Zn oxide can be formed using an oxide target with the atomic ratio of In:Zn=2:3. The atomic ratio of the oxide semiconductor film 108_1 is preferably In:Zn=2:3 or in the neighborhood thereof. In addition, the oxide semiconductor film 108_1 preferably includes a region not containing M (e.g., Ga), which is contained in the oxide semiconductor film 108_2.

When the oxide semiconductor film 108_1 contains Ga, formation of oxygen vacancies in the oxide semiconductor film 108_1 can be suppressed because Ga is strongly bonded to oxygen. Accordingly, the stability of the transistor including the oxide semiconductor film 108_1 can be increased. On the other hand, when the oxide semiconductor film 108_1 contains Ga, the transistor including the oxide semiconductor film 108_1 may have reduced on-state current and reduced field-effect mobility. Therefore, in order to increase the on-state current and field-effect mobility of the transistor, the structure in which the oxide semiconductor film 108_1 does not contain Ga is favorable.

Moreover, the oxide semiconductor film 108_1 may contain one or more elements selected from Sn, W, and Hf, in addition to In or Zn. For the oxide semiconductor film 108_1, typically, In—Sn oxide (also referred to as ITO), In—Sn—Zn oxide, In—Hf oxide, In—Hf—Zn oxide, In—W oxide, In—W—Zn oxide, or the like can be used.

Note that Sn, W, and Hf are more strongly bonded to oxygen than In and Zn are. Thus, when the oxide semiconductor film 108_1 contains one or more elements selected from Sn, W, and Hf, the elements, instead of Ga, can suppress formation of oxygen vacancies. Moreover, the valences of Sn, W, and Hf are higher than those of In and Ga. Specifically, Sn and Hf have a valence of 4 and W has a valence of 4 or 6 while In and Ga have a valence of 3. With the use of an element whose valence is higher than those of In and Ga for the oxide semiconductor film 108_1, this element may serve as a donor source and may increase the carrier density of the oxide semiconductor film 108_1. As described above, when the oxide semiconductor film 108_1 contains an element whose valence is higher than those of In and Ga, formation of oxygen vacancies can be suppressed and the on-state current and field-effect mobility of the transistor can be increased.

Furthermore, the oxide semiconductor film 108_1 may be formed using In oxide, In—Zn oxide, In—Sn oxide, In—Sn—Zn oxide, In—Hf oxide, In—Hf—Zn oxide, In—W oxide, or In—W—Zn oxide and contain Si. When the oxide semiconductor film 108_1 contains Si, formation of oxygen vacancies that can be formed in the oxide semiconductor film 108_1 can be further suppressed. Note that when the oxide semiconductor film 108_1 contains a large amount of Si, for example, 10 atomic % or more of Si, the density of defect states in the oxide semiconductor film 108_1 is increased in some cases. Therefore, when the oxide semiconductor film 108_1 contains Si, the content of Si is preferably less than 10 atomic % and more preferably less than 5 atomic %. For the oxide semiconductor film 108_1 containing Si, typically, In—Si oxide, In—Zn—Si oxide, In—Sn—Si oxide (also referred to as ITSO), or the like can be used.

When the oxide semiconductor film 108_1 has the above structure, the transistor 100 can have high field-effect mobility. Specifically, the field-effect mobility of the transistor 100 can exceed 50 $cm^2/Vs$, preferably exceed 100 $cm^2/Vs$.

The use of the transistor with high field-effect mobility in a gate driver that generates a gate signal allows a display device to have a narrow frame, for example. The use of the transistor with high field-effect mobility in a source driver (particularly in a demultiplexer connected to an output terminal of a shift register included in a source driver) that is included in a display device and supplies a signal from a signal line can reduce the number of wirings connected to the display device.

The crystal structure of the oxide semiconductor film 108_1 is not particularly limited. The oxide semiconductor film 108_1 may have either or both of a single crystal structure and a non-single crystal structure.

The non-single crystal structure includes, for example, a c-axis aligned crystalline oxide semiconductor (CAAC-OS) described later, a polycrystalline structure, a microcrystalline structure, and an amorphous structure. Moreover, a bixbyite crystal structure, a layered crystal structure, and the like are given as the crystal structure. A mixed crystal structure including a bixbyite crystal structure and a layered crystal structure may be used.

The oxide semiconductor film 108_2 favorably includes a layered crystal structure, in particular, a crystal structure having c-axis alignment. In other words, the oxide semiconductor film 108_2 favorably includes a CAAC-OS.

It is favorable that the oxide semiconductor film 108_1 includes an amorphous structure or a microcrystalline structure and the oxide semiconductor film 108_2 includes a crystal structure having c-axis alignment, for example. That is, the oxide semiconductor film 108_1 includes a region having lower crystallinity than the oxide semiconductor film 108_2. Note that the crystallinity of the oxide semiconductor film 108 can be determined by analysis by X-ray diffraction (XRD) or with a transmission electron microscope (TEM).

For example, when the crystal structure of the oxide semiconductor film 108 is measured by XRD analysis, a peak is observed at around $2\theta=31°$ not in the oxide semiconductor film 108_1 but in the oxide semiconductor film 108_2.

In the case where the oxide semiconductor film 108_1 has a region having low crystallinity, the following effects can be achieved.

First, oxygen vacancies that might be formed in the oxide semiconductor film 108 will be described.

Oxygen vacancies formed in the oxide semiconductor film 108 adversely affect the transistor characteristics and therefore cause a problem. For example, oxygen vacancies formed in the oxide semiconductor film 108 are bonded to hydrogen to serve as a carrier supply source. The carrier supply source generated in the oxide semiconductor film 108 causes a change in the electrical characteristics, typically, shift in the threshold voltage, of the transistor 100 including the oxide semiconductor film 108. Therefore, it is preferable that the amount of oxygen vacancies in the oxide semiconductor film 108 be as small as possible.

In view of this, one embodiment of the present invention is a structure in which insulating films in the vicinity of the oxide semiconductor film 108, specifically the insulating films 114 and 116 formed over the oxide semiconductor film 108, include excess oxygen. Oxygen or excess oxygen is transferred from the insulating films 114 and 116 to the oxide semiconductor film 108, whereby the oxygen vacancies in the oxide semiconductor film can be reduced.

Figure 11A:
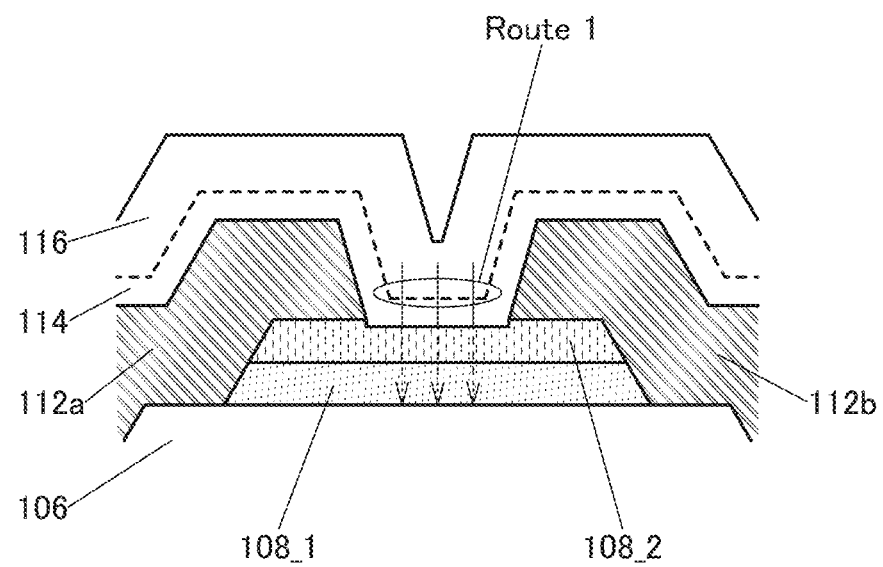
FIGS. 11A and 11B are schematic views illustrating diffusion paths of oxygen or excess oxygen diffused into an oxide semiconductor film.
Figure 11B:
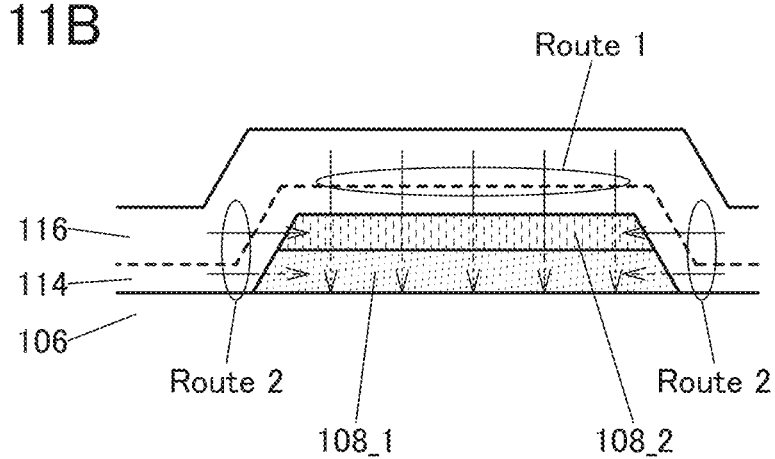

Here, the path of oxygen or excess oxygen diffused into the oxide semiconductor film 108 will be described with reference to FIGS. 11A and 11B. FIGS. 11A and 11B are schematic views illustrating the diffusion paths of oxygen or excess oxygen diffused into the oxide semiconductor film 108. FIG. 11A is the schematic view in the channel length direction and FIG. 11B is the schematic view in the channel width direction.

Oxygen or excess oxygen of the insulating films 114 and 116 is diffused into the oxide semiconductor film 108_1 from above, i.e., through the oxide semiconductor film 108_2 (Route 1 in FIGS. 11A and 11B).

Alternatively, oxygen or excess oxygen of the insulating films 114 and 116 is diffused into the oxide semiconductor film 108 through the side surfaces of the oxide semiconductor film 108_1 and the oxide semiconductor film 108_2 (Route 2 in FIG. 11B).

For example, diffusion of oxygen or excess oxygen by Route 1 shown in FIGS. 11A and 11B is sometimes prevented when the oxide semiconductor film 108_2 has high crystallinity. In contrast, oxygen or excess oxygen can be diffused into the oxide semiconductor film 108_1 and the oxide semiconductor film 108_2 through the side surfaces of the oxide semiconductor film 108_1 and the oxide semiconductor film 108_2 by Route 2 shown in FIG. 11B.

Since the oxide semiconductor film 108_1 includes a region having lower crystallinity than the oxide semiconductor film 108_2, the region serves as a diffusion path of excess oxygen, so that excess oxygen can also be diffused into the oxide semiconductor film 108_2 having higher crystallinity than the oxide semiconductor film 108_1 by Route 2 shown in FIG. 11B. Although not shown in FIGS. 11A and 11B, when the insulating film 106 contains oxygen or excess oxygen, the oxygen or excess oxygen might also be diffused from the insulating film 106 into the oxide semiconductor film 108.

As described above, a stacked-layer structure that includes the oxide semiconductor films having different crystal structures is formed in a semiconductor device of one embodiment of the present invention and the region having low crystallinity serves as a diffusion path of excess oxygen, whereby the semiconductor device can be highly reliable.

Note that in the case where the oxide semiconductor film 108 consists only of an oxide semiconductor film having low crystallinity, the reliability might be lowered because of attachment or entry of impurities (e.g., hydrogen or moisture) to the back channel side of the oxide semiconductor film, i.e., a region corresponding to the oxide semiconductor film 108_2.

Impurities such as hydrogen or moisture entering the oxide semiconductor film 108 adversely affect the transistor characteristics and therefore cause a problem.

Therefore, it is preferable that the amount of impurities such as hydrogen or moisture in the oxide semiconductor film 108 be as small as possible.

In view of the above, in one embodiment of the present invention, the oxide semiconductor film over the oxide semiconductor film has higher crystallinity to inhibit entry of impurities to the oxide semiconductor film 108. In particular, the higher crystallinity of the oxide semiconductor film 108_2 can inhibit damage at the time of processing the conductive films 112a and 112b. The surface of the oxide semiconductor film 108, i.e., the surface of the oxide semiconductor film 108_2 is exposed to an etchant or an etching gas at the time of processing the conductive films 112a and 112b. However, since the oxide semiconductor film 108_2 includes a region having high crystallinity and thus has higher etching resistance than the oxide semiconductor film 108_1 having lower crystallinity, it serves as an etching stopper.

Note that it is preferable to use, as the oxide semiconductor film 108, an oxide semiconductor film in which the impurity concentration is low and the density of defect states is low, in which case the transistor can have more excellent electrical characteristics. Here, the state in which the impurity concentration is low and the density of defect states is low (the amount of oxygen vacancies is small) is referred to as "highly purified intrinsic" or "substantially highly purified intrinsic". Typical examples of impurities contained in the oxide semiconductor film include water and hydrogen. In this specification and the like, reducing or removing water and hydrogen from the oxide semiconductor film is referred to as dehydration or dehydrogenation in some cases. Moreover, adding oxygen to the oxide semiconductor film is referred to as oxygen addition in some cases, and a state in which oxygen in excess of the stoichiometric composition is contained is referred to as an oxygen-excess state in some cases.

A highly purified intrinsic or substantially highly purified intrinsic oxide semiconductor film has few carrier generation sources, and thus can have a low carrier density. Thus, a transistor in which a channel region is formed in the oxide semiconductor film rarely has a negative threshold voltage (is rarely normally-on). A highly purified intrinsic or substantially highly purified intrinsic oxide semiconductor film has a low density of defect states and accordingly has a low density of trap states in some cases. Furthermore, the highly purified intrinsic or substantially highly purified intrinsic oxide semiconductor film has an extremely low off-state current; even when an element has a channel width W of $1\times10^6$ μm and a channel length L of 10 μm, the off-state current can be less than or equal to the measurement limit of a semiconductor parameter analyzer, that is, less than or equal to $1\times10^{-13}$ A, at a voltage (drain voltage) between a source electrode and a drain electrode of from 1 V to 10 V.

By including a region having lower crystallinity than the oxide semiconductor film 108_2, the oxide semiconductor film 108_1 sometimes has a high carrier density. Since the oxide semiconductor film 108_1 is formed using In oxide or In—Zn oxide, the oxide semiconductor film 108_1 can have a high carrier density.

When the oxide semiconductor film 108_1 has a high carrier density, the Fermi level is sometimes high relative to the conduction band of the oxide semiconductor film 108_1. This lowers the conduction band minimum of the oxide semiconductor film 108_1, so that the energy difference between the conduction band minimum of the oxide semiconductor film 108_1 and the trap level, which might be formed in a gate insulating film (here, the insulating film 106), is increased in some cases. The increase of the energy difference can reduce trap of charges in the gate insulating film and reduce variation in the threshold voltage of the transistor, in some cases. In addition, when the oxide semiconductor film 108_1 has a high carrier density, the oxide semiconductor film 108 can have high field-effect mobility.

In the transistor 100 illustrated in FIGS. 1A to 1C, the insulating film 106 functions as a gate insulating film of the transistor 100, and the insulating films 114, 116, and 118 function as protective insulating films of the transistor 100. Furthermore, in the transistor 100, the conductive film 104 functions as a gate electrode, the conductive film 112a functions as a source electrode, and the conductive film 112b functions as a drain electrode. Note that in this specification and the like, in some cases, the insulating film 106 is referred to as a first insulating film, the insulating films 114 and 116 are collectively referred to as a second insulating film, and the insulating film 118 is referred to as a third insulating film.

<1-2. Components of Semiconductor Device>

Next, components of the semiconductor device in this embodiment will be described in detail.

[Substrate]

There is no particular limitation on a material and the like of the substrate 102 as long as the material has heat resistance high enough to withstand at least heat treatment to be performed later. For example, a glass substrate, a ceramic substrate, a quartz substrate, a sapphire substrate, or the like may be used as the substrate 102. Alternatively, a single crystal semiconductor substrate or a polycrystalline semiconductor substrate of silicon or silicon carbide, a compound semiconductor substrate of silicon germanium, an SOI substrate, or the like can be used, or any of these substrates provided with a semiconductor element may be used as the substrate 102. In the case where a glass substrate is used as the substrate 102, a glass substrate having any of the following sizes can be used: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm). Thus, a large-sized display device can be fabricated.

Alternatively, a flexible substrate may be used as the substrate 102, and the transistor 100 may be provided directly on the flexible substrate. Alternatively, a separation layer may be provided between the substrate 102 and the transistor 100. The separation layer can be used when part or the whole of a semiconductor device formed over the separation layer is separated from the substrate 102 and transferred onto another substrate. In such a case, the transistor 100 can be transferred to a substrate having low heat resistance or a flexible substrate as well.

[Conductive Film]

The conductive film 104 functioning as a gate electrode and the conductive films 112a and 112b functioning as a source electrode and a drain electrode can each be formed using a metal element selected from chromium (Cr), copper (Cu), aluminum (Al), gold (Au), silver (Ag), zinc (Zn), molybdenum (Mo), tantalum (Ta), titanium (Ti), tungsten (W), manganese (Mn), nickel (Ni), iron (Fe), and cobalt (Co); an alloy including any of these metal elements as its component; an alloy including a combination of any of these metal elements; or the like.

Furthermore, the conductive films 104, 112a, and 112b can be formed using an oxide conductor or an oxide semiconductor, such as an oxide including indium and tin (In—Sn oxide), an oxide including indium and tungsten (In—W oxide), an oxide including indium, tungsten, and zinc (In—W—Zn oxide), an oxide including indium and titanium (In—Ti oxide), an oxide including indium, titanium, and tin (In—Ti—Sn oxide), an oxide including indium and zinc (In—Zn oxide), an oxide including indium, tin, and silicon (In—Sn—Si oxide), or an oxide including indium, gallium, and zinc (In—Ga—Zn oxide).

Here, an oxide conductor is described. In this specification and the like, an oxide conductor may be referred to as OC. For example, oxygen vacancies are formed in an oxide semiconductor, and then hydrogen is added to the oxygen vacancies, so that a donor level is formed in the vicinity of the conduction band. This increases the conductivity of the oxide semiconductor; accordingly, the oxide semiconductor becomes a conductor. The oxide semiconductor having become a conductor can be referred to as an oxide conductor. Oxide semiconductors generally transmit visible light because of their large energy gap. Since an oxide conductor is an oxide semiconductor having a donor level in the vicinity of the conduction band, the influence of absorption due to the donor level is small in an oxide conductor, and an oxide conductor has a visible light transmitting property comparable to that of an oxide semiconductor.

A Cu—X alloy film (X is Mn, Ni, Cr, Fe, Co, Mo, Ta, or Ti) may be used for the conductive films 104, 112a, and 112b. The use of a Cu—X alloy film results in lower manufacturing costs because the film can be processed by wet etching.

Among the above-mentioned metal elements, any one or more elements selected from copper, titanium, tungsten, tantalum, and molybdenum are favorably included in the conductive films 112a and 112b. In particular, a tantalum nitride film is favorably used for the conductive films 112a and 112b. A tantalum nitride film has conductivity and a high barrier property against copper or hydrogen. Because a tantalum nitride film releases little hydrogen from itself, it can be most favorably used as the conductive film in contact with the oxide semiconductor film 108 or the conductive film in the vicinity of the oxide semiconductor film 108. It is favorable to use a copper film for the conductive films 112a and 112b because the resistance of the conductive films 112a and 112b can be reduced.

The conductive films 112a and 112b can be formed by electroless plating. As a material that can be deposited by electroless plating, for example, one or more elements selected from Cu, Ni, Al, Au, Sn, Co, Ag, and Pd can be used. In particular, it is favorable to use Cu or Ag because the resistance of the conductive film can be reduced.

[Insulating Film Functioning as Gate Insulating Film]

As the insulating film 106 functioning as a gate insulating film of the transistor 100, an insulating layer including at least one of the following films formed by a plasma enhanced chemical vapor deposition (PECVD) method, a sputtering method, or the like can be used: a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film. Note that the insulating film 106 may have a layered structure of two, three or more layers.

The insulating film 106 that is in contact with the oxide semiconductor film 108 functioning as a channel region of the transistor 100 is preferably an oxide insulating film and preferably includes a region including oxygen in excess of the stoichiometric composition (oxygen-excess region). In other words, the insulating film 106 is an insulating film capable of releasing oxygen. In order to provide the oxygen-excess region in the insulating film 106, the insulating film 106 is formed in an oxygen atmosphere, or the deposited insulating film 106 is subjected to heat treatment in an oxygen atmosphere, for example.

In the case where hafnium oxide is used for the insulating film 106, the following effect is attained. Hafnium oxide has higher dielectric constant than silicon oxide and silicon oxynitride. Therefore, the insulating film 106 using hafnium oxide can have a larger thickness than the insulating film 106 using silicon oxide, so that leakage current due to tunnel current can be low. That is, it is possible to achieve a transistor with a low off-state current. Moreover, hafnium oxide having a crystal structure has a higher dielectric constant than hafnium oxide having an amorphous structure. Therefore, it is preferable to use hafnium oxide having a crystal structure, in order to provide a transistor with a low off-state current. Examples of the crystal structure include a monoclinic crystal structure and a cubic crystal structure.

Note that one embodiment of the present invention is not limited to the above examples.

In this embodiment, a layered film of a silicon nitride film and a silicon oxide film is formed as the insulating film 106. The silicon nitride film has a higher dielectric constant than a silicon oxide film and needs a larger thickness for capacitance equivalent to that of the silicon oxide film. Thus, when the silicon nitride film is included in the gate insulating film of the transistor 100, the thickness of the insulating film can be increased. This makes it possible to reduce a decrease in withstand voltage of the transistor 100 and furthermore to increase the withstand voltage, thereby reducing electrostatic discharge damage to the transistor 100.

[Oxide Semiconductor Film]

The oxide semiconductor film 108 can be formed using the materials described above.

In the case where the oxide semiconductor film 108_1 is formed using In—Zn oxide, it is preferable that the atomic ratio of metal elements of a sputtering target used for forming a film of the In—Zn oxide satisfy In≥Zn. Examples of the atomic ratio of the metal elements in a sputtering target include In:Zn=1:1 and In:Zn=4:1. However, a sputtering target is not limited to these examples, a sputtering target satisfying In<Zn may be used for forming the oxide semiconductor film 108_1. Examples of the atomic ratio of the metal elements of a sputtering target include In:Zn=2:3.

In the case where the oxide semiconductor film 108_2 is formed using In-M-Zn oxide, it is preferable that the atomic ratio of metal elements of a sputtering target used for forming the In-M-Zn oxide satisfy In>M The atomic ratio of metal elements in such a sputtering target is, for example, In:M:Zn=2:1:3, In:M:Zn=3:1:2, In:M:Zn=4:2:4.1, In:M:Zn=5:1:6, In:M:Zn=5:1:7, In:M:Zn=5:1:8, In:M:Zn=6:1:6, or In:M:Zn=5:2:5.

In the case where the oxide semiconductor film 108_2 is formed using In-M-Zn oxide, it is preferable to use a target including polycrystalline In-M-Zn oxide as the sputtering target. The use of the target including polycrystalline In-M-Zn oxide facilitates formation of the oxide semiconductor film 108_2 having crystallinity. Note that the atomic ratio of metal elements in the formed oxide semiconductor film 108_2 varies from the above atomic ratios of metal elements of the sputtering targets in a range of ±40%. For example, when a sputtering target with the atomic ratio of In to Ga to Zn of 4:2:4.1 is used, the atomic ratio of In to Ga to Zn in the formed oxide semiconductor film 108 may be 4:2:3 or in the neighborhood thereof.

The energy gap of the oxide semiconductor film 108_2 is 2 eV or more, preferably 2.5 eV or more. With the use of an oxide semiconductor having such a wide energy gap, the off-state current of the transistor 100 can be reduced.

[Insulating Film 1 Functioning as Protective Insulating Film]

The insulating films 114 and 116 function as protective insulating films for the transistor 100. In addition, the insulating films 114 and 116 each have a function of supplying oxygen to the oxide semiconductor film 108. That is, the insulating films 114 and 116 contain oxygen. The insulating film 114 is an insulating film that allows oxygen to pass therethrough. Note that the insulating film 114 also functions as a film that relieves damage to the oxide semiconductor film 108 at the time of forming the insulating film 116 in a later step.

A silicon oxide film, a silicon oxynitride film, or the like with a thickness greater than or equal to 5 nm and less than or equal to 150 nm, preferably greater than or equal to 5 nm and less than or equal to 50 nm can be used as the insulating film 114.

In addition, it is preferable that the number of defects in the insulating film 114 be small and typically, the spin density corresponding to a signal that appears at g=2.001 due to a dangling bond of silicon be lower than or equal to $3 \times 10^{17}$ spins/cm$^3$ by electron spin resonance (ESR) measurement. This is because if the density of defects in the insulating film 114 is high, oxygen is bonded to the defects and the property of transmitting oxygen of the insulating film 114 is lowered.

Note that all oxygen entering the insulating film 114 from the outside does not move to the outside of the insulating film 114 and some oxygen remains in the insulating film 114. Furthermore, movement of oxygen occurs in the insulating film 114 in some cases in such a manner that oxygen enters the insulating film 114 and oxygen included in the insulating film 114 moves to the outside of the insulating film 114. When an oxide insulating film that can transmit oxygen is formed as the insulating film 114, oxygen released from the insulating film 116 provided over the insulating film 114 can be moved to the oxide semiconductor film 108 through the insulating film 114.

Note that the insulating film 114 can be formed using an oxide insulating film having a low density of states due to nitrogen oxide. Note that the density of states due to nitrogen oxide can be formed between the energy of the valence band maximum ($E_{v\_os}$) and the energy of the conduction band minimum ($E_{c\_os}$) of the oxide semiconductor film. A silicon oxynitride film that releases less nitrogen oxide, an aluminum oxynitride film that releases less nitrogen oxide, and the like can be used as the above oxide insulating film.

Note that a silicon oxynitride film that releases less nitrogen oxide is a film which releases ammonia more than nitrogen oxide in thermal desorption spectroscopy (TDS) analysis; the amount of released ammonia is typically greater than or equal to $1 \times 10^{18}$ cm$^{-3}$ and less than or equal to $5 \times 10^{19}$ cm$^{-3}$. Note that the amount of released ammonia is the amount of ammonia released by heat treatment with which the surface temperature of a film becomes higher than or equal to 50° C. and lower than or equal to 650° C., preferably higher than or equal to 50° C. and lower than or equal to 550° C.

Nitrogen oxide (NO$_x$; x is greater than 0 and less than or equal to 2, preferably greater than or equal to 1 and less than or equal to 2), typically NO$_2$ or NO, forms levels in the insulating film 114, for example. The level is positioned in the energy gap of the oxide semiconductor film 108. Therefore, when nitrogen oxide is diffused into the interface between the insulating film 114 and the oxide semiconductor film 108, an electron is in some cases trapped by the level on the insulating film 114 side. As a result, the trapped electron remains in the vicinity of the interface between the insulating film 114 and the oxide semiconductor film 108; thus, the threshold voltage of the transistor is shifted in the positive direction.

Nitrogen oxide reacts with ammonia and oxygen in heat treatment. Since nitrogen oxide included in the insulating film 114 reacts with ammonia included in the insulating film 116 in heat treatment, nitrogen oxide included in the insulating film 114 is reduced. Therefore, an electron is hardly trapped at the interface between the insulating film 114 and the oxide semiconductor film 108.

By using such an oxide insulating film, the insulating film 114 can reduce the shift in the threshold voltage of the transistor, which leads to a smaller change in the electrical characteristics of the transistor.

Note that in an ESR spectrum at 100 K or lower of the insulating film 114, by heat treatment of a manufacturing process of the transistor, typically heat treatment at a temperature higher than or equal to 300° C. and lower than 350° C., a first signal that appears at a g-factor of greater than or equal to 2.037 and less than or equal to 2.039, a second signal that appears at a g-factor of greater than or equal to 2.001 and less than or equal to 2.003, and a third signal that appears at a g-factor of greater than or equal to 1.964 and less than or equal to 1.966 are observed. The split width of the first and second signals and the split width of the second and third signals that are obtained by ESR measurement using an X-band are each approximately 5 mT. The sum of the spin densities of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 is lower than $1 \times 10^{18}$ spins/cm$^3$, typically higher than or equal to $1 \times 10^{17}$ spins/cm$^3$ and lower than $1 \times 10^{18}$ spins/cm$^3$.

In the ESR spectrum at 100 K or lower, the sum of the spin densities of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 corresponds to the sum of the spin densities of signals attributed to nitrogen oxide ($NO_x$; x is greater than 0 and less than or equal to 2, preferably greater than or equal to 1 and less than or equal to 2). Typical examples of nitrogen oxide include nitrogen monoxide and nitrogen dioxide. In other words, the lower the total spin density of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 is, the lower the content of nitrogen oxide in the oxide insulating film is.

The concentration of nitrogen of the above oxide insulating film measured by SIMS is lower than or equal to $6 \times 10^{20}$ atoms/cm$^3$.

The above oxide insulating film is formed by a PECVD method at a substrate temperature higher than or equal to 220° C. and lower than or equal to 350° C. using silane and dinitrogen monoxide, whereby a dense and hard film can be formed.

The insulating film 116 is an oxide insulating film which contains oxygen at a higher proportion than the stoichiometric composition. Part of oxygen is released from the above oxide insulating film by heating. The amount of oxygen released from the oxide insulating film in TDS is more than or equal to $1.0 \times 10^{19}$ atoms/cm$^3$, preferably more than or equal to $3.0 \times 10^{20}$ atoms/cm$^3$. Note that the amount of released oxygen is the total amount of oxygen released by heat treatment in a temperature range of 50° C. to 650° C. or 50° C. to 550° C. in TDS. In addition, the amount of released oxygen is the total amount of released oxygen converted into oxygen atoms in TDS.

A silicon oxide film, a silicon oxynitride film, or the like with a thickness greater than or equal to 30 nm and less than or equal to 500 nm, preferably greater than or equal to 50 nm and less than or equal to 400 nm can be used as the insulating film 116.

It is preferable that the number of defects in the insulating film 116 be small and typically, the spin density corresponding to a signal that appears at g=2.001 due to a dangling bond of silicon be lower than $1.5 \times 10^{18}$ spins/cm$^3$, preferably lower than or equal to $1 \times 10^{18}$ spins/cm$^3$ by ESR measurement. Note that the insulating film 116 is provided more apart from the oxide semiconductor film 108 than the insulating film 114 is; thus, the insulating film 116 may have higher density of defects than the insulating film 114.

Furthermore, the insulating films 114 and 116 can be formed using insulating films formed of the same kinds of materials; thus, a boundary between the insulating films 114 and 116 cannot be clearly observed in some cases. Thus, in this embodiment, the boundary between the insulating films 114 and 116 is shown by a broken line. Although a two-layer structure of the insulating films 114 and 116 is described in this embodiment, the present invention is not limited to this. For example, a single-layer structure of only the insulating film 114 or a layered structure of three or more layers may be employed.

[Insulating Film 2 Functioning as Protective Insulating Film]

The insulating film 118 functions as a protective insulating film for the transistor 100.

The insulating film 118 includes one or both of hydrogen and nitrogen. Alternatively, the insulating film 118 includes nitrogen and silicon. The insulating film 118 has a function of blocking oxygen, hydrogen, water, alkali metal, alkaline earth metal, or the like. The provision of the insulating film 118 makes it possible to prevent outward diffusion of oxygen from the oxide semiconductor film 108, outward diffusion of oxygen included in the insulating films 114 and 116, and entry of hydrogen, water, or the like into the oxide semiconductor film 108 from the outside.

A nitride insulating film, for example, can be used as the insulating film 118. The nitride insulating film is formed using silicon nitride, silicon nitride oxide, aluminum nitride, aluminum nitride oxide, or the like.

Although the variety of films such as the conductive films, the insulating films, and the oxide semiconductor films described above can be formed by a sputtering method or a PECVD method, such films may be formed by another method, e.g., a thermal chemical vapor deposition (CVD) method. A metal organic chemical vapor deposition (MOCVD) method and an atomic layer deposition (ALD) method can be given as examples of a thermal CVD method.

A thermal CVD method has an advantage that no defect due to plasma damage is generated since it does not utilize plasma for forming a film. In a thermal CVD method, a source gas is introduced into a chamber, the chamber is set at an atmospheric pressure or a reduced pressure, and a film is deposited on a substrate.

Furthermore, in an ALD method, a source gas is introduced into a chamber, the chamber is set at an atmospheric pressure or a reduced pressure, and a film is deposited on a substrate.

<1-3. Structure Example 2 of Semiconductor Device>

Next, variations of the transistor 100 illustrated in FIGS. 1A to 1C will be described with reference to FIGS. 2A to 2C, FIGS. 3A to 3C, FIGS. 4A to 4C, FIGS. 5A to 5C, and FIGS. 6A to 6C.

Figure 2A:
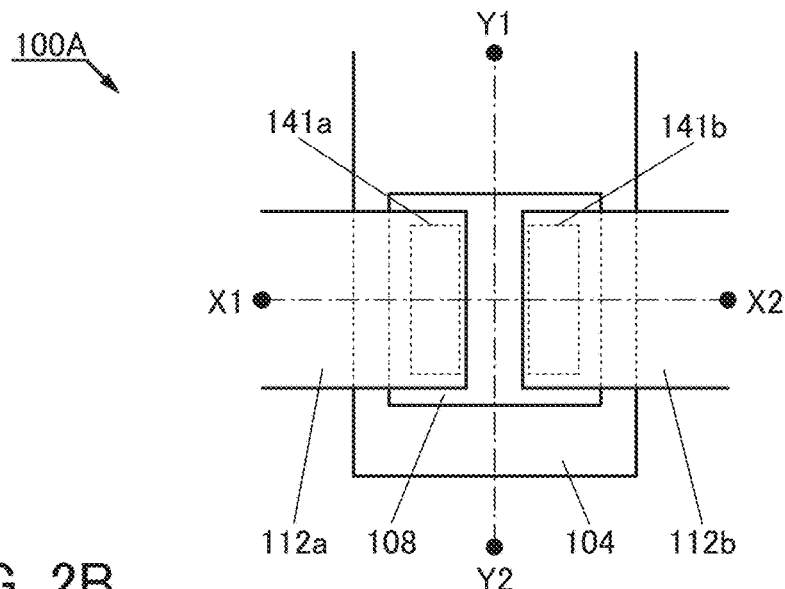
FIGS. 2A to 2C are a top view and cross-sectional views illustrating a semiconductor device.
Figure 2B:
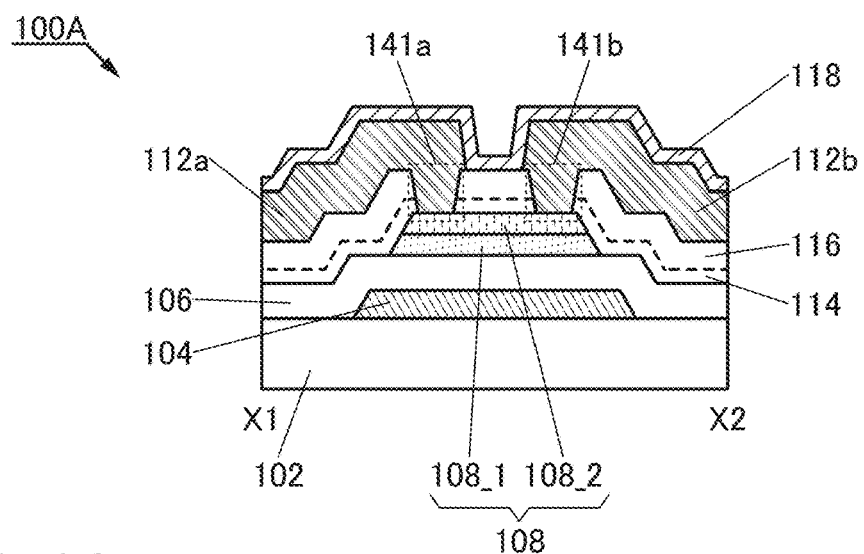

FIG. 2A is a top view of a transistor 100A that is a semiconductor device of one embodiment of the present invention. FIG. 2B is a cross-sectional view taken along a dashed dotted line X1-X2 in FIG. 2A, and FIG. 2C is a cross-sectional view taken along a dashed dotted line Y1-Y2 in FIG. 2A.

Figure 2C:
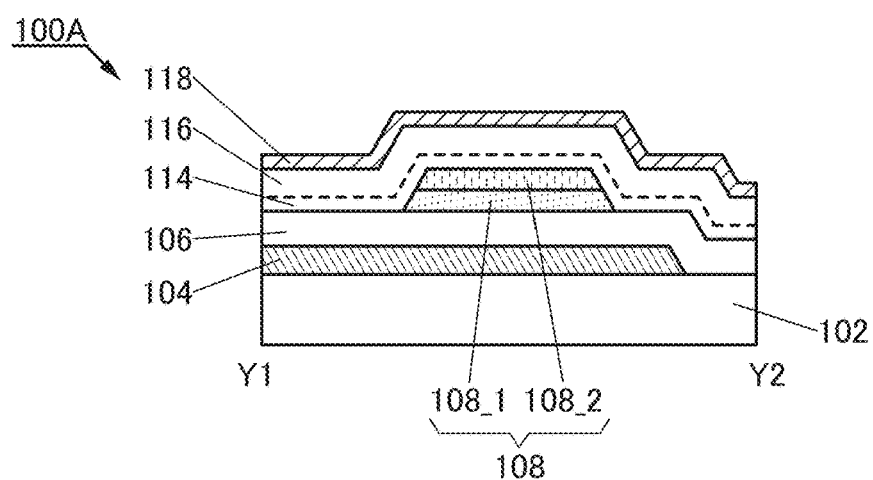

Note that the transistor 100A illustrated in FIGS. 2A to 2C is what is called a channel-protective transistor. Thus, the semiconductor device of one embodiment of the present invention can have either the channel-etched structure or the channel-protective structure.

In the transistor 100A, the insulating films 114 and 116 have an opening 141a and an opening 141b. The oxide semiconductor film 108 is connected to the conductive films 112a and 112b through the openings 141a and 141b. Furthermore, the insulating film 118 is formed over the conductive films 112a and 112b. The insulating films 114 and 116 function as so-called channel protective films. Note that the other components of the transistor 100A are similar to those of the transistor 100 described above, and an effect similar to that of the transistor 100 can be obtained.

Figure 3A:
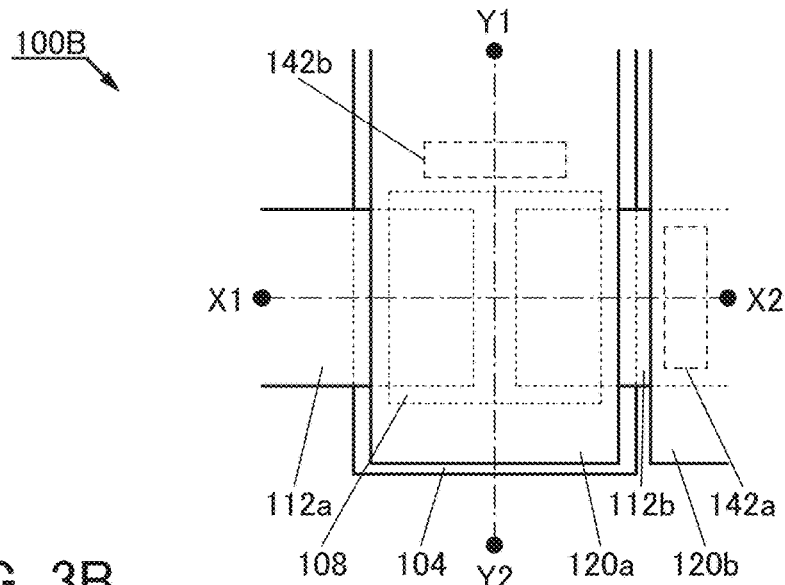
FIGS. 3A to 3C are a top view and cross-sectional views illustrating a semiconductor device.
Figure 3B:
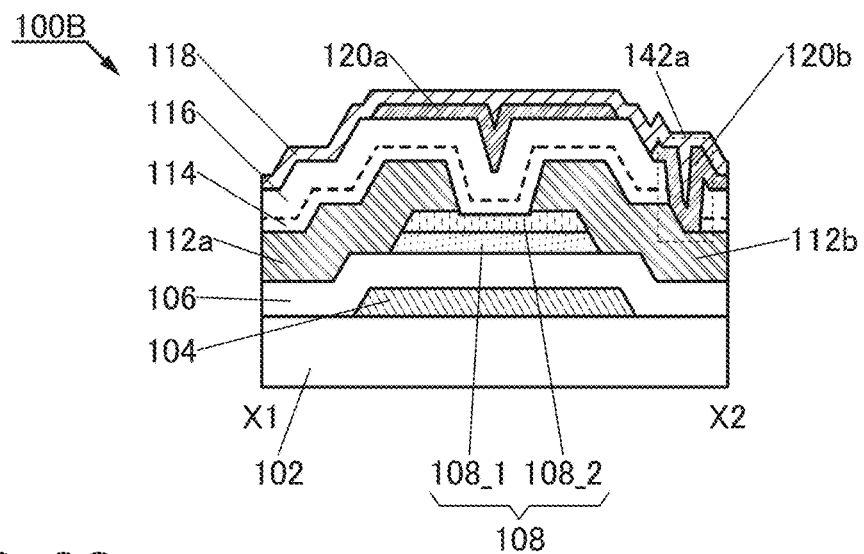
Figure 3C:
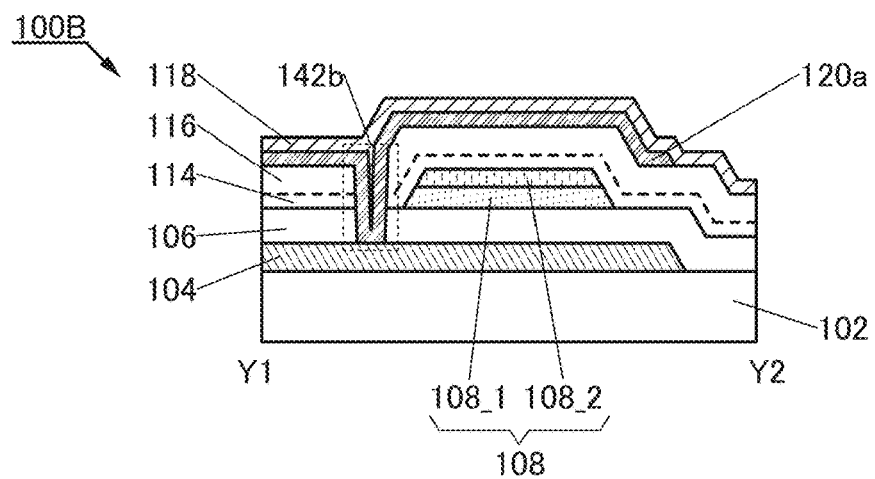

FIG. 3A is a top view of a transistor 100B that is a semiconductor device of one embodiment of the present invention. FIG. 3B is a cross-sectional view taken along a dashed dotted line X1-X2 in FIG. 3A, and FIG. 3C is a cross-sectional view taken along a dashed dotted line Y1-Y2 in FIG. 3A.

The transistor 100B includes the conductive film 104 over the substrate 102, the insulating film 106 over the substrate 102 and the conductive film 104, the oxide semiconductor film 108 over the insulating film 106, the conductive film 112a over the oxide semiconductor film 108, the conductive film 112b over the oxide semiconductor film 108, the insulating film 114 over the oxide semiconductor film 108, the conductive film 112a, and the conductive film 112b, the insulating film 116 over the insulating film 114, a conductive film 120a over the insulating film 116, a conductive film 120b over the insulating film 116, and the insulating film 118 over the insulating film 116, the conductive film 120a, and the conductive film 120b.

The insulating films 114 and 116 have an opening 142a. The insulating films 106, 114, and 116 have an opening 142b. The conductive film 120a is electrically connected to the conductive film 104 through the opening 142b. Furthermore, the conductive film 120b is electrically connected to the conductive film 112b through the opening 142a.

Note that in the transistor 100B, the insulating film 106 functions as a first gate insulating film of the transistor 100B, the insulating films 114 and 116 function as a second gate insulating film of the transistor 100B, and the insulating film 118 functions as a protective insulating film of the transistor 100B. In the transistor 100B, the conductive film 104 functions as a first gate electrode, the conductive film 112a functions as a source electrode, and the conductive film 112b functions as a drain electrode. In the transistor 100B, the conductive film 120a functions as a second gate electrode, and the conductive film 120b functions as a pixel electrode of a display device.

As illustrated in FIG. 3C, the conductive film 120a is electrically connected to the conductive film 104 through the opening 142b. Accordingly, the conductive film 104 and the conductive film 120a are supplied with the same potential.

As illustrated in FIG. 3C, the oxide semiconductor film 108 is positioned so as to face the conductive film 104 and the conductive film 120a, and is sandwiched between the two conductive films functioning as the gate electrodes. The length in the channel length direction and the length in the channel width direction of the conductive film 120a are longer than the length in the channel length direction and the length in the channel width direction of the oxide semiconductor film 108, respectively. The whole oxide semiconductor film 108 is covered with the conductive film 120a with the insulating films 114 and 116 positioned therebetween.

In other words, the conductive film 104 and the conductive film 120a are connected to each other in the opening provided in the insulating films 106, 114, and 116, and each include a region positioned outside an edge portion of the oxide semiconductor film 108.

With this structure, the oxide semiconductor film 108 included in the transistor 100B can be electrically surrounded by electric fields of the conductive films 104 and 120a. A device structure of a transistor, like that of the transistor 100B, in which electric fields of a first gate electrode and a second gate electrode electrically surround an oxide semiconductor film where a channel region is formed can be referred to as a surrounded channel (s-channel) structure.

Since the transistor 100B has the s-channel structure, an electric field for inducing a channel can be effectively applied to the oxide semiconductor film 108 by the conductive film 104 functioning as a first gate electrode; therefore, the current drive capability of the transistor 100B can be improved and high on-state current characteristics can be obtained. Since the on-state current can be increased, the size of the transistor 100B can be reduced. In addition, since the oxide semiconductor film 108 is surrounded by the conductive film 104 functioning as the first gate electrode and the conductive film 120a functioning as the second gate electrode, the mechanical strength of the oxide semiconductor film 108 can be increased.

Note that for the conductive films 120a and 120b, materials similar to those described as the materials of the above-described conductive films 104, 112a, and 112b can be used. In particular, oxide conductive films (OC) are preferable as the conductive films 120a and 120b. When the conductive films 120a and 120b are formed using an oxide conductive film, oxygen can be added to the insulating films 114 and 116.

The other components of the transistor 100B are similar to those of the transistor 100 described above and have similar effects.

Figure 4A:
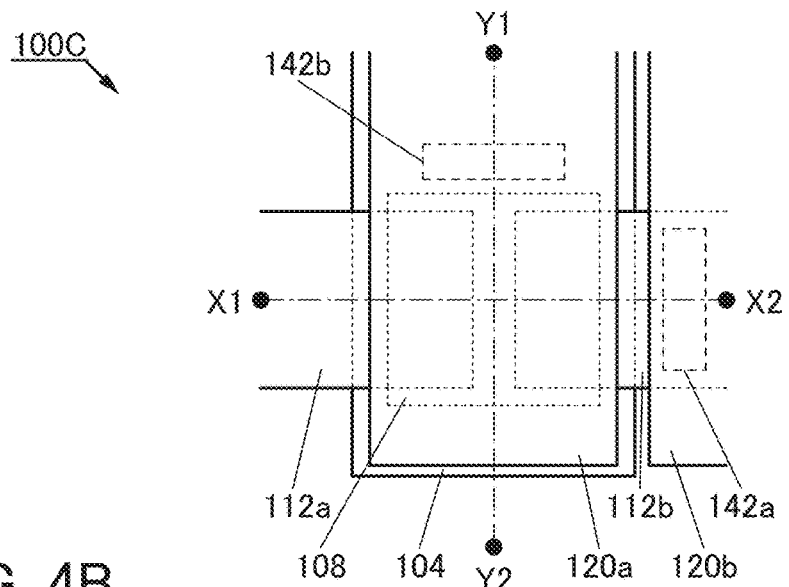
FIGS. 4A to 4C are a top view and cross-sectional views illustrating a semiconductor device.
Figure 4B:
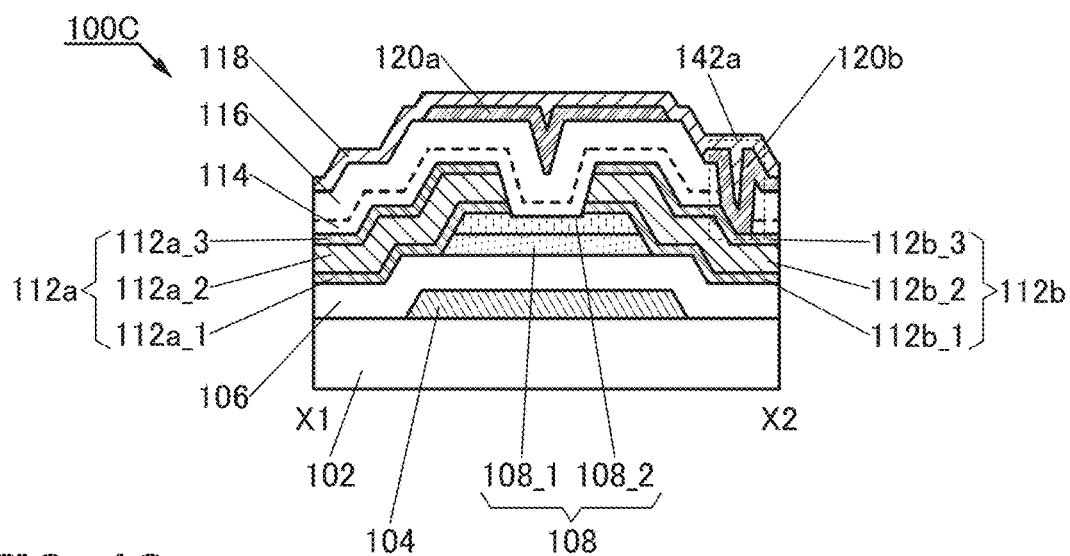
Figure 4C:
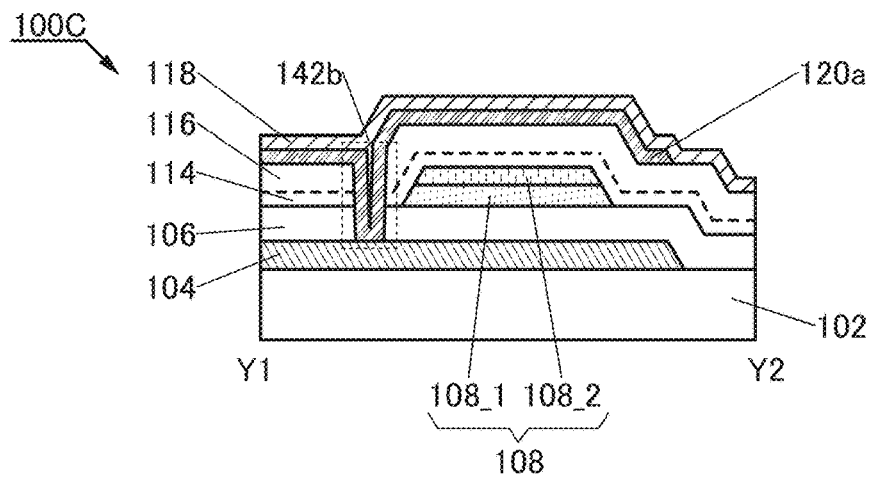

FIG. 4A is a top view of a transistor 100C that is a semiconductor device of one embodiment of the present invention. FIG. 4B is a cross-sectional view taken along a dashed dotted line X1-X2 in FIG. 4A, and FIG. 4C is a cross-sectional view taken along a dashed dotted line Y1-Y2 in FIG. 4A.

The transistor 100C is different from the above-described transistor 100B in that the conductive films 112a and 112b each have a three-layer structure.

The conductive film 112a of the transistor 100C includes a conductive film 112a_1, a conductive film 112a_2 over the conductive film 112a_1, and a conductive film 112a_3 over the conductive film 112a_2. The conductive film 112b of the transistor 100C includes a conductive film 112b_1, a conductive film 112b_2 over the conductive film 112b_1, and a conductive film 112b_3 over the conductive film 112b_2.

For example, it is favorable that the conductive film 112a_1, the conductive film 112b_1, the conductive film 112a_3, and the conductive film 112b_3 contain one or more elements selected from titanium, tungsten, tantalum, molybdenum, indium, gallium, tin, and zinc. Furthermore, it is favorable that the conductive film 112a_2 and the conductive film 112b_2 contain one or more elements selected from copper, aluminum, and silver.

Specifically, the conductive film 112a_1, the conductive film 112b_1, the conductive film 112a_3, and the conductive film 112b_3 can be formed using In—Sn oxide or In—Zn oxide and the conductive film 112a_2 and the conductive film 112b_2 can be formed using copper.

The above structure is favorable because the wiring resistance of the conductive films 112a and 112b can be reduced and diffusion of copper into the oxide semiconductor film 108 can be inhibited. The above structure is favorable also because the contact resistance between the conductive film 112b and the conductive film 120b can be reduced. The other components of the transistor 100C are similar to those of the transistor 100 described above and have similar effects.

Figure 5A:
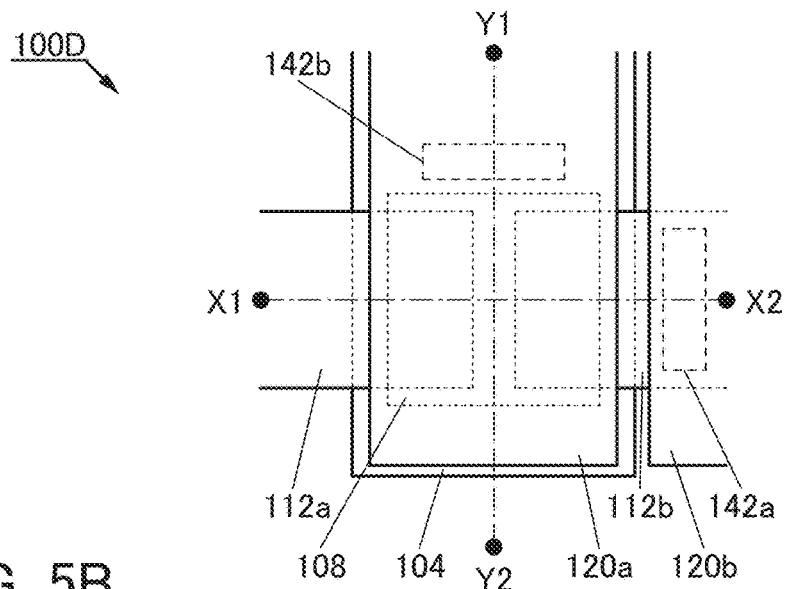
FIGS. 5A to 5C are a top view and cross-sectional views illustrating a semiconductor device.
Figure 5B:
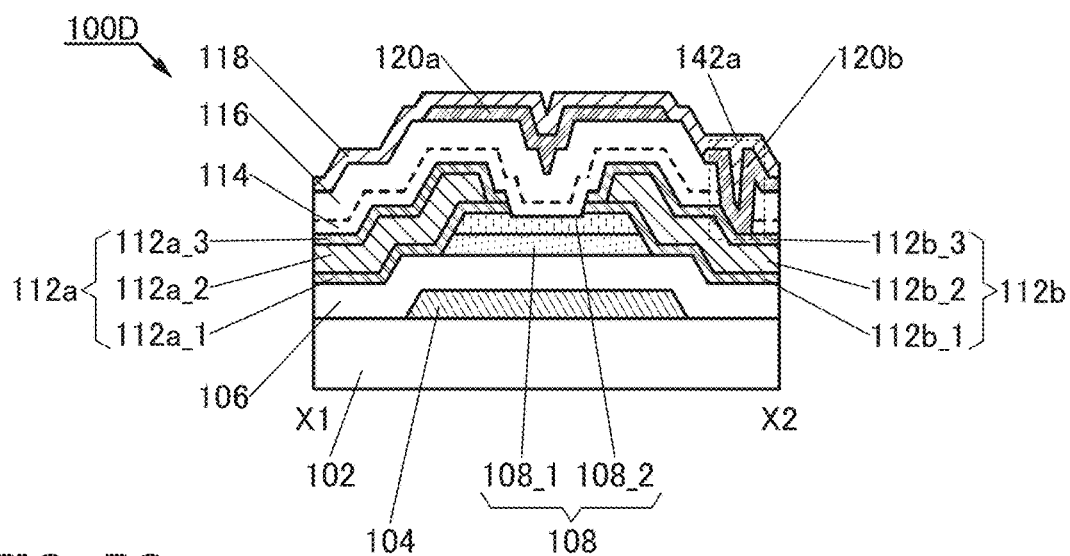
Figure 5C:
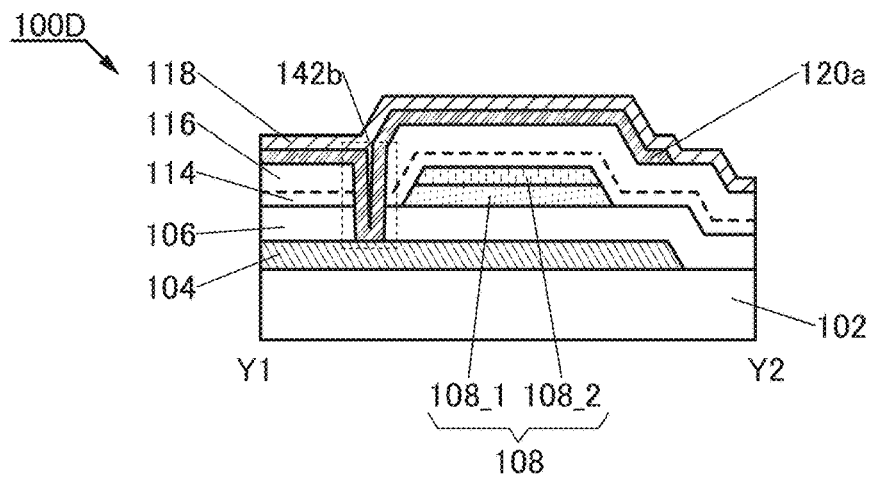

FIG. 5A is a top view of a transistor 100D that is a semiconductor device of one embodiment of the present invention. FIG. 5B is a cross-sectional view taken along a dashed dotted line X1-X2 in FIG. 5A, and FIG. 5C is a cross-sectional view taken along a dashed dotted line Y1-Y2 in FIG. 5A.

The transistor 100D is different from the above-described transistor 100B in that the conductive films 112a and 112b each have a three-layer structure. In addition, the transistor 100D is different from the above-described transistor 100C in the shapes of the conductive films 112a and 112b.

The conductive film 112a of the transistor 100D includes the conductive film 112a_1, the conductive film 112a_2 over the conductive film 112a_1, and the conductive film 112a_3 over the conductive film 112a_2. The conductive film 112b of the transistor 100D includes the conductive film 112b_1, the conductive film 112b_2 over the conductive film 112b_1, and the conductive film 112b_3 over the conductive film 112b_2. Note that the conductive film 112a_1, the conductive film 112a_2, the conductive film 112a_3, the conductive film 112b_1, the conductive film 112b_2, and the conductive film 112b_3 can be formed using any of the above-described materials.

An end portion of the conductive film 112a_1 has a region located outward from an end portion of the conductive film 112a_2. The conductive film 112a_3 covers a top surface and a side surface of the conductive film 112a_2 and has a region that is in contact with the conductive film 112a_1. An end portion of the conductive film 112b_1 has a region located outward from an end portion of the conductive film 112b_2. The conductive film 112b_3 covers a top surface and a side surface of the conductive film 112b_2 and has a region that is in contact with the conductive film 112b_1.

The above structure is favorable because the wiring resistance of the conductive films 112a and 112b can be reduced and diffusion of copper into the oxide semiconductor film 108 can be inhibited. Note that diffusion of copper can be more favorably inhibited in the transistor 100D than in the above-described transistor 100C. The above structure is favorable also because the contact resistance between the conductive film 112b and the conductive film 120b can be reduced. The other components of the transistor 100D are similar to those of the transistor 100 described above and have similar effects.

Figure 6A:
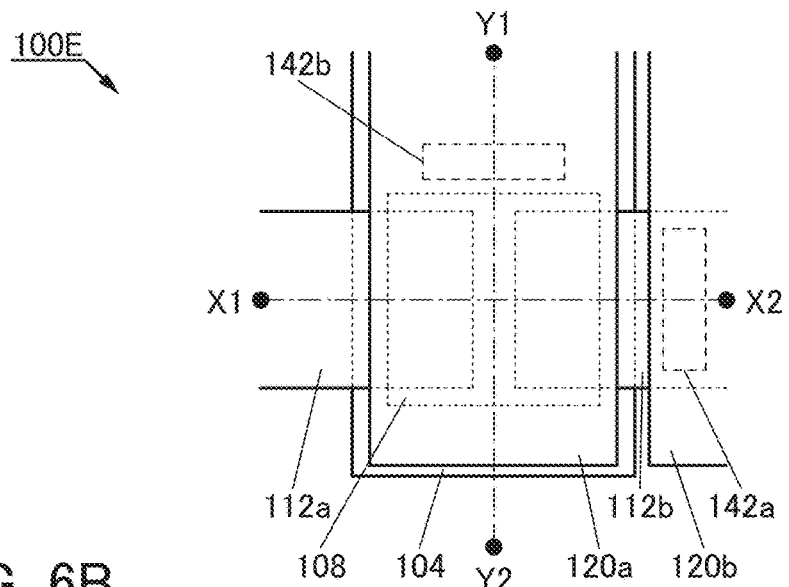
FIGS. 6A to 6C are a top view and cross-sectional views illustrating a semiconductor device.
Figure 6B:
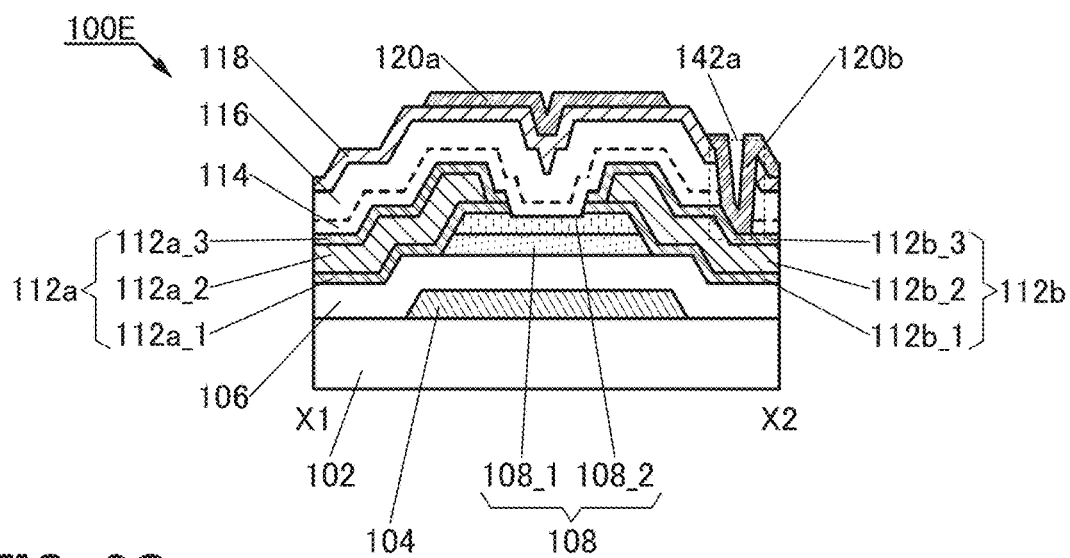
Figure 6C:
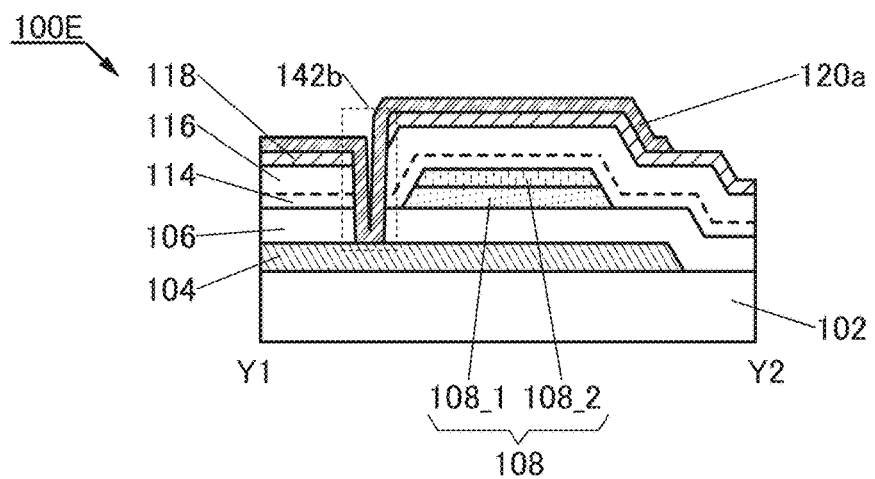

FIG. 6A is a top view of a transistor 100E that is a semiconductor device of one embodiment of the present invention. FIG. 6B is a cross-sectional view taken along a dashed dotted line X1-X2 in FIG. 6A, and FIG. 6C is a cross-sectional view taken along a dashed dotted line Y1-Y2 in FIG. 6A.

The transistor 100E is different from the transistor 100D described above in the position of the conductive films 120a and 120b. Specifically, the conductive films 120a and 120b of the transistor 100E are positioned over the insulating film 118. The other components of the transistor 100E are similar to those of the transistor 100D described above and have similar effects.

The structures of the transistors in this embodiment can be freely combined with each other.

<1-4. Manufacturing Method of Semiconductor Device>

Next, a manufacturing method of the transistor 100B that is a semiconductor device of one embodiment of the present invention will be described with reference to FIGS. 7A to 7C, FIGS. 8A to 8C, FIGS. 9A to 9C, and FIGS. 10A and 10B.

FIGS. 7A to 7C, FIGS. 8A to 8C, FIGS. 9A to 9C, and FIGS. 10A and 10B are cross-sectional views illustrating a manufacturing method of the semiconductor device. In each of FIGS. 7A to 7C, FIGS. 8A to 8C, FIGS. 9A to 9C, and FIGS. 10A and 10B, the left part is a cross-sectional view in the channel length direction, and the right part is a cross-sectional view in the channel width direction.

First, a conductive film is formed over the substrate 102 and processed through a lithography process and an etching process, whereby the conductive film 104 functioning as the first gate electrode is formed. Then, the insulating film 106 functioning as the first gate insulating film is formed over the conductive film 104 (see FIG. 7A).

In this embodiment, a glass substrate is used as the substrate 102, and as the conductive film 104 functioning as the first gate electrode, a 50-nm-thick titanium film and a 200-nm-thick copper film are each formed by a sputtering method. A 400-nm-thick silicon nitride film and a 50-nm-thick silicon oxynitride film as the insulating film 106 are formed by a PECVD method.

Note that the above-described silicon nitride film has a three-layer structure of a first silicon nitride film, a second silicon nitride film, and a third silicon nitride film. An example of the three-layer structure is as follows.

For example, the first silicon nitride film can be formed to have a thickness of 50 nm under the conditions where silane at a flow rate of 200 sccm, nitrogen at a flow rate of 2000 sccm, and an ammonia gas at a flow rate of 100 sccm are supplied as a source gas to a reaction chamber of a PECVD apparatus, the pressure in the reaction chamber is controlled to 100 Pa, and a power of 2000 W is supplied using a 27.12 MHz high-frequency power source.

The second silicon nitride film can be formed to have a thickness of 300 nm under the conditions where silane at a flow rate of 200 sccm, nitrogen at a flow rate of 2000 sccm, and an ammonia gas at a flow rate of 2000 sccm are supplied as a source gas to the reaction chamber of the PECVD apparatus, the pressure in the reaction chamber is controlled to 100 Pa, and a power of 2000 W is supplied using a 27.12 MHz high-frequency power source.

The third silicon nitride film can be formed to have a thickness of 50 nm under the conditions where silane at a flow rate of 200 sccm and nitrogen at a flow rate of 5000 sccm are supplied as a source gas to the reaction chamber of the PECVD apparatus, the pressure in the reaction chamber is controlled to 100 Pa, and a power of 2000 W is supplied using a 27.12 MHz high-frequency power source.

Note that the first silicon nitride film, the second silicon nitride film, and the third silicon nitride film can each be formed at a substrate temperature of lower than or equal to 350° C.

When the silicon nitride film has the above-described three-layer structure, for example, in the case where a conductive film including copper is used as the conductive film 104, the following effect can be obtained.

The first silicon nitride film can inhibit diffusion of copper from the conductive film 104. The second silicon nitride film has a function of releasing hydrogen and can improve withstand voltage of the insulating film functioning as a gate insulating film. The third silicon nitride film releases a small amount of hydrogen and can inhibit diffusion of hydrogen released from the second silicon nitride film.

Figure 7A:
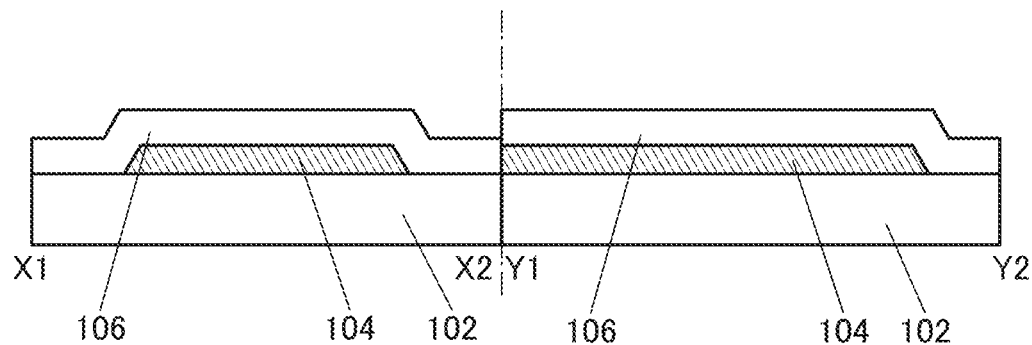
FIGS. 7A to 7C are cross-sectional views illustrating a manufacturing method of a semiconductor device.
Figure 7B:
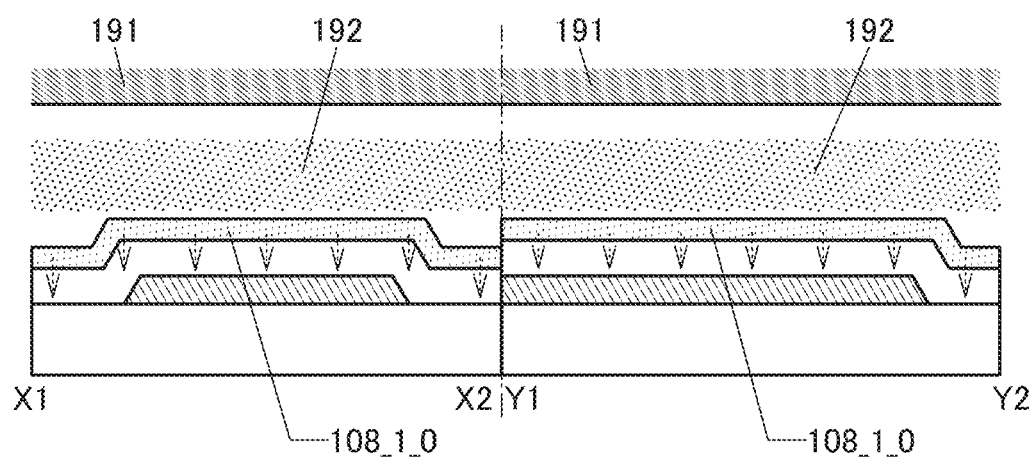

Next, an oxide semiconductor film 108_1_0 is formed over the insulating film 106 (see FIG. 7B).

FIG. 7B is a schematic cross-sectional view illustrating the inside of a deposition apparatus when the oxide semiconductor film 108_1_0 is formed over the insulating film 106. In FIG. 7B, a sputtering apparatus is used as the deposition apparatus, and a target 191 placed inside the sputtering apparatus and plasma 192 formed under the target 191 are schematically illustrated.

Note that in FIG. 7B, oxygen or excess oxygen added to the insulating film 106 is schematically shown by arrows of broken lines. When an oxygen gas is used in forming the oxide semiconductor film 108_1_0, oxygen can be favorably added to the insulating film 106.

The thickness of the oxide semiconductor film 108_1_0 is greater than or equal to 1 nm and less than or equal to 25 nm, preferably greater than or equal to 5 nm and less than or equal to 20 nm. The oxide semiconductor film 108_1_0 is formed using one or both of an inert gas (typically, an argon gas) and an oxygen gas. The percentage of oxygen flow rate in forming the oxide semiconductor film 108_1_0 is higher than or equal to 0% and lower than 30%, preferably higher than or equal to 5% and lower than or equal to 15%.

When the percentage of oxygen flow rate for forming the oxide semiconductor film 108_1_0 is in the above range, the oxide semiconductor film 108_1_0 can have lower crystallinity.

In this embodiment, the oxide semiconductor film 108_1_0 is formed by a sputtering method using an In—Zn metal oxide target (In:Zn=2:3 in an atomic ratio). The substrate temperature during the formation of the oxide semiconductor film 108_1_0 is room temperature, and an argon gas at a flow rate of 180 sccm and an oxygen gas at a flow rate of 20 sccm are used as a deposition gas (percentage of oxygen flow rate: 10%).

Figure 7C:
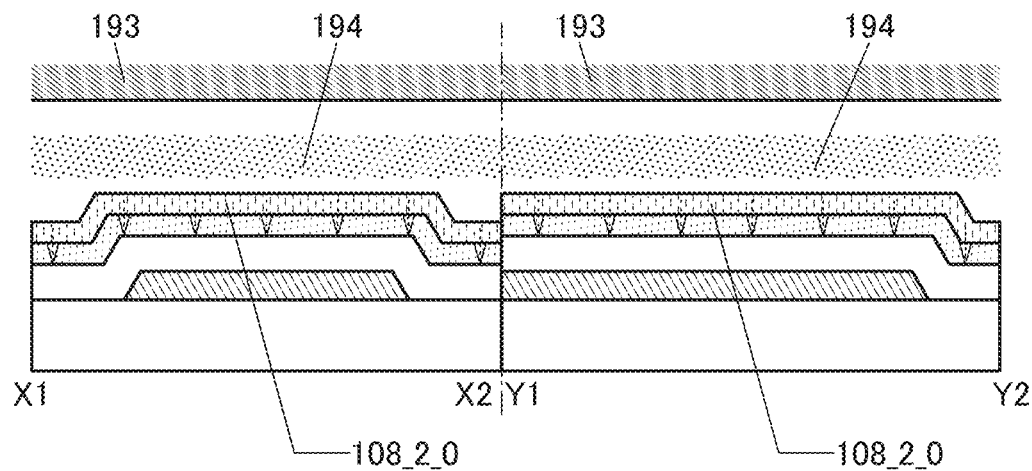

Next, an oxide semiconductor film 108_2_0 is formed over the oxide semiconductor film 108_1_0 (see FIG. 7C).

FIG. 7C is a schematic cross-sectional view illustrating the inside of a deposition apparatus when the oxide semiconductor film 108_2_0 is formed over the oxide semiconductor film 108_1_0. In FIG. 7C, a sputtering apparatus is used as the deposition apparatus, and a target 193 placed inside the sputtering apparatus and plasma 194 formed under the target 193 are schematically illustrated.

Note that in FIG. 7C, oxygen or excess oxygen added to the oxide semiconductor film 108_1_0 is schematically shown by arrows of broken lines. When an oxygen gas is used in forming the oxide semiconductor film 108_2_0, oxygen can be favorably added to the oxide semiconductor film 108_1_0.

The thickness of the oxide semiconductor film 108_2_0 is greater than or equal to 20 nm and less than or equal to 100 nm, preferably greater than or equal to 20 nm and less than or equal to 50 nm. Note that when the oxide semiconductor film 108_2_0 is formed, plasma discharge is favorably performed in an atmosphere containing an oxygen gas. Note that when plasma discharge is performed in an atmosphere containing an oxygen gas, oxygen is added into the oxide semiconductor film 108_1_0 over which the oxide semiconductor film 108_2_0 is to be formed. The percentage of oxygen flow rate in forming the oxide semiconductor film 108_2_0 is higher than or equal to 30% and lower than or equal to 100%, preferably higher than or equal to 50% and lower than or equal to 100%, further preferably higher than or equal to 70% and lower than or equal to 100%.

When the percentage of oxygen flow rate for forming the oxide semiconductor film 108_2_0 is in the above range, the oxide semiconductor film 108_2_0 can have higher crystallinity.

In this embodiment, the oxide semiconductor film 108_2_0 is formed by a sputtering method using an In—Ga—Zn metal oxide target (In:Ga:Zn=4:2:4.1 in an atomic ratio). The substrate temperature during the formation of the oxide semiconductor film 108_2_0 is room temperature, and an oxygen gas at a flow rate of 200 sccm is used as a deposition gas (percentage of oxygen flow rate: 100%).

As described above, the percentage of oxygen flow rate for forming the oxide semiconductor film 108_2_0 is preferably higher than the percentage of oxygen flow rate for forming the oxide semiconductor film 108_1_0. In other words, the oxide semiconductor film 108_1_0 is preferably formed under a lower oxygen partial pressure than the oxide semiconductor film 108_2_0.

When the percentage of oxygen flow rate in forming the oxide semiconductor film 108_1_0 is different from that in forming the oxide semiconductor film 108_2_0, a layered film having a plurality of kinds of crystallinity can be formed.

The substrate temperature at the time of formation of the oxide semiconductor film 108_1_0 and the oxide semiconductor film 108_2_0 is set at higher than or equal to room temperature (25° C.) and lower than or equal to 200° C., preferably higher than or equal to room temperature and lower than or equal to 130° C. Setting the substrate temperature in the above range is favorable for large glass substrates (e.g., the above-described 8th- to 10th-generation glass substrates). Specifically, when the substrate temperature for forming the oxide semiconductor film 108_1_0 and the oxide semiconductor film 108_2_0 is set at room temperature, bending or distortion of the substrate can be inhibited.

To further increase the crystallinity of the oxide semiconductor film 108_2_0, the substrate temperature in forming the oxide semiconductor film 108_2_0 is preferably increased (for example, higher than or equal to 100° C. and lower than or equal to 200° C., preferably 130° C.).

In addition, it is more favorable to successively form the oxide semiconductor film 108_1_0 and the oxide semiconductor film 108_2_0 in a vacuum because impurities can be prevented from being caught at the interfaces.

In addition, increasing the purity of a sputtering gas is necessary. For example, as an oxygen gas or an argon gas used as a sputtering gas, a gas which is highly purified to have a dew point of −40° C. or lower, preferably −80° C. or lower, further preferably −100° C. or lower, still further preferably −120° C. or lower is used, whereby entry of moisture or the like into the oxide semiconductor film can be minimized as much as possible.

In the case where the oxide semiconductor film is deposited by a sputtering method, a chamber in a sputtering apparatus is preferably evacuated to be a high vacuum state (to the degree of about $5 \times 10^{-7}$ Pa to $1 \times 10^{-4}$ Pa) with an adsorption vacuum evacuation pump such as a cryopump in order to remove water or the like, which serves as an impurity for the oxide semiconductor film, as much as possible. In particular, the partial pressure of gas molecules corresponding to $H_2O$ (gas molecules corresponding to m/z=18) in the chamber in the standby mode of the sputtering apparatus is lower than or equal to $1\times10^{-4}$ Pa, preferably $5\times10^{-5}$ Pa.

Next, the oxide semiconductor film 108_1_0 and the oxide semiconductor film 108_2_0 are processed into desired shapes, so that the island-shaped oxide semiconductor film 108_1 and the island-shaped oxide semiconductor film 108_2 are formed. In this embodiment, the oxide semiconductor film 108_1 and the oxide semiconductor film 108_2 constitute the island-shaped oxide semiconductor film 108 (see FIG. 8A).

Heat treatment (hereinafter referred to as first heat treatment) is favorably performed after the oxide semiconductor film 108 is formed. By the first heat treatment, water, hydrogen, or the like contained in the oxide semiconductor film 108 can be reduced. The heat treatment for the purpose of reducing hydrogen, water, and the like may be performed before the oxide semiconductor film 108 is processed into an island shape. Note that the first heat treatment is one kind of treatment for increasing the purity of the oxide semiconductor film.

The first heat treatment is performed at a temperature of, for example, higher than or equal to 150° C. and lower than the strain point of the substrate, preferably higher than or equal to 200° C. and lower than or equal to 450° C., further preferably higher than or equal to 250° C. and lower than or equal to 350° C.

Moreover, an electric furnace, an RTA apparatus, or the like can be used for the first heat treatment. With the use of an RTA apparatus, the heat treatment can be performed at a temperature higher than or equal to the strain point of the substrate if the heating time is short. Therefore, the heat treatment time can be shortened. The first heat treatment may be performed in an atmosphere of nitrogen, oxygen, ultra-dry air (air with a water content of 20 ppm or less, preferably 1 ppm or less, further preferably 10 ppb or less), or a rare gas (e.g., argon, helium). It is preferable that hydrogen, water, and the like not be contained in the nitrogen, oxygen, ultra-dry air, or rare gas. Furthermore, after heat treatment is performed under a nitrogen atmosphere or a rare gas atmosphere, heat treatment may be additionally performed in an oxygen atmosphere or an ultra-dry air atmosphere. As a result, hydrogen, water, and the like can be released from the oxide semiconductor film and oxygen can be supplied to the oxide semiconductor film at the same time. Consequently, the number of oxygen vacancies in the oxide semiconductor film can be reduced.

Figure 8A:
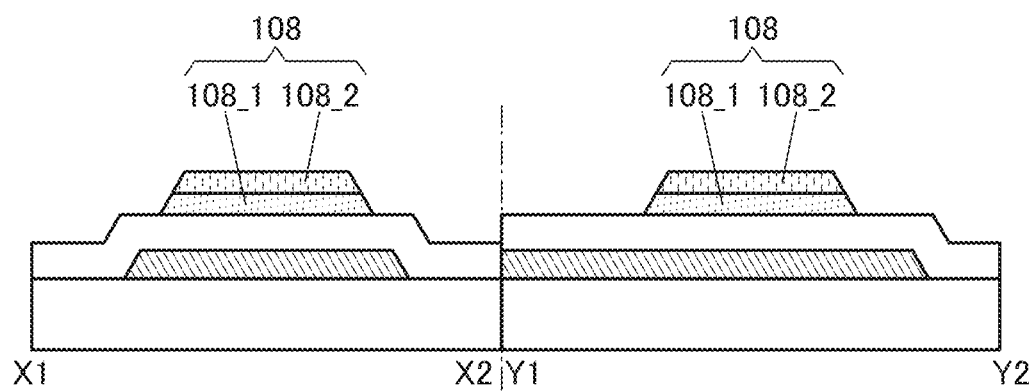
FIGS. 8A to 8C are cross-sectional views illustrating a manufacturing method of a semiconductor device.
Figure 8B:
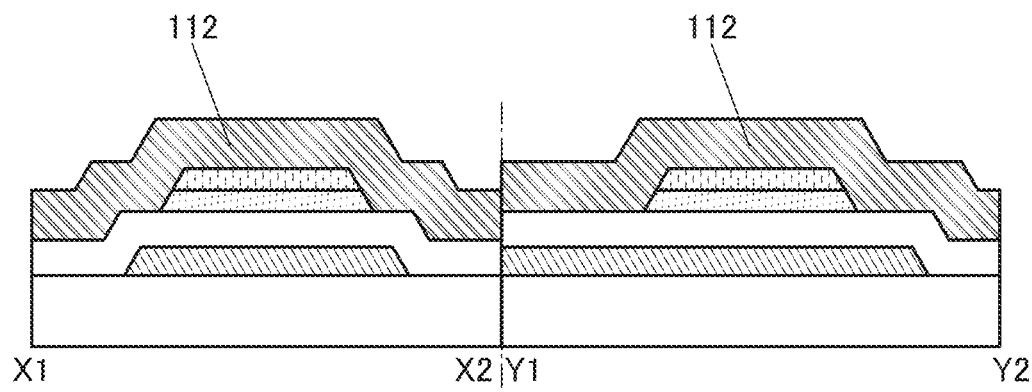

Next, a conductive film 112 is formed over the insulating film 106 and the oxide semiconductor film 108 (see FIG. 8B).

In this embodiment, as the conductive film 112, a 30-nm-thick titanium film, a 200-nm-thick copper film, and a 10-nm-thick titanium film are formed in this order by a sputtering method.

Figure 8C:
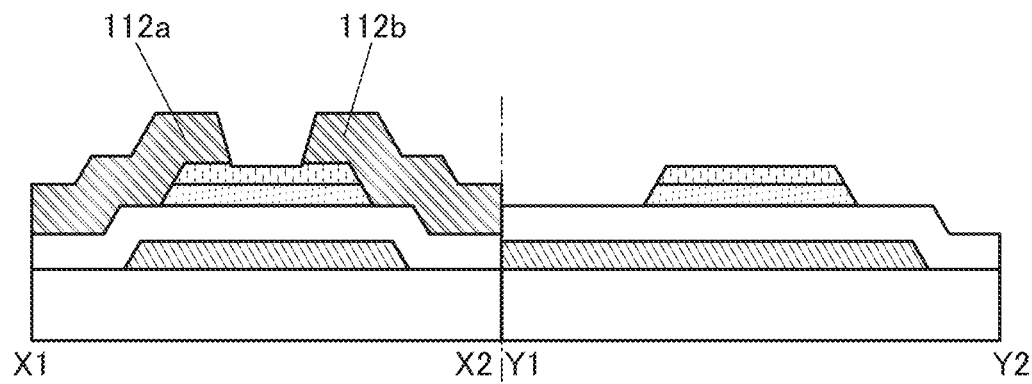

Next, the conductive film 112 is processed into a desired shape, so that the island-shaped conductive film 112a and the island-shaped conductive film 112b are formed (see FIG. 8C).

In this embodiment, the conductive film 112 is processed with a wet etching apparatus. Note that the method for processing the conductive film 112 is not limited to the above-described method, and a dry etching apparatus may be used, for example.

After the conductive films 112a and 112b are formed, a surface (on the back channel side) of the oxide semiconductor film 108 (specifically, the oxide semiconductor film 108_2) may be cleaned. The cleaning may be performed, for example, using a chemical solution such as a phosphoric acid. The cleaning using a chemical solution such as a phosphoric acid can remove impurities (e.g., an element included in the conductive films 112a and 112b) attached to the surface of the oxide semiconductor film 108_2. Note that the cleaning is not necessarily performed; in some cases, the cleaning is not performed.

In the step of forming the conductive films 112a and 112b and/or the cleaning step, the thickness of a region of the oxide semiconductor film 108 which is not covered with the conductive films 112a and 112b might be reduced.

Note that in the semiconductor device of one embodiment of the present invention, the region not covered with the conductive films 112a and 112b, i.e., the oxide semiconductor film 108_2 is an oxide semiconductor film with improved crystallinity. Impurities (in particular, constituent elements used in the conductive films 112a and 112b) are not easily diffused into an oxide semiconductor film having high crystallinity. Accordingly, a highly reliable semiconductor device can be provided.

Although FIG. 8C illustrates an example in which the surface of the oxide semiconductor film 108 not covered with the conductive films 112a and 112b, i.e., the surface of the oxide semiconductor film 108_2 has a depression, one embodiment of the present invention is not limited to this example and the surface of the oxide semiconductor film 108 not covered with the conductive films 112a and 112b does not necessarily have a depression.

Figure 9A:
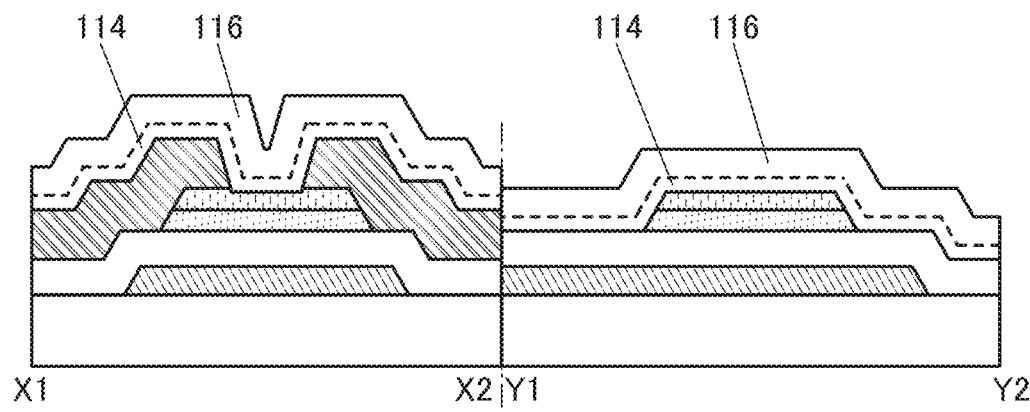
FIGS. 9A to 9C are cross-sectional views illustrating a manufacturing method of a semiconductor device.

Next, the insulating film 114 and the insulating film 116 are formed over the oxide semiconductor film 108 and the conductive films 112a and 112b (see FIG. 9A).

Note that after the insulating film 114 is formed, the insulating film 116 is preferably formed successively without exposure to the air. When the insulating film 116 is formed successively after the formation of the insulating film 114 without exposure to the air while at least one of the flow rate of a source gas, the pressure, high-frequency power, and the substrate temperature is adjusted, the concentration of impurities attributed to the atmospheric component at the interface between the insulating films 114 and 116 can be reduced.

For example, as the insulating film 114, a silicon oxynitride film can be formed by a PECVD method. In that case, a deposition gas containing silicon and an oxidizing gas are preferably used as a source gas. Typical examples of the deposition gas containing silicon include silane, disilane, trisilane, and silane fluoride. Examples of the oxidizing gas include dinitrogen monoxide and nitrogen dioxide. The flow rate of the oxidizing gas is more than or equal to 20 times and less than or equal to 500 times, preferably more than or equal to 40 times and less than or equal to 100 times, that of the deposition gas.

In this embodiment, a silicon oxynitride film is formed as the insulating film 114 by a PECVD method under the following conditions: the substrate 102 is held at a temperature of 220° C., silane at a flow rate of 50 sccm and dinitrogen monoxide at a flow rate of 2000 sccm are used as a source gas, the pressure in the treatment chamber is 20 Pa, and a high-frequency power of 100 W at 13.56 MHz ($1.6\times10^{-2}$ W/cm$^2$ as the power density) is supplied to a parallel-plate electrode.

As the insulating film 116, a silicon oxide film or a silicon oxynitride film is formed under the following conditions: the substrate placed in the treatment chamber of the PECVD apparatus that is vacuum-evacuated is held at a temperature of higher than or equal to 180° C. and lower than or equal to 350° C., the pressure in the treatment chamber is higher than or equal to 100 Pa and lower than or equal to 250 Pa, preferably higher than or equal to 100 Pa and lower than or equal to 200 Pa, with introduction of a source gas into the treatment chamber, and a high-frequency power of greater than or equal to 0.17 W/cm$^2$ and less than or equal to 0.5 W/cm$^2$, preferably greater than or equal to 0.25 W/cm$^2$ and less than or equal to 0.35 W/cm$^2$ is supplied to an electrode provided in the treatment chamber.

As the deposition conditions of the insulating film 116, the high-frequency power having the above power density is supplied to the reaction chamber having the above pressure, whereby the degradation efficiency of the source gas in plasma is increased, oxygen radicals are increased, and oxidation of the source gas is promoted; thus, the oxygen content in the insulating film 116 becomes higher than that in the stoichiometric composition. In the film formed at a substrate temperature within the above temperature range, the bond between silicon and oxygen is weak, and accordingly, part of oxygen in the film is released by heat treatment in a later step. Thus, it is possible to form an oxide insulating film which contains more oxygen than that in the stoichiometric composition and from which part of oxygen is released by heating.

Note that the insulating film 114 functions as a protective film for the oxide semiconductor film 108 in the step of forming the insulating film 116. Therefore, the insulating film 116 can be formed using the high-frequency power having a high power density while damage to the oxide semiconductor film 108 is reduced.

Note that in the deposition conditions of the insulating film 116, when the flow rate of the deposition gas containing silicon with respect to the oxidizing gas is increased, the amount of defects in the insulating film 116 can be reduced. Typically, it is possible to form an oxide insulating film in which the amount of defects is small, i.e., the spin density of a signal which appears at g=2.001 due to a dangling bond of silicon, is lower than $6\times10^{17}$ spins/cm$^3$, preferably lower than or equal to $3\times10^{17}$ spins/cm$^3$, further preferably lower than or equal to $1.5\times10^{17}$ spins/cm$^3$ by ESR measurement. As a result, the reliability of the transistor 100 can be improved.

Heat treatment (hereinafter referred to as second heat treatment) is favorably performed after the insulating films 114 and 116 are formed. The second heat treatment can reduce nitrogen oxide included in the insulating films 114 and 116. By the second heat treatment, part of oxygen contained in the insulating films 114 and 116 can be transferred to the oxide semiconductor film 108, so that the amount of oxygen vacancies included in the oxide semiconductor film 108 can be reduced.

The temperature of the second heat treatment is typically lower than 400° C., preferably lower than 375° C., further preferably higher than or equal to 150° C. and lower than or equal to 350° C. The second heat treatment may be performed in an atmosphere of nitrogen, oxygen, ultra-dry air (air with a water content of less than or equal to 20 ppm, preferably less than or equal to 1 ppm, further preferably less than or equal to 10 ppb), or a rare gas (e.g., argon, helium). It is preferable that hydrogen, water, and the like not be contained in the nitrogen, oxygen, ultra-dry air, or rare gas. An electric furnace, RTA, or the like can be used for the heat treatment.

Figure 9B:
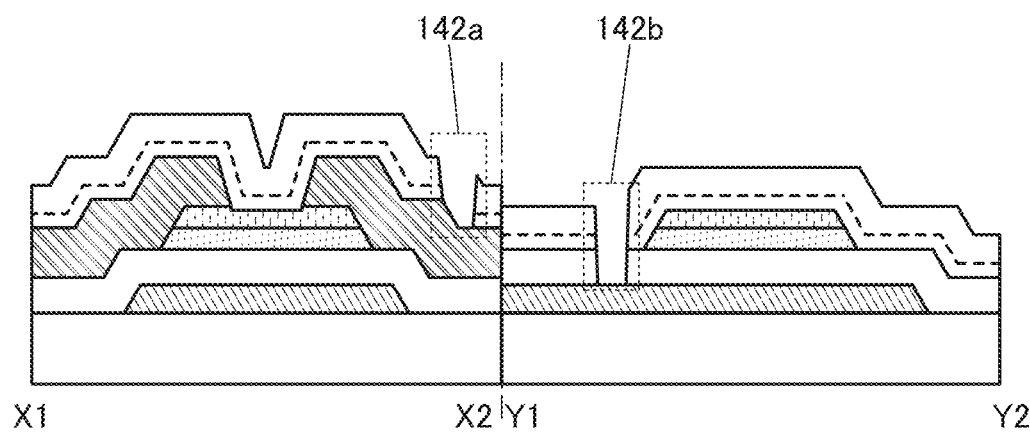

Next, the openings 142a and 142b are formed in desired regions in the insulating films 114 and 116 (see FIG. 9B).

In this embodiment, the openings 142a and 142b are formed with a dry etching apparatus. Note that the opening 142a reaches the conductive film 112b, and the opening 142b reaches the conductive film 104.

Figure 9C:
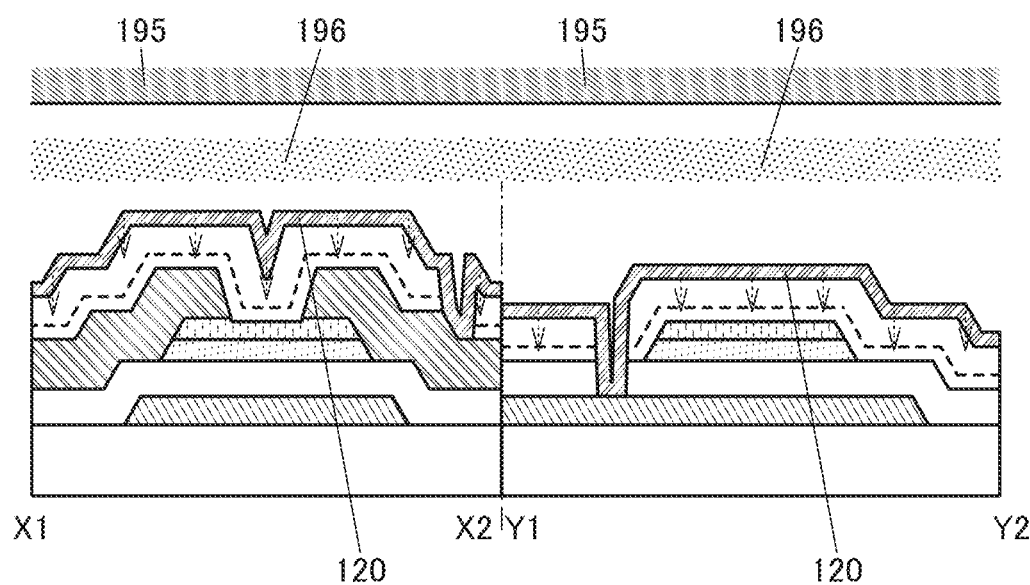

Next, a conductive film 120 is formed over the insulating film 116 (see FIG. 9C).

FIG. 9C is a schematic cross-sectional view illustrating the inside of a deposition apparatus when the conductive film 120 is formed over the insulating film 116. In FIG. 9C, a sputtering apparatus is used as the deposition apparatus, and a target 195 placed inside the sputtering apparatus and plasma 196 formed under the target 195 are schematically illustrated.

When the conductive film 120 is formed, plasma discharge is performed in an atmosphere containing an oxygen gas. At this time, oxygen is added to the insulating film 116 over which the conductive film 120 is to be formed. When the conductive film 120 is formed, an inert gas (e.g., a helium gas, an argon gas, or a xenon gas) and the oxygen gas may be mixed.

The oxygen gas is mixed at least when the conductive film 120 is formed. The proportion of the oxygen gas in a deposition gas for forming the conductive film 120 is higher than 0% and lower than or equal to 100%, preferably higher than or equal to 10% and lower than or equal to 100%, further preferably higher than or equal to 30% and lower than or equal to 100%.

In FIG. 9C, oxygen or excess oxygen added to the insulating film 116 is schematically shown by arrows of broken lines.

In this embodiment, the conductive film 120 is formed by a sputtering method using an In—Ga—Zn metal oxide target (In:Ga:Zn=4:2:4.1 in an atomic ratio).

Note that although oxygen is added to the insulating film 116 when the conductive film 120 is formed in this embodiment, the method for adding oxygen is not limited to this example. For example, oxygen may be further added to the insulating film 116 after the conductive film 120 is formed.

As the method for adding oxygen to the insulating film 116, an ITSO film with a thickness of 5 nm may be formed using a target of an oxide including indium, tin, and silicon (In—Sn—Si oxide, also referred to as ITSO) (In$_2$O$_3$:SnO$_2$: SiO$_2$=85:10:5 in wt %), for example. In that case, the thickness of the ITSO film is greater than or equal to 1 nm and less than or equal to 20 nm or greater than or equal to 2 nm and less than or equal to 10 nm, in which case oxygen is favorably transmitted and release of oxygen can be inhibited. Then, oxygen is added to the insulating film 116 through the ITSO film. Oxygen can be added by, for example, ion doping, ion implantation, or plasma treatment. By application of a bias voltage to the substrate side when oxygen is added, oxygen can be effectively added to the insulating film 116. An ashing apparatus is used, for example, and the power density of the bias voltage applied to the substrate side of the ashing apparatus can be greater than or equal to 1 W/cm$^2$ and less than or equal to 5 W/cm$^2$. The substrate temperature during addition of oxygen is higher than or equal to room temperature and lower than or equal to 300° C., preferably higher than or equal to 100° C. and lower than or equal to 250° C., whereby oxygen can be added efficiently to the insulating film 116.

Figure 10A:
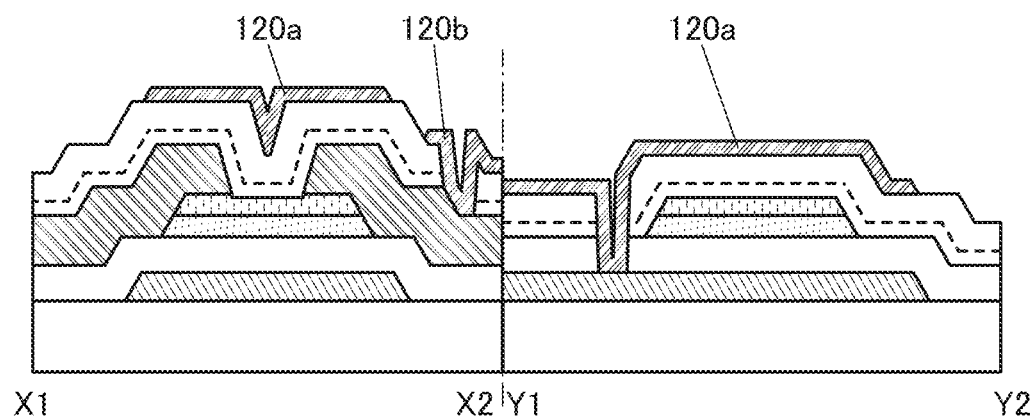
FIGS. 10A and 10B are cross-sectional views illustrating a manufacturing method of a semiconductor device.

Next, the conductive film 120 is processed into a desired shape, so that the island-shaped conductive film 120a and the island-shaped conductive film 120b are formed (see FIG. 10A).

In this embodiment, the conductive film 120 is processed with a wet etching apparatus.

Figure 10B:
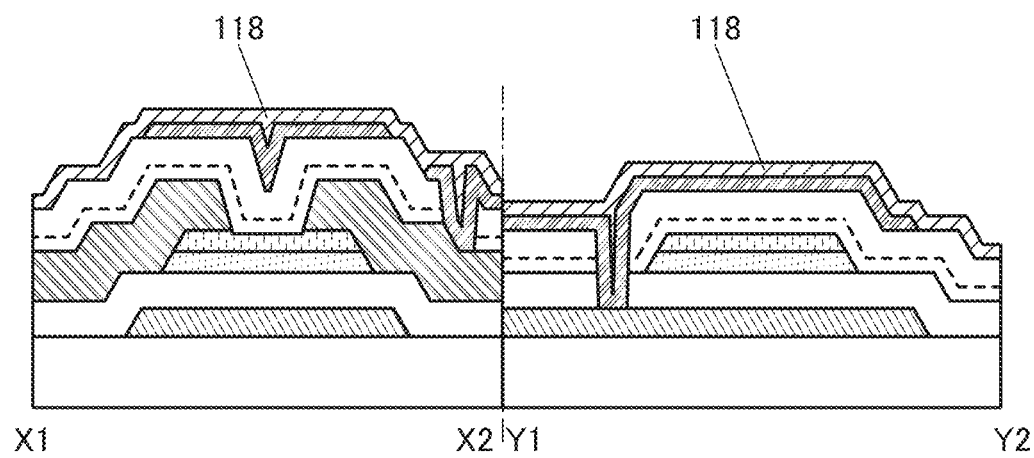

Next, the insulating film 118 is formed over the insulating film 116 and the conductive films 120a and 120b (see FIG. 10B).

The insulating film 118 includes one or both of hydrogen and nitrogen. As the insulating film 118, a silicon nitride film is favorably used, for example. The insulating film 118 can be formed by a sputtering method or a PECVD method, for example. In the case where the insulating film 118 is formed by a PECVD method, for example, the substrate temperature is lower than 400° C., preferably lower than 375° C., and further preferably higher than or equal to 180° C. and lower than or equal to 350° C. The substrate temperature at which the insulating film 118 is formed is preferably within the above range because a dense film can be formed. Furthermore, when the substrate temperature at which the insulating film 118 is formed is within the above range, oxygen or excess oxygen in the insulating films 114 and 116 can be moved to the oxide semiconductor film 108.

In the case where a silicon nitride film is formed by a PECVD method as the insulating film 118, a deposition gas containing silicon, nitrogen, and ammonia are preferably used as a source gas. A small amount of ammonia compared with the amount of nitrogen is used, whereby ammonia is dissociated in the plasma and activated species are generated. The activated species cleave a bond between silicon and hydrogen which are included in a deposition gas including silicon and a triple bond between nitrogen molecules. As a result, a dense silicon nitride film having few defects, in which bonds between silicon and nitrogen are promoted and bonds between silicon and hydrogen are few, can be formed. If the amount of ammonia with respect to nitrogen is large, decomposition of a deposition gas including silicon and decomposition of nitrogen are not promoted, so that a sparse silicon nitride film in which bonds between silicon and hydrogen remain and defects are increased is formed. Therefore, in the source gas, the flow rate of nitrogen is set to be preferably 5 times or more and 50 times or less, further preferably 10 times or more and 50 times or less the flow rate of ammonia.

In this embodiment, with the use of a PECVD apparatus, a 50-nm-thick silicon nitride film is formed as the insulating film 118 using silane, nitrogen, and ammonia as a source gas. The flow rate of silane is 50 sccm, the flow rate of nitrogen is 5000 sccm, and the flow rate of ammonia is 100 sccm. The pressure in the treatment chamber is 100 Pa, the substrate temperature is 350° C., and high-frequency power of 1000 W is supplied to a parallel-plate electrode with a 27.12 MHz high-frequency power source. The PECVD apparatus is a parallel-plate PECVD apparatus in which the electrode area is 6000 cm$^2$, and the power per unit area (power density) into which the supplied power is converted is $1.7 \times 10^{-1}$ W/cm$^2$.

In the case where the conductive films 120a and 120b are formed using an In—Ga—Zn metal oxide target (In:Ga:Zn=4:2:4.1 in an atomic ratio), either or both of hydrogen and nitrogen included in the insulating film 118 might enter the conductive films 120a and 120b. In this case, either or both of hydrogen and nitrogen might be bonded to oxygen vacancies in the conductive films 120a and 120b to cause a reduction in the resistance of the conductive films 120a and 120b.

After the insulating film 118 is formed, heat treatment similar to the first heat treatment or the second heat treatment (hereinafter referred to as third heat treatment) may be performed.

By the third heat treatment, oxygen included in the insulating film 116 moves into the oxide semiconductor film 108 to fill the oxygen vacancies in the oxide semiconductor film 108.

Through the above process, the transistor 100B illustrated in FIGS. 3A to 3C can be manufactured.

The transistor 100 illustrated in FIGS. 1A to 1C can be manufactured by forming the insulating film 118 after the step of FIG. 9A. The transistor 100A illustrated in FIGS. 2A to 2C can be manufactured by changing the formation order of the conductive films 112a and 112b and the insulating films 114 and 116 and, in addition, adding a step for forming the openings 141a and 141b in the insulating films 114 and 116.

At least part of this embodiment can be implemented in combination with any of the other embodiments and example described in this specification as appropriate.

Embodiment 2

In this embodiment, an oxide semiconductor film of one embodiment of the present invention will be described with reference to FIGS. 12A to 12C and FIGS. 13A to 13C.

<2-1. Oxide Semiconductor Film>

The oxide semiconductor film of one embodiment of the present invention will be described below.

The oxide semiconductor film of one embodiment of the present invention includes a first oxide semiconductor film and a second oxide semiconductor film over the first oxide semiconductor film.

For the first oxide semiconductor film, In oxide or In—Zn oxide is preferably used. In particular, In—Zn oxide containing indium and zinc is preferable.

For the second oxide semiconductor film, In-M-Zn oxide (M is Al, Ga, or Y) is preferably used. Furthermore, one or more elements selected from boron, titanium, iron, nickel, germanium, zirconium, molybdenum, lanthanum, cerium, neodymium, tantalum, magnesium, and the like may be given as Min addition to the above elements.

<2-2. Structure of Oxide Semiconductor Film>

An oxide semiconductor film is classified into a single crystal oxide semiconductor film and a non-single-crystal oxide semiconductor film. Examples of a non-single-crystal oxide semiconductor film include a c-axis-aligned crystalline oxide semiconductor (CAAC-OS), a polycrystalline oxide semiconductor film, a nanocrystalline oxide semiconductor (nc-OS), an amorphous-like oxide semiconductor (a-like OS) film, and an amorphous oxide semiconductor film.

The CAAC-OS has c-axis alignment, its nanocrystals are connected in the a-b plane direction, and its crystal structure has distortion. Note that the distortion is a portion where the direction of a lattice arrangement changes between a region with a regular lattice arrangement and another region with a regular lattice arrangement in a region where nanocrystals are connected.

The shape of the nanocrystal is basically hexagon. However, the shape is not always a regular hexagon and is a non-regular hexagon in some cases. A pentagonal lattice arrangement, a heptagonal lattice arrangement, and the like are included in the distortion in some cases. Note that a clear crystal grain boundary cannot be observed even in the vicinity of distortion in the CAAC-OS. That is, formation of a grain boundary is inhibited due to the distortion of lattice arrangement. This is probably because the CAAC-OS can tolerate distortion owing to a low density of the atomic arrangement in an a-b plane direction, an interatomic bond distance changed by substitution of a metal element, and the like.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different nanocrystals in the nc-OS. Thus, the orientation of the whole film is not observed. Accordingly, in some cases, the nc-OS cannot be distinguished from an a-like OS or an amorphous oxide semiconductor film, depending on the analysis method.

An a-like OS is an oxide semiconductor film having a structure between the structure of an nc-OS and the structure of an amorphous oxide semiconductor film. The a-like OS contains a void or a low-density region. That is, the a-like OS has low crystallinity as compared with the nc-OS and the CAAC-OS.

An oxide semiconductor film has various structures which show various different properties. Two or more of an amorphous oxide semiconductor film, a polycrystalline oxide semiconductor film, an a-like OS, an nc-OS, and a CAAC-OS may be included in the oxide semiconductor film of one embodiment of the present invention.

In the case where the first oxide semiconductor film is formed using In—Zn oxide, the In—Zn oxide includes a layered crystal structure (also referred to as a layered structure) in which a layer containing indium and oxygen (hereinafter, In layer) and a layer containing zinc and oxygen (hereinafter, Zn layer) are stacked.

In the case where the first oxide semiconductor film is formed using In oxide or In—Zn oxide, the In oxide or the In—Zn oxide has a bixbyite crystal structure.

In the case where the second oxide semiconductor film is formed using In-M-Zn oxide, the In-M-Zn oxide includes a layered crystal structure in which a layer containing indium and oxygen (hereinafter, In layer) and a layer containing the element M, zinc, and oxygen (hereinafter, (M,Zn) layer) are stacked. Note that indium and the element M can be replaced with each other and when the element M in the (M,Zn) layer is replaced with indium, the layer can also be referred to as an (In,M,Zn) layer. Also, when indium in the In layer is replaced with the element M, the layer can be referred to as an (In,M) layer.

<2-3. Atomic Ratio of Oxide Semiconductor Film>

Next, preferred ranges of the atomic ratio of the elements contained in the oxide semiconductor film of one embodiment of the present invention will be described with reference to FIGS. 12A to 12C. Note that the proportion of oxygen atoms is not shown in FIGS. 12A to 12C. The terms of the atomic ratio of indium, the element M, and zinc contained in the oxide semiconductor film are denoted by [In], [M], and [Zn], respectively.

Figure 12A:
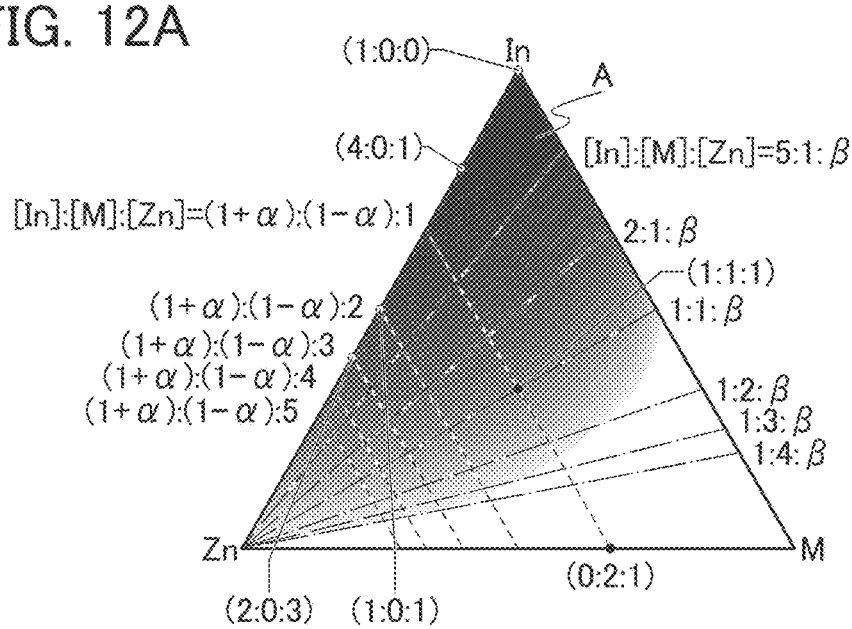
FIGS. 12A to 12C each show a range of the atomic ratio of an oxide semiconductor film.
Figure 12B:
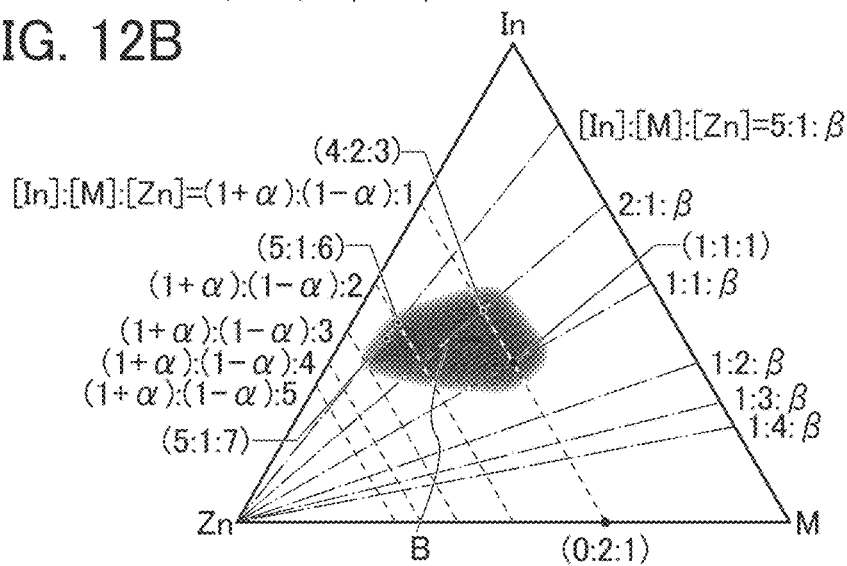
Figure 12C:
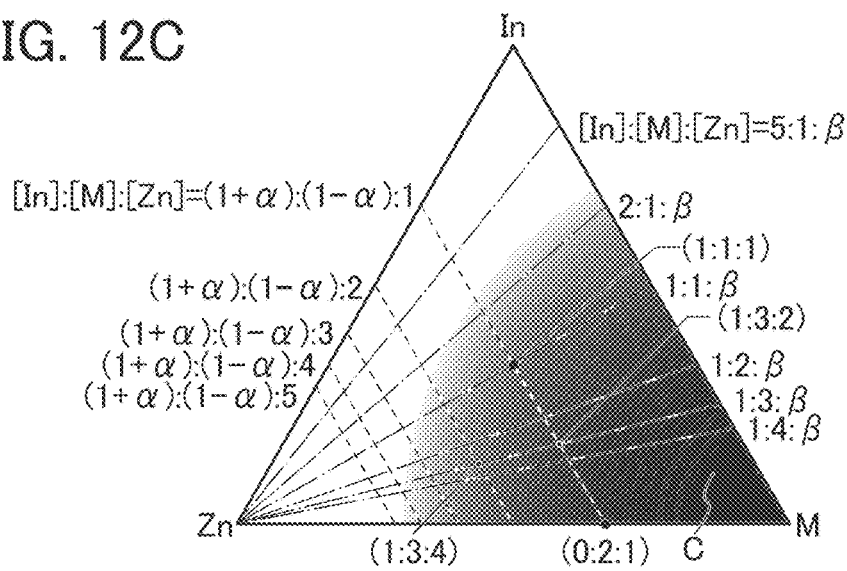

In FIGS. 12A to 12C, broken lines indicate a line where the atomic ratio [In]:[M]:[Zn] is $(1+\alpha):(1-\alpha):1$, where $-1 \leq \alpha \leq 1$, a line where the atomic ratio [In]:[M]:[Zn] is $(1+\alpha):(1-\alpha):2$, a line where the atomic ratio [In]:[M]:[Zn] is $(1+\alpha):(1-\alpha):3$, a line where the atomic ratio [In]:[M]:[Zn] is $(1+\alpha):(1-\alpha):4$, and a line where the atomic ratio [In]:[M]:[Zn] is $(1+\alpha):(1-\alpha):5$.

In addition, dash-dotted lines indicate a line where the atomic ratio [In]:[M]:[Zn] is $5:1:\beta$ ($\beta \geq 0$), a line where the atomic ratio [In]:[M]:[Zn] is $2:1:\beta$, a line where the atomic ratio [In]:[M]:[Zn] is $1:1:\beta$, a line where the atomic ratio [In]:[M]:[Zn] is $1:2:\beta$, a line where the atomic ratio [In]:[M]:[Zn] is $1:3:\beta$, and a line where the atomic ratio [In]:[M]:[Zn] is $1:4:\beta$.

Furthermore, an oxide semiconductor film with the atomic ratio of [In]:[M]:[Zn]=0:2:1 or a neighborhood thereof in FIGS. 12A to 12C tends to have a spinel crystal structure.

A plurality of phases (e.g., two phases or three phases) exists in the oxide semiconductor film in some cases. For example, with the atomic ratio [In]:[M]:[Zn] that is close to 0:2:1, two phases of a spinel crystal structure and a layered crystal structure are likely to exist. In addition, with the atomic ratio [In]:[M]:[Zn] that is close to 1:0:0, two phases of a bixbyite crystal structure and a layered crystal structure are likely to exist. In the case where a plurality of phases exist in the oxide semiconductor film, a grain boundary might be formed between different crystal structures.

A region A in FIG. 12A represents examples of the preferred ranges of the atomic ratio of indium, the element M, and zinc contained in an oxide semiconductor film.

Note that the region A includes atomic ratios on a line connecting a point where the atomic ratio [In]:[M]:[Zn] is 1:0:0 and a point where the atomic ratio [In]:[M]:[Zn] is 0:0:1.

The oxide semiconductor film containing indium in a higher proportion can have high carrier mobility (electron mobility). Therefore, an oxide semiconductor film containing indium in a higher proportion has higher carrier mobility than that of an oxide semiconductor film containing indium in a lower proportion.

In contrast, when the indium content and the zinc content in an oxide semiconductor film become lower, the carrier mobility becomes lower. Thus, with the atomic ratio of [In]:[M]:[Zn]=0:1:0 and the neighborhood thereof (e.g., a region C in FIG. 12C), insulation performance becomes better.

Accordingly, the oxide semiconductor film of one embodiment of the present invention preferably has an atomic ratio represented by the region A in FIG. 12A. With an atomic ratio represented by the region A, the oxide semiconductor film can have high carrier mobility.

In particular, in the case where the first oxide semiconductor film is formed using In oxide or In—Zn oxide, the atomic ratios [In]:[M]:[Zn] represented by white circles in FIG. 12A are preferably 1:0:0, 4:0:1, 1:0:1, and 2:0:3.

It is particularly favorable that the first oxide semiconductor film has an atomic ratio on a line connecting a point where the atomic ratio [In]:[M]:[Zn] is 4:0:1 and a point where the atomic ratio [In]:[M]:[Zn] is 2:0:3, in which case carrier mobility can be improved.

In the case where the second oxide semiconductor film contains In-M-Zn oxide, the atomic ratio is preferably within the range of a region B in FIG. 12B, which is in the region A in FIG. 12A. An oxide semiconductor film with an atomic ratio in the region B in FIG. 12B is excellent because the oxide semiconductor film easily becomes a CAAC-OS and has high carrier mobility.

The CAAC-OS is an oxide semiconductor having high crystallinity. In contrast, in the CAAC-OS, a reduction in electron mobility due to the grain boundary is less likely to occur because a clear grain boundary cannot be observed. In addition, entry of impurities, formation of defects, or the like might decrease the crystallinity of an oxide semiconductor film. This means that the CAAC-OS is an oxide semiconductor having small amounts of impurities and defects (e.g., oxygen vacancies). Thus, an oxide semiconductor film including a CAAC-OS is physically stable. Therefore, the oxide semiconductor film including a CAAC-OS is resistant to heat and has high reliability.

The above-described oxide semiconductor film including a CAAC-OS with high reliability can be favorably used as an oxide semiconductor film positioned on the back channel side of a transistor, for example.

Note that the region B includes the atomic ratio of [In]:[M]:[Zn]=4:2:3 to 4:1 and the neighborhood thereof. The neighborhood includes the atomic ratio of [In]:[M]:[Zn]=5:3:4, for example. Note that the region B includes the atomic ratio of [In]:[M]:[Zn]=5:1:6 and the neighborhood thereof and the atomic ratio of [In]:[M]:[Zn]=5:1:7 and the neighborhood thereof.

Note that the property of an oxide semiconductor film is not uniquely determined by an atomic ratio. Even with the same atomic ratio, the property of the oxide semiconductor film might be different depending on a formation condition. For example, in the case where the oxide semiconductor film is formed with a sputtering apparatus, a film having an atomic ratio deviated from the atomic ratio of a target is formed. In addition, [Zn] in the film might be smaller than [Zn] in the target depending on the substrate temperature in deposition. Thus, the illustrated regions each represent an atomic ratio with which an oxide semiconductor film tends to have specific properties, and boundaries of the regions A to C are not clear.

<2-4. Transistor Including Oxide Semiconductor Film>

Next, the case where the oxide semiconductor film is used for a transistor will be described.

Note that when the oxide semiconductor film is used for a transistor, carrier scattering or the like at a grain boundary can be reduced; thus, the transistor can have high field-effect mobility. In addition, the transistor can have high reliability.

An oxide semiconductor film with low carrier density is preferably used for the transistor. In order to reduce the carrier density of the oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. For example, an oxide semiconductor film whose carrier density is lower than $8 \times 10^{11}/cm^3$, preferably lower than $1 \times 10^{11}/cm^3$, further preferably lower than $1 \times 10^{10}/cm^3$, and greater than or equal to $1 \times 10^{-9}/cm^3$ is used.

A highly purified intrinsic or substantially highly purified intrinsic oxide semiconductor film has a low density of defect states and accordingly has a low density of trap states in some cases.

Charges trapped by the trap states in the oxide semiconductor film take a long time to be released and may behave like fixed charges. Thus, the transistor whose channel region is formed in the oxide semiconductor film having a high density of trap states has unstable electrical characteristics in some cases.

To obtain stable electrical characteristics of the transistor, it is effective to reduce the concentration of impurities in the oxide semiconductor film. In addition, to reduce the concentration of impurities in the oxide semiconductor film, the concentration of impurities in a film that is adjacent to the oxide semiconductor film is preferably reduced. Examples of impurities include hydrogen, nitrogen, alkali metal, alkaline earth metal, iron, nickel, and silicon.

<2-5. Impurities in Oxide Semiconductor Film>

Next, the influence of impurities in the oxide semiconductor film will be described.

When silicon or carbon that is one of Group 14 elements is contained in the oxide semiconductor film, defect states are formed. Thus, the concentration of silicon or carbon in the oxide semiconductor film and around an interface with the oxide semiconductor film (measured by secondary ion mass spectrometry (SIMS)) is set lower than or equal to $2 \times 10^{18}$ atoms/cm$^3$, and preferably lower than or equal to $2 \times 10^{17}$ atoms/cm$^3$.

When the oxide semiconductor film contains alkali metal or alkaline earth metal, defect states are formed and carriers are generated, in some cases. Thus, a transistor including an oxide semiconductor film which contains alkali metal or alkaline earth metal is likely to be normally-on. Therefore, it is preferable to reduce the concentration of alkali metal or alkaline earth metal in the oxide semiconductor film. Specifically, the concentration of alkali metal or alkaline earth metal in the oxide semiconductor film, which is measured by SIMS, is lower than or equal to $1 \times 10^{18}$ atoms/cm$^3$, preferably lower than or equal to $2 \times 10^{16}$ atoms/cm$^3$.

When the oxide semiconductor film contains nitrogen, the oxide semiconductor film easily becomes n-type by generation of electrons serving as carriers and an increase of carrier density. Thus, a transistor including an oxide semiconductor film which contains nitrogen is likely to be normally-on. For this reason, nitrogen in the oxide semiconductor film is preferably reduced as much as possible; the nitrogen concentration in the oxide semiconductor film measured by SIMS is set, for example, lower than $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, and still further preferably lower than or equal to $5 \times 10^{17}$ atoms/cm$^3$.

Hydrogen contained in an oxide semiconductor film reacts with oxygen bonded to a metal atom to be water, and thus causes an oxygen vacancy, in some cases. Due to entry of hydrogen into the oxygen vacancy, an electron serving as a carrier is generated in some cases. Furthermore, in some cases, bonding of part of hydrogen to oxygen bonded to a metal atom causes generation of an electron serving as a carrier. Thus, a transistor including an oxide semiconductor film that contains hydrogen is likely to be normally-on. Accordingly, it is preferable that hydrogen in the oxide semiconductor film be reduced as much as possible. Specifically, the hydrogen concentration in the oxide semiconductor film measured by SIMS is set lower than $1 \times 10^{20}$ atoms/cm$^3$, preferably lower than $1 \times 10^{19}$ atoms/cm$^3$, further preferably lower than $5 \times 10^{18}$ atoms/cm$^3$, and still further preferably lower than $1 \times 10^{18}$ atoms/cm$^3$.

When an oxide semiconductor film with sufficiently reduced impurity concentration is used for a channel region in a transistor, the transistor can have stable electrical characteristics.

<2-6. Band Diagram>

Next, the case where the above-described oxide semiconductor film has a two-layer structure or a three-layer structure will be described.

Figure 13A:
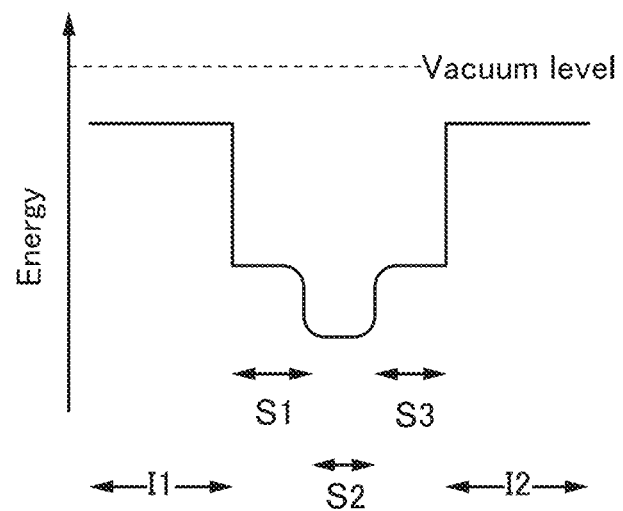
FIGS. 13A to 13C are band diagrams of stacked structures of oxide semiconductor films.
Figure 13B:
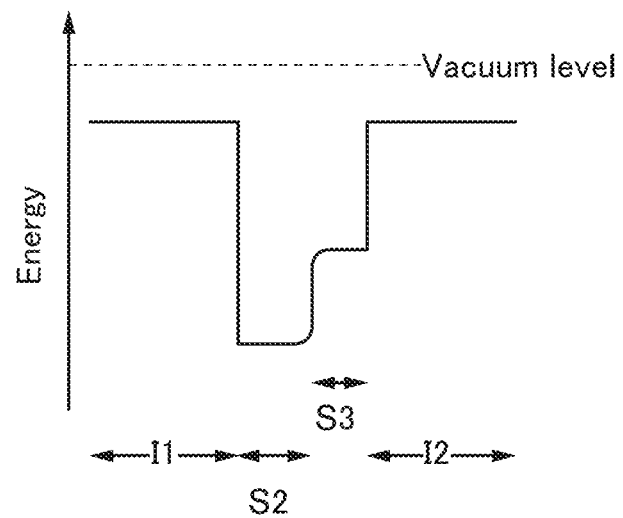
Figure 13C:
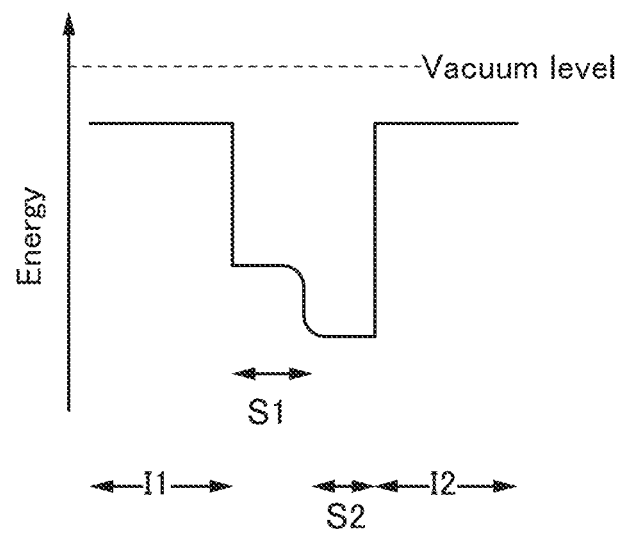

A band diagram of a stacked-layer structure of an oxide semiconductor film S1, an oxide semiconductor film S2, and an oxide semiconductor film S3 and insulating films that are in contact with the stacked-layer structure, a band diagram of a stacked-layer structure of the oxide semiconductor films S2 and S3 and insulating films that are in contact with the stacked-layer structure, and a band diagram of a stacked-layer structure of the oxide semiconductor films S1 and S2 and insulating films that are in contact with the stacked-layer structure are described with reference to FIGS. 13A to 13C.

FIG. 13A is an example of a band diagram of a layered structure including an insulating film I1, the oxide semiconductor film S1, the oxide semiconductor film S2, the oxide semiconductor film S3, and an insulating film 12 in a thickness direction. FIG. 13B is an example of a band diagram of a layered structure including the insulating film I1, the oxide semiconductor film S2, the oxide semiconductor film S3, and the insulating film 12 in a thickness direction. FIG. 13C is an example of a band diagram of a layered structure including the insulating film I1, the oxide semiconductor film S1, the oxide semiconductor film S2, and the insulating film 12 in a thickness direction. Note that for easy understanding, the band diagrams show the conduction band minimum (Ec) of each of the insulating film I1, the oxide semiconductor film S1, the oxide semiconductor film S2, the oxide semiconductor film S3, and the insulating film 12.

The conduction band minimum of each of the oxide semiconductor films S1 and S3 is closer to the vacuum level than that of the oxide semiconductor film S2. Typically, a difference between the conduction band minimum of the oxide semiconductor film S2 and the conduction band minimum of each of the oxide semiconductor films S1 and S3 is preferably greater than or equal to 0.15 eV or greater than or equal to 0.5 eV, and less than or equal to 2 eV or less than or equal to 1 eV. That is, the difference between the electron affinity of each of the oxide semiconductor films S1 and S3 and the electron affinity of the oxide semiconductor film S2 is greater than or equal to 0.15 eV or greater than or equal to 0.5 eV, and less than or equal to 2 eV or less than or equal to 1 eV.

As illustrated in FIGS. 13A to 13C, the conduction band minimum of each of the oxide semiconductor films S1 to S3 is gradually varied. In other words, the conduction band minimum is continuously varied or continuously connected. To obtain such a band diagram, the density of defect states in a mixed layer formed at an interface between the oxide semiconductor films S1 and S2 or an interface between the oxide semiconductor films S2 and S3 is preferably made low.

Specifically, when the oxide semiconductor films S1 and S2 or the oxide semiconductor films S2 and S3 contain the same element (as a main component) in addition to oxygen, a mixed layer with a low density of defect states can be formed. For example, in the case where the oxide semiconductor film S2 is an In—Ga—Zn oxide semiconductor film, it is preferable to use an In—Ga—Zn oxide semiconductor film, a Ga—Zn oxide semiconductor film, gallium oxide, or the like as each of the oxide semiconductor films S1 and S3.

At this time, the oxide semiconductor film S2 serves as a main carrier path. Since the density of defect states at the interface between the oxide semiconductor films S1 and S2 and the interface between the oxide semiconductor films S2 and S3 can be made low, the influence of interface scattering on carrier conduction is small, and a high on-state current can be obtained.

When an electron is trapped in a trap state, the trapped electron behaves like fixed charge; thus, the threshold voltage of the transistor is shifted in a positive direction. The oxide semiconductor films S1 and S3 can make the trap state apart from the oxide semiconductor film S2. This structure can prevent the positive shift of the threshold voltage of the transistor.

A material whose conductivity is sufficiently lower than that of the oxide semiconductor film S2 is used for the oxide semiconductor films S1 and S3. In that case, the oxide semiconductor film S2, the interface between the oxide semiconductor films S1 and S2, and the interface between the oxide semiconductor films S2 and S3 mainly function as a channel region. For example, an oxide semiconductor film with high insulation performance and an atomic ratio represented by the region C in FIG. 12C can be used as the oxide semiconductor films S1 and S3. Note that the region C illustrated in FIG. 12C represents the atomic ratio [In]:[M]:[Zn] of 0:1:0, 1:3:2, and 1:3:4 and the neighborhood thereof.

In the case where an oxide semiconductor film with an atomic ratio represented by the region A is used as the oxide semiconductor film S2, it is favorable to use an oxide semiconductor film with [M]/[In] of greater than or equal to 1, preferably greater than or equal to 2, as each of the oxide semiconductor films S1 and S3. In addition, it is favorable to use an oxide semiconductor film with sufficiently high insulation performance and [M]/([Zn]+[In]) of greater than or equal to 1 as the oxide semiconductor film S3.

Note that the structures described in this embodiment can be used in combination with any of the structures described in the other embodiments and example as appropriate.

Embodiment 3

In this embodiment, an example of a display device including the transistor described in the above embodiment will be described with reference to FIG. 14, FIG. 15, FIG. 16, FIG. 18, FIG. 19, and FIG. 20.

Figure 14:
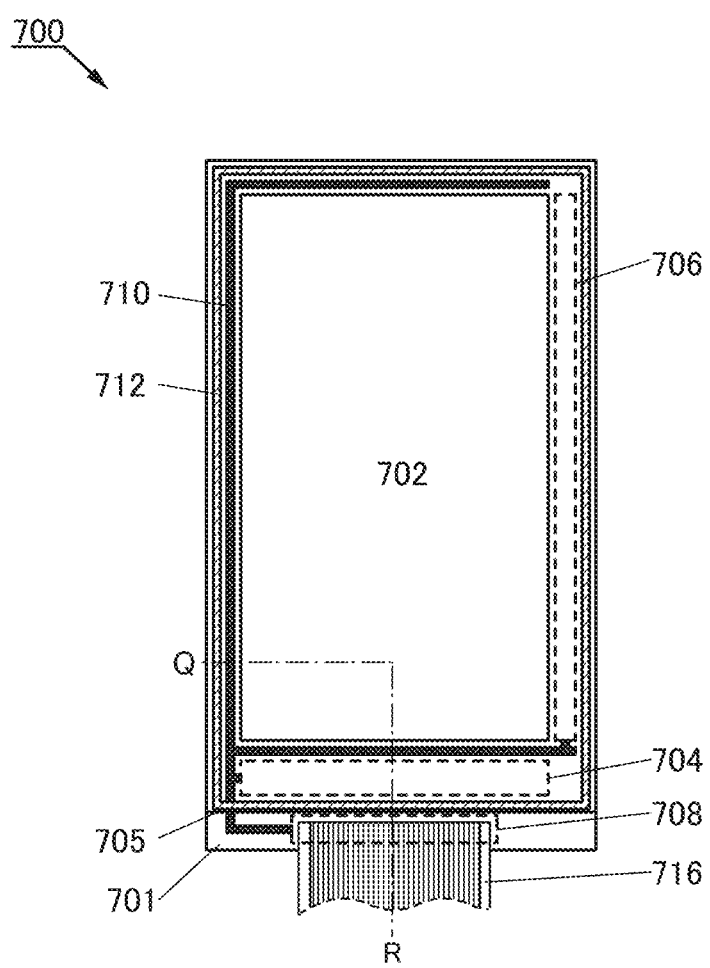
FIG. 14 is a top view of one embodiment of a display device.

FIG. 14 is a top view of an example of a display device. A display device 700 illustrated in FIG. 14 includes a pixel portion 702 provided over a first substrate 701, a source driver circuit portion 704 and a gate driver circuit portion 706 provided over the first substrate 701, a sealant 712 provided to surround the pixel portion 702, the source driver circuit portion 704, and the gate driver circuit portion 706, and a second substrate 705 provided to face the first substrate 701. The first substrate 701 and the second substrate 705 are sealed with the sealant 712. That is, the pixel portion 702, the source driver circuit portion 704, and the gate driver circuit portion 706 are sealed with the first substrate 701, the sealant 712, and the second substrate 705. Although not illustrated in FIG. 14, a display element is provided between the first substrate 701 and the second substrate 705.

In the display device 700, a flexible printed circuit (FPC) terminal portion 708 electrically connected to the pixel portion 702, the source driver circuit portion 704, and the gate driver circuit portion 706 is provided in a region different from the region which is surrounded by the sealant 712 and positioned over the first substrate 701. Furthermore, an FPC 716 is connected to the FPC terminal portion 708, and a variety of signals and the like are supplied to the pixel portion 702, the source driver circuit portion 704, and the gate driver circuit portion 706 through the FPC 716. Furthermore, a signal line 710 is connected to the pixel portion 702, the source driver circuit portion 704, the gate driver circuit portion 706, and the FPC terminal portion 708. The variety of signals and the like are applied to the pixel portion 702, the source driver circuit portion 704, the gate driver circuit portion 706, and the FPC terminal portion 708 via the signal line 710 from the FPC 716.

A plurality of gate driver circuit portions 706 may be provided in the display device 700. An example of the display device 700 in which the source driver circuit portion 704 and the gate driver circuit portion 706 are formed over the first substrate 701 where the pixel portion 702 is also formed is described; however, the structure is not limited thereto. For example, only the gate driver circuit portion 706 may be formed over the first substrate 701 or only the source driver circuit portion 704 may be formed over the first substrate 701. In this case, a substrate where a source driver circuit, a gate driver circuit, or the like is formed (e.g., a driver-circuit substrate formed using a single-crystal semiconductor film or a polycrystalline semiconductor film) may be formed on the first substrate 701. Note that there is no particular limitation on the method of connecting a separately prepared driver circuit substrate, and a chip on glass (COG) method, a wire bonding method, or the like can be used.

The pixel portion 702, the source driver circuit portion 704, and the gate driver circuit portion 706 included in the display device 700 include a plurality of transistors. As the plurality of transistors, any of the transistors that are described in the above embodiments can be used.

The display device 700 can include any of a variety of elements. Examples of the elements include an electroluminescent (EL) element (e.g., an EL element including organic and inorganic materials, an organic EL element, an inorganic EL element, or an LED), a light-emitting transistor element (a transistor that emits light depending on current), an electron-emissive element, a liquid crystal element, an electronic ink element, an electrophoretic element, an electrowetting element, a plasma display panel (PDP), a display using micro electro mechanical systems (MEMS) (e.g., a grating light valve (GLV), a digital micromirror device (DMD), a digital micro shutter (DMS) element, or an interferometric modulation (IMOD) element), a piezoelectric ceramic display, and the like.

In addition, examples of display devices having EL elements include an EL display. Examples of display devices including electron-emissive elements include a field emission display (FED) and an SED-type flat panel display (SED: surface-conduction electron-emitter display). Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). An example of a display device including an electronic ink element or electrophoretic elements is electronic paper. In the case where a transflective liquid crystal display or a reflective liquid crystal display is achieved, some of or all of pixel electrodes function as reflective electrodes. For example, some or all of pixel electrodes are formed to include aluminum, silver, or the like. In such a case, a memory circuit such as an SRAM can be provided under the reflective electrodes, leading to lower power consumption.

As a display method in the display device 700, a progressive method, an interlace method, or the like can be employed. Furthermore, color elements controlled in a pixel at the time of color display are not limited to three colors: R, G, and B (R, G, and B correspond to red, green, and blue, respectively). For example, four pixels of the R pixel, the G pixel, the B pixel, and a W (white) pixel may be included. Alternatively, a color element may be composed of two colors among R, G, and B as in PenTile layout. The two colors may differ among color elements. Alternatively, one or more colors of yellow, cyan, magenta, and the like may be added to RGB. Furthermore, the size of a display region may be different depending on respective dots of the color components. Embodiments of the disclosed invention are not limited to a display device for color display; the disclosed invention can also be applied to a display device for monochrome display.

A coloring layer (also referred to as a color filter) may be used to obtain a full-color display device in which white light (W) is used for a backlight (e.g., an organic EL element, an inorganic EL element, an LED, or a fluorescent lamp). For example, a red (R) coloring layer, a green (G) coloring layer, a blue (B) coloring layer, and a yellow (Y) coloring layer can be combined as appropriate. With the use of the coloring layer, high color reproducibility can be obtained as compared with the case without the coloring layer. Here, by providing a region with a coloring layer and a region without a coloring layer, white light in the region without the coloring layer may be directly utilized for display. By partly providing the region without a coloring layer, a decrease in the luminance of a bright image due to the coloring layer can be suppressed, and approximately 20% to 30% of power consumption can be reduced in some cases. In the case where full-color display is performed using a self-luminous element such as an organic EL element or an inorganic EL element, elements may emit light in their respective colors R, G, B, Y, and W. By using a self-luminous element, power consumption may be further reduced as compared with the case of using a coloring layer.

As a coloring system, any of the following systems may be used: the above-described color filter system in which part of white light is converted into red light, green light, and blue light through color filters; a three-color system in which red light, green light, and blue light are used; and a color conversion system or a quantum dot system in which part of blue light is converted into red light or green light.

Figure 15:
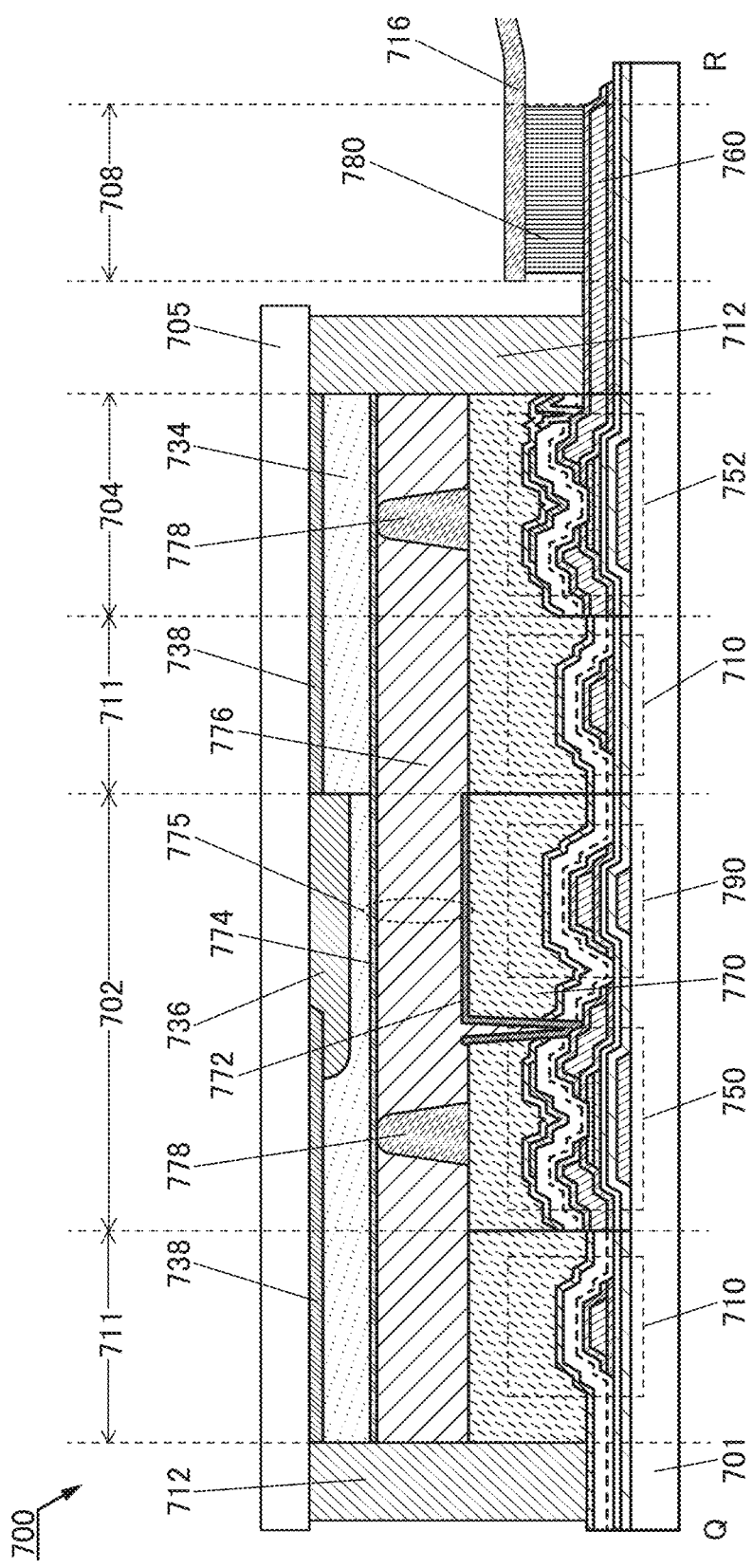
FIG. 15 is a cross-sectional view of one embodiment of a display device.
Figure 17:
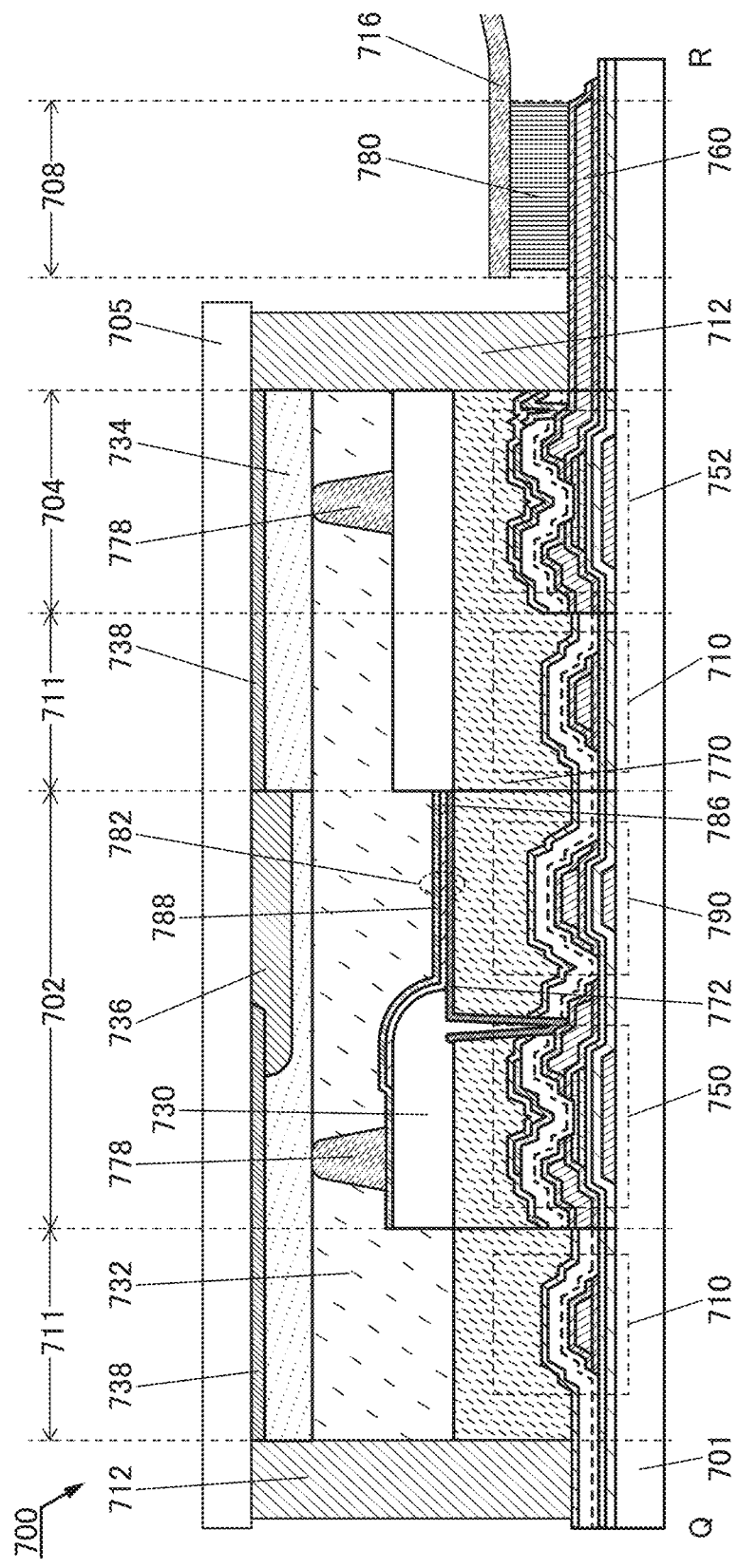
FIG. 17 is a cross-sectional view of one embodiment of a display device.

In this embodiment, a structure including a liquid crystal element as a display element and a structure including an EL element as a display element will be described with reference to FIG. 15 and FIG. 17. FIG. 15 is a cross-sectional view taken along a dashed dotted line Q-R in FIG. 14 and illustrates the structure including a liquid crystal element as a display element. FIG. 17 is a cross-sectional view taken along a dashed dotted line Q-R in FIG. 14 and illustrates the structure including an EL element as a display element.

Portions common to FIG. 15 and FIG. 17 will be described first, and then, different portions will be described.

<3-1. Portions Common to Display Devices>

The display device 700 in FIG. 15 and FIG. 17 includes a lead wiring portion 711, the pixel portion 702, the source driver circuit portion 704, and the FPC terminal portion 708. The lead wiring portion 711 includes the signal line 710. The pixel portion 702 includes a transistor 750 and a capacitor 790. The source driver circuit portion 704 includes a transistor 752.

The transistor 750 and the transistor 752 each have a structure similar to that of the transistor 100D described above. Note that the transistor 750 and the transistor 752 may each have the structure of any of the other transistors described in the above embodiments.

The transistor used in this embodiment includes an oxide semiconductor film that is highly purified and in which formation of oxygen vacancies is inhibited. The transistor can have low off-state current. Accordingly, an electrical signal such as an image signal can be held for a long time, and a long writing interval can be set in an on state. Accordingly, the frequency of refresh operation can be reduced, which suppresses power consumption.

In addition, the transistor used in this embodiment can have relatively high field-effect mobility and thus is capable of high-speed operation. For example, in a liquid crystal display device that includes such a transistor capable of high-speed operation, a switching transistor in a pixel portion and a driver transistor in a driver circuit portion can be formed over one substrate. That is, no additional semiconductor device formed using a silicon wafer or the like is needed as a driver circuit; therefore, the number of components of the semiconductor device can be reduced. In addition, by using the transistor capable of high-speed operation in the pixel portion, a high-quality image can be provided.

The capacitor 790 includes a lower electrode and an upper electrode. The lower electrode is formed through a step of processing the conductive film to be the conductive film functioning as a first gate electrode of the transistor 750. The upper electrode is formed through a step of processing the conductive film to be the conductive film functioning as a source electrode or a drain electrode of the transistor 750. Between the lower electrode and the upper electrode, an insulating film formed through a step of forming the insulating film to be the insulating film functioning as a first gate insulating film of the transistor 750 is provided. That is, the capacitor 790 has a stacked-layer structure in which an insulating film functioning as a dielectric film is positioned between the pair of electrodes.

In FIG. 15 and FIG. 17, a planarization insulating film 770 is provided over the transistor 750, the transistor 752, and the capacitor 790.

The planarization insulating film 770 can be formed using a heat-resistant organic material, such as a polyimide resin, an acrylic resin, a polyimide amide resin, a benzocyclobutene resin, a polyamide resin, or an epoxy resin. Note that the planarization insulating film 770 may be formed by stacking a plurality of insulating films formed from these materials. Alternatively, a structure without the planarization insulating film 770 may be employed.

Although FIG. 15 and FIG. 17 each illustrate an example in which the transistor 750 included in the pixel portion 702 and the transistor 752 included in the source driver circuit portion 704 have the same structure, one embodiment of the present invention is not limited thereto. For example, the pixel portion 702 and the source driver circuit portion 704 may include different transistors. Specifically, a structure in which a staggered transistor is used in the pixel portion 702 and the inverted staggered transistor described in Embodiment 1 is used in the source driver circuit portion 704, or a structure in which the inverted staggered transistor described in Embodiment 1 is used in the pixel portion 702 and a staggered transistor is used in the source driver circuit portion 704 may be employed. Note that the term "source driver circuit portion 704" can be replaced by the term "gate driver circuit portion".

The signal line 710 is formed through the same process as the conductive films functioning as source electrodes and drain electrodes of the transistors 750 and 752. In the case where the signal line 710 is formed using a material containing a copper element, signal delay or the like due to wiring resistance is reduced, which enables display on a large screen.

The FPC terminal portion 708 includes a connection electrode 760, an anisotropic conductive film 780, and the FPC 716. Note that the connection electrode 760 is formed through the same process as the conductive films functioning as source electrodes and drain electrodes of the transistors 750 and 752. The connection electrode 760 is electrically connected to a terminal included in the FPC 716 through the anisotropic conductive film 780.

Glass substrates can be used as the first substrate 701 and the second substrate 705, for example. As the first substrate 701 and the second substrate 705, flexible substrates may also be used. An example of the flexible substrate is a plastic substrate.

A structure 778 is provided between the first substrate 701 and the second substrate 705. The structure 778 is a columnar spacer obtained by selective etching of an insulating film and is provided to control the distance (cell gap) between the first substrate 701 and the second substrate 705. Alternatively, a spherical spacer may also be used as the structure 778.

A light-blocking film 738 functioning as a black matrix, a coloring film 736 functioning as a color filter, and an insulating film 734 in contact with the light-blocking film 738 and the coloring film 736 are provided on the second substrate 705 side.

<3-2. Structure Example of Display Device Including Liquid Crystal Element>

The display device 700 in FIG. 15 includes a liquid crystal element 775. The liquid crystal element 775 includes a conductive film 772, a conductive film 774, and a liquid crystal layer 776. The conductive film 774 is provided on the second substrate 705 side and functions as a counter electrode. The display device 700 in FIG. 15 can display an image in such a manner that transmission or non-transmission of light is controlled by the alignment state in the liquid crystal layer 776 that is changed depending on the voltage applied between the conductive film 772 and the conductive film 774.

The conductive film 772 is electrically connected to the conductive film functioning as the source electrode or the drain electrode of the transistor 750. The conductive film 772 is formed over the planarization insulating film 770 and functions as a pixel electrode, that is, one electrode of the display element. The conductive film 772 has a function of a reflective electrode. The display device 700 in FIG. 15 is what is called a reflective color liquid crystal display device in which external light is reflected by the conductive film 772 to display an image through the coloring film 736.

A conductive film that transmits visible light or a conductive film that reflects visible light can be used as the conductive film 772. For example, a material containing an element selected from indium (In), zinc (Zn), and tin (Sn) is preferably used for the conductive film that transmits visible light. For example, a material containing aluminum or silver is preferably used for the conductive film that reflects visible light. In this embodiment, a conductive film that reflects visible light is used as the conductive film 772.

Figure 16:
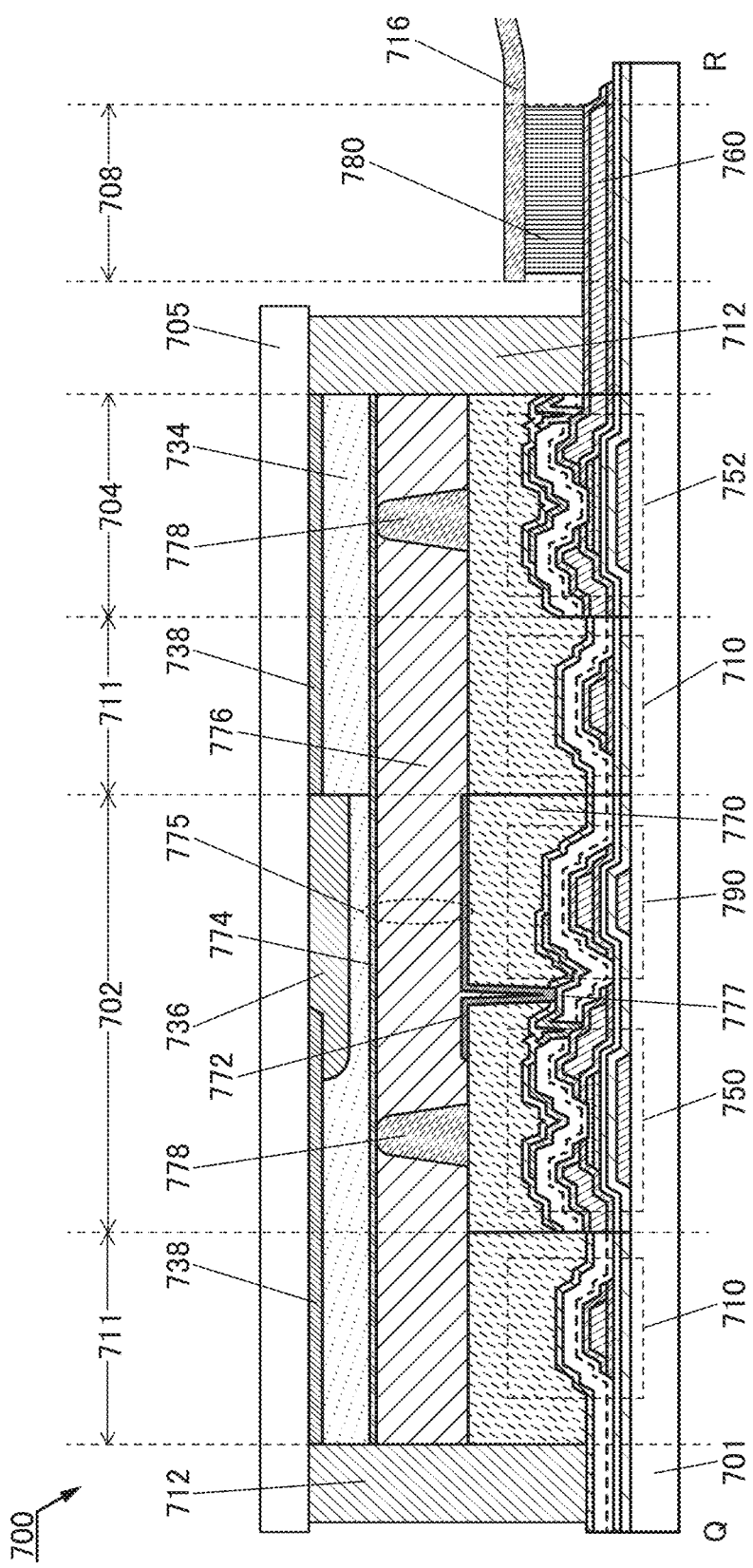
FIG. 16 is a cross-sectional view of one embodiment of a display device.

Although FIG. 15 illustrates an example in which the conductive film 772 is connected to the conductive film functioning as the drain electrode of the transistor 750, one embodiment of the present invention is not limited to this example. For example, as illustrated in FIG. 16, the conductive film 772 may be electrically connected to the conductive film functioning as the drain electrode of the transistor 750 through a conductive film 777 functioning as a connection electrode. Note that the conductive film 777 is formed by a step of processing the conductive film to be the conductive film functioning as a second gate electrode of the transistor 750 and thus can be formed without adding a manufacturing step.

Note that the display device 700 is not limited to the example in FIG. 15, which illustrates a reflective color liquid crystal display device, and may be a transmissive color liquid crystal display device in which a conductive film that transmits visible light is used as the conductive film 772. Alternatively, the display device 700 may be what is called a transflective color liquid crystal display device in which a reflective color liquid crystal display device and a transmissive color liquid crystal display device are combined.

Figure 18:
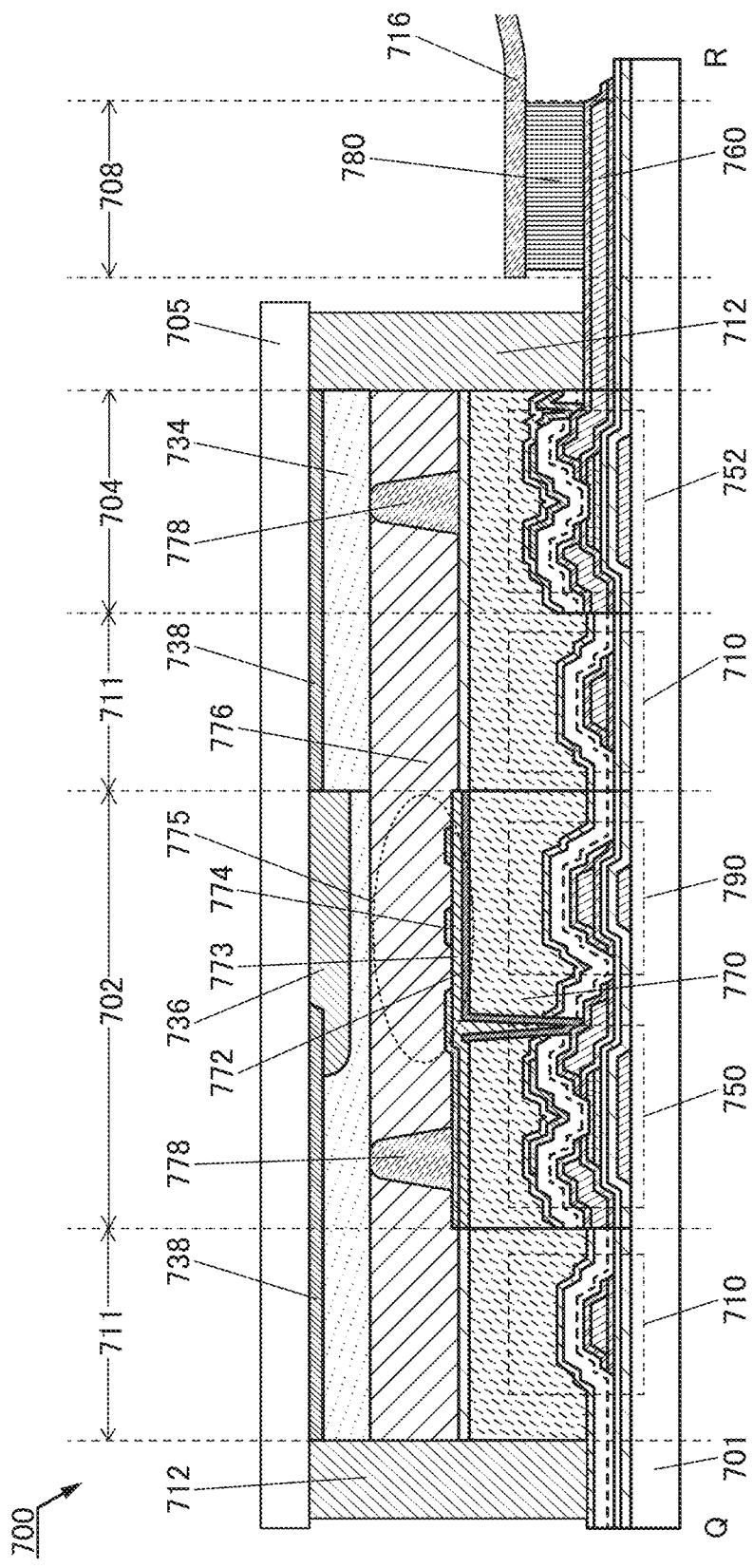
FIG. 18 is a cross-sectional view of one embodiment of a display device.

FIG. 18 illustrates an example of a transmissive color liquid crystal display device. FIG. 18 is a cross-sectional view taken along a dashed dotted line Q-R in FIG. 14 and illustrates the structure including a liquid crystal element as a display element. The display device 700 illustrated in FIG. 18 is an example of employing a horizontal electric field mode (e.g., an FFS mode) as a driving mode of the liquid crystal element. In the structure illustrated in FIG. 18, an insulating film 773 is provided over the conductive film 772 functioning as the pixel electrode, and the conductive film 774 is provided over the insulating film 773. In such a structure, the conductive film 774 functions as a common electrode, and an electric field generated between the conductive film 772 and the conductive film 774 through the insulating film 773 can control the alignment state in the liquid crystal layer 776.

Although not illustrated in FIG. 15 and FIG. 18, the conductive film 772 and/or the conductive film 774 may be provided with an alignment film on a side in contact with the liquid crystal layer 776. Although not illustrated in FIG. 15 and FIG. 18, an optical member (optical substrate) or the like, such as a polarizing member, a retardation member, or an anti-reflection member, may be provided as appropriate. For example, circular polarization may be obtained by using a polarizing substrate and a retardation substrate. In addition, a backlight, a sidelight, or the like may be used as a light source.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an anti-ferroelectric liquid crystal, or the like can be used. These liquid crystal materials exhibit a cholesteric phase, a smectic phase, a cubic phase, a chiral nematic phase, an isotropic phase, or the like depending on conditions.

In the case where a horizontal electric field mode is employed, a liquid crystal exhibiting a blue phase for which an alignment film is unnecessary may be used. The blue phase is one of liquid crystal phases, which is generated just before a cholesteric phase changes into an isotropic phase when the temperature of a cholesteric liquid crystal is increased. Since the blue phase appears only in a narrow temperature range, a liquid crystal composition in which several weight percent or more of a chiral material is mixed is used for the liquid crystal layer in order to improve the temperature range. The liquid crystal composition containing a liquid crystal exhibiting a blue phase and a chiral material has a short response time and optical isotropy, which eliminates the need for an alignment process. An alignment film does not need to be provided, and thus, rubbing treatment is not necessary; accordingly, electrostatic discharge damage caused by the rubbing treatment can be prevented, and defects and damage of a liquid crystal display device in the manufacturing process can be reduced. Moreover, the liquid crystal material that exhibits a blue phase has small viewing angle dependence.

In the case where a liquid crystal element is used as a display element, a twisted nematic (TN) mode, an in-plane switching (IPS) mode, a fringe field switching (FFS) mode, an axially symmetric aligned micro-cell (ASM) mode, an optical compensated birefringence (OCB) mode, a ferroelectric liquid crystal (FLC) mode, an anti-ferroelectric liquid crystal (AFLC) mode, or the like can be used.

Furthermore, a normally black liquid crystal display device such as a vertical alignment (VA) mode transmissive liquid crystal display device may also be used. There are some examples of a vertical alignment mode; for example, a multi-domain vertical alignment (MVA) mode, a patterned vertical alignment (PVA) mode, and an ASV mode, or the like can be employed.

<3-3. Display Device Including Light-Emitting Element>

The display device 700 illustrated in FIG. 17 includes a light-emitting element 782. The light-emitting element 782 includes a conductive film 772, an EL layer 786, and a conductive film 788. The display device 700 illustrated in FIG. 17 can display an image by utilizing light emission from the EL layer 786 of the light-emitting element 782. Note that the EL layer 786 contains an organic compound or an inorganic compound such as a quantum dot.

Examples of materials that can be used for an organic compound include a fluorescent material and a phosphorescent material. Examples of materials that can be used for a quantum dot include a colloidal quantum dot material, an alloyed quantum dot material, a core-shell quantum dot material, and a core quantum dot material. A material containing elements belonging to Groups 12 and 16, elements belonging to Groups 13 and 15, or elements belonging to Groups 14 and 16, may be used. Alternatively, a quantum dot material containing an element such as cadmium (Cd), selenium (Se), zinc (Zn), sulfur (S), phosphorus (P), indium (In), tellurium (Te), lead (Pb), gallium (Ga), arsenic (As), or aluminum (Al) may be used.

In the display device 700 in FIG. 17, the insulating film 730 is provided over the planarization insulating film 770 and the conductive film 772. The insulating film 730 covers part of the conductive film 772. Note that the light-emitting element 782 has a top-emission structure. Thus, the conductive film 788 has a light-transmitting property and transmits light emitted from the EL layer 786. Although the top-emission structure is described as an example in this embodiment, the structure is not limited thereto. For example, a bottom-emission structure in which light is emitted to the conductive film 772 side or a dual-emission structure in which light is emitted to both the conductive film 772 side and the conductive film 788 side may also be employed.

The coloring film 736 is provided to overlap with the light-emitting element 782, and the light-blocking film 738 is provided in the lead wiring portion 711 and the source driver circuit portion 704 to overlap with the insulating film 730. The coloring film 736 and the light-blocking film 738 are covered with the insulating film 734. A space between the light-emitting element 782 and the insulating film 734 is filled with a sealing film 732. The structure of the display device 700 is not limited to the example in FIG. 17, in which the coloring film 736 is provided. For example, a structure without the coloring film 736 may also be employed in the case where the EL layer 786 is formed by separate coloring.

<3-4. Structure Example of Display Device Provided with Input/Output Device>

An input/output device may be provided in the display device 700 illustrated in FIG. 17 and FIG. 18. As an example of the input/output device, a touch panel or the like can be given.

Figure 19:
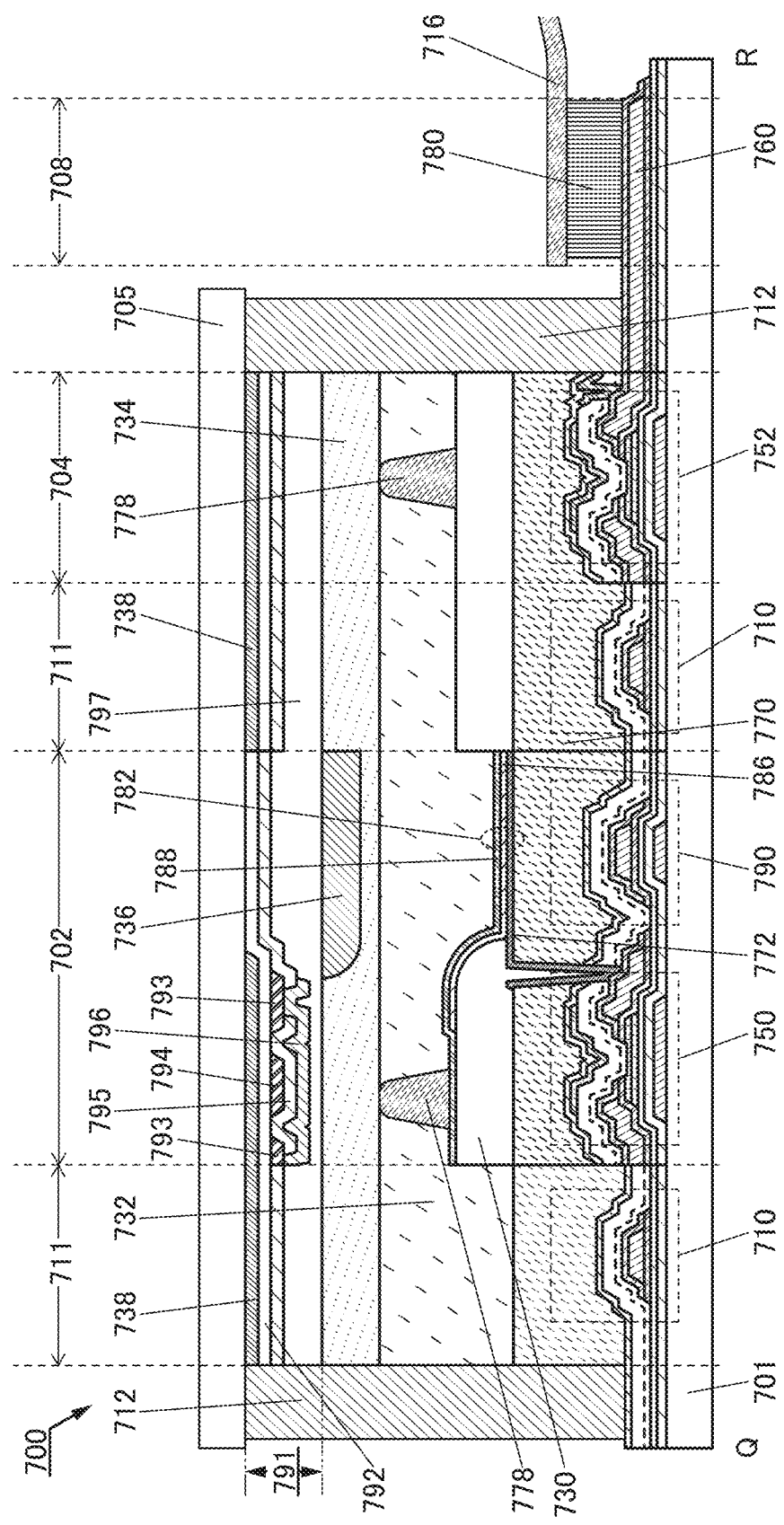
FIG. 19 is a cross-sectional view of one embodiment of a display device.
Figure 20:
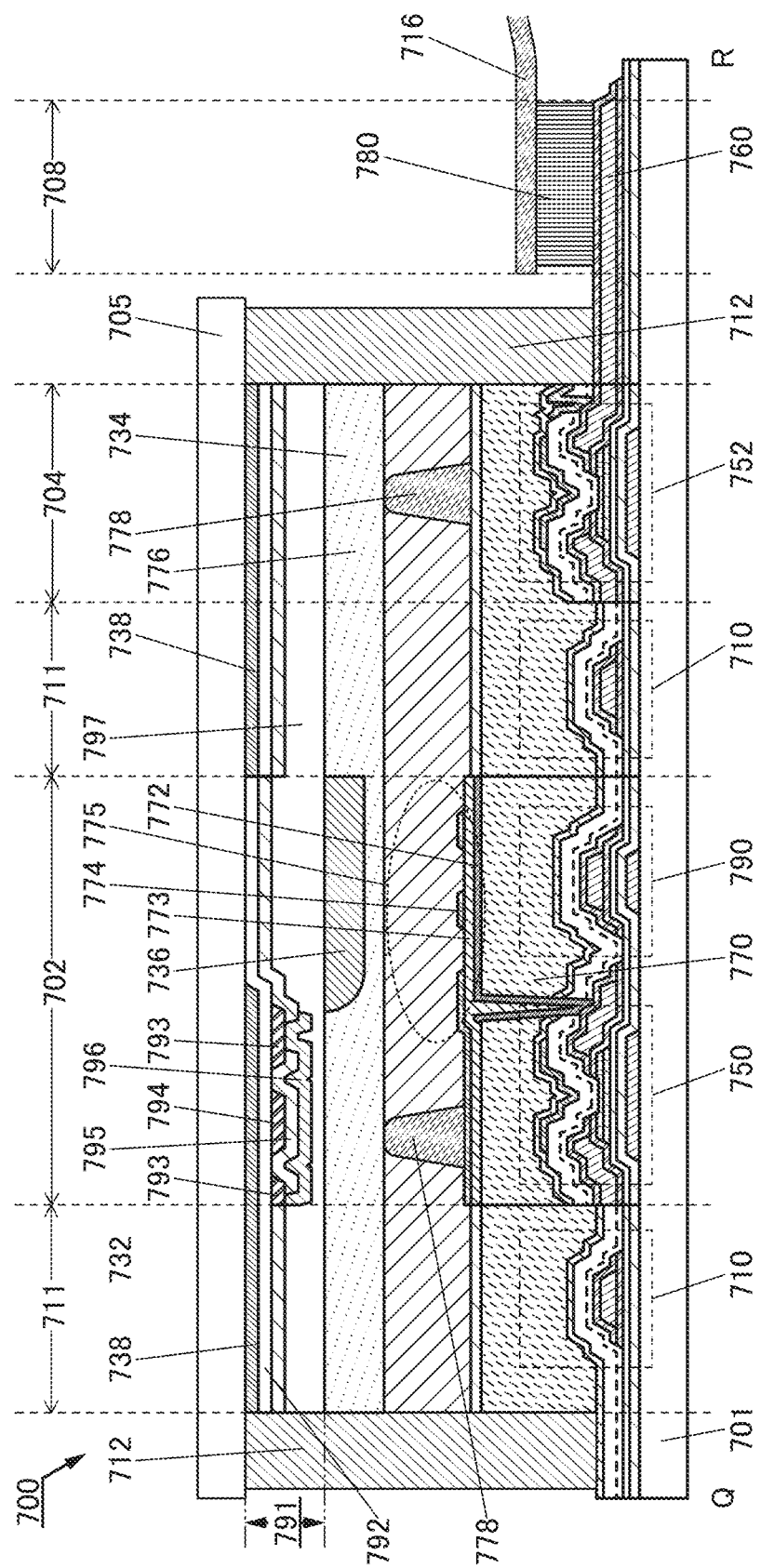
FIG. 20 is a cross-sectional view of one embodiment of a display device.

FIG. 19 illustrates a structure in which the display device 700 in FIG. 17 includes a touch panel 791, and FIG. 20 illustrates a structure in which the display device 700 in FIG. 18 includes the touch panel 791.

FIG. 19 is a cross-sectional view of the structure in which the touch panel 791 is provided in the display device 700 illustrated in FIG. 17, and FIG. 20 is a cross-sectional view of the structure in which the touch panel 791 is provided in the display device 700 illustrated in FIG. 18.

First, the touch panel 791 illustrated in FIG. 19 and FIG. 20 will be described below.

The touch panel 791 illustrated in FIG. 19 and FIG. 20 is what is called an in-cell touch panel provided between the substrate 705 and the coloring film 736. The touch panel 791 is formed on the substrate 705 side before the light-blocking film 738 and the coloring film 736 are formed.

Note that the touch panel 791 includes the light-blocking film 738, an insulating film 792, an electrode 793, an electrode 794, an insulating film 795, an electrode 796, and an insulating film 797. Changes in the mutual capacitance in the electrodes 793 and 794 can be detected when an object such as a finger or a stylus approaches, for example.

A portion in which the electrode 793 intersects with the electrode 794 is illustrated in the upper portion of the transistor 750 illustrated in FIG. 19 and FIG. 20. The electrode 796 is electrically connected to the two electrodes 793 between which the electrode 794 is sandwiched through openings provided in the insulating film 795. Note that a structure in which a region where the electrode 796 is provided is provided in the pixel portion 702 is illustrated in FIG. 19 and FIG. 20 as an example; however, one embodiment of the present invention is not limited thereto. For example, the region where the electrode 796 is provided may be provided in the source driver circuit portion 704.

The electrode 793 and the electrode 794 are provided in a region overlapping with the light-blocking film 738. As illustrated in FIG. 19, it is preferable that the electrode 793 not overlap with the light-emitting element 782. As illustrated in FIG. 20, it is preferable that the electrode 793 not overlap with the liquid crystal element 775. In other words, the electrode 793 has an opening in a region overlapping with the light-emitting element 782 and the liquid crystal element 775. That is, the electrode 793 has a mesh shape. With such a structure, the electrode 793 does not block light emitted from the light-emitting element 782, or alternatively the electrode 793 does not block light transmitted through the liquid crystal element 775. Thus, since luminance is hardly reduced even when the touch panel 791 is provided, a display device with high visibility and low power consumption can be achieved. Note that the electrode 794 can have a structure similar to that of the electrode 793.

Since the electrode 793 and the electrode 794 do not overlap with the light-emitting element 782, a metal material having low transmittance with respect to visible light can be used for the electrode 793 and the electrode 794. Furthermore, since the electrode 793 and the electrode 794 do not overlap with the liquid crystal element 775, a metal material having low transmittance with respect to visible light can be used for the electrode 793 and the electrode 794.

Thus, as compared with the case of using an oxide material whose transmittance with respect to visible light is high, resistance of the electrodes 793 and 794 can be reduced, whereby sensitivity of the sensor of the touch panel can be increased.

A conductive nanowire may be used for the electrodes 793, 794, and 796, for example. The nanowire may have a mean diameter of greater than or equal to 1 nm and less than or equal to 100 nm, preferably greater than or equal to 5 nm and less than or equal to 50 nm, further preferably greater than or equal to 5 nm and less than or equal to 25 nm. As the nanowire, a carbon nanotube or a metal nanowire such as an Ag nanowire, a Cu nanowire, or an Al nanowire may be used. For example, in the case where an Ag nanowire is used for any one of or all of the electrodes 793, 794, and 796, the transmittance with respect to visible light can be greater than or equal to 89% and sheet resistance can be greater than or equal to 40 Ω/sq. and less than or equal to 100 Ω/sq.

Although the structure of the in-cell touch panel is illustrated in FIG. 19 and FIG. 20, one embodiment of the present invention is not limited thereto. For example, a touch panel formed over the display device 700, what is called an on-cell touch panel, or a touch panel attached to the display device 700, what is called an out-cell touch panel may be used.

In this manner, the display device of one embodiment of the present invention can be combined with various types of touch panels.

At least part of this embodiment can be implemented in combination with any of the other embodiments and example described in this specification as appropriate.

Embodiment 4

In this embodiment, a semiconductor device that is one embodiment of the present invention will be described with reference to FIGS. 21A and 21B and FIG. 22.

<4-1. Structure Example of Semiconductor Device>

Figure 21A:
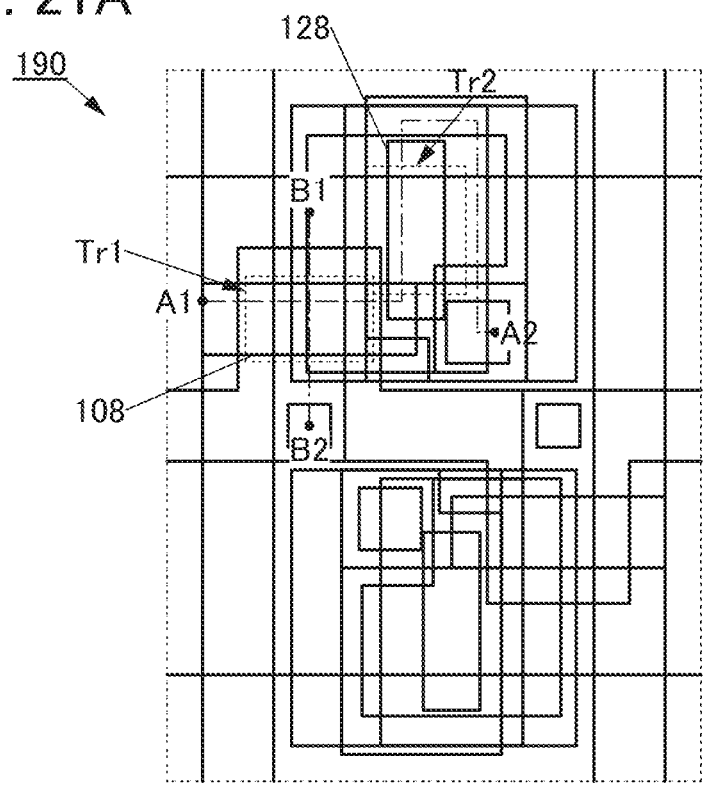
FIGS. 21A and 21B illustrate a top surface and a cross section of a semiconductor device.

FIG. 21A is a top view of a semiconductor device 190 of one embodiment of the present invention. FIG. 21B is a cross-sectional view taken along a dashed dotted line A1-A2 in FIG. 21A. Note that cross sections in a channel length (L) direction of a transistor Tr1 and in a channel length (L) direction of a transistor Tr2 are included in FIG. 21B. Note that FIG. 22 is a cross-sectional view taken along a dashed dotted line B1-B2 in FIG. 21A. A cross section in a channel width (W) direction of the transistor Tr1 is included in FIG. 22.

Note that some components (e.g., an insulating film serving as a gate insulating film) of the semiconductor device 190 and some reference numerals of components are not illustrated in FIG. 21A to avoid complexity. Note that some components and some reference numerals of components are not illustrated as in FIG. 21A in some cases in drawings of semiconductor devices described below.

Figure 21B:
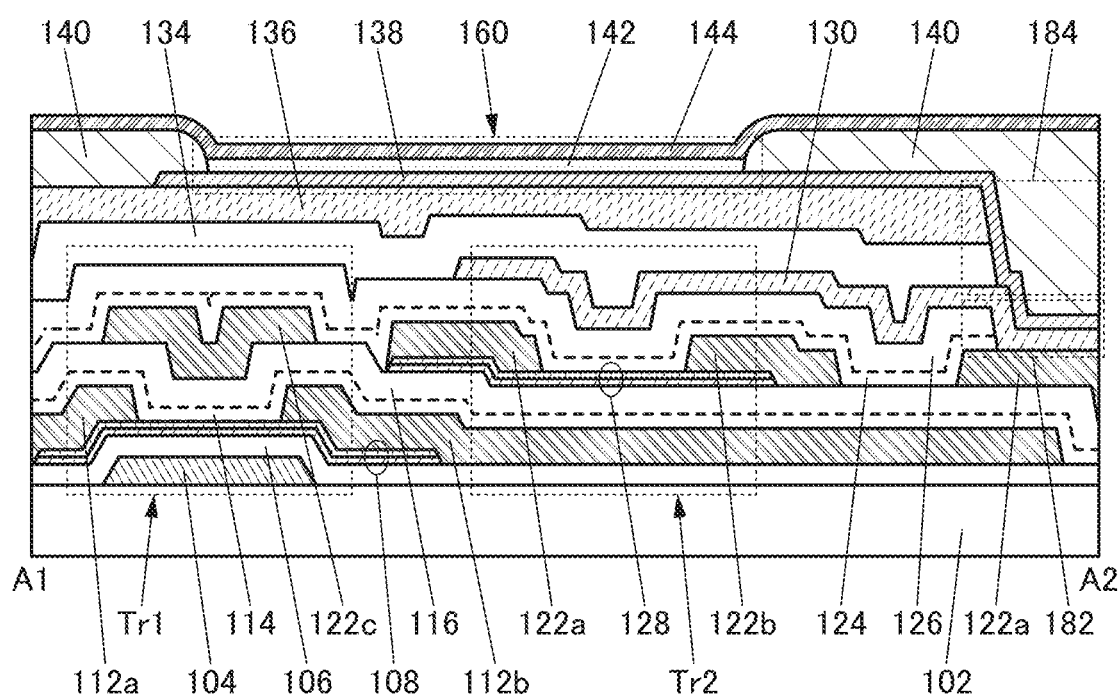

The semiconductor device 190 illustrated in FIGS. 21A and 21B includes the transistor Tr1 and the transistor Tr2 which overlaps at least partly with the transistor Tr1. Note that the transistor Tr1 and the transistor Tr2 are bottom-gate transistors.

When the transistor Tr1 overlaps at least partly with the transistor Tr2, for example, the transistor area can be reduced.

The transistor Tr1 includes a conductive film 104 over a substrate 102, an insulating film 106 over the substrate 102 and the conductive film 104, an oxide semiconductor film 108 over the insulating film 106, a conductive film 112a over the oxide semiconductor film 108, a conductive film 112b over the oxide semiconductor film 108, an insulating film 114 over the oxide semiconductor film 108, the conductive film 112a, and the conductive film 112b, an insulating film 116 over the insulating film 114, and a conductive film 122c over the insulating film 116.

The transistor Tr2 includes the conductive film 112b, the insulating film 114 over the conductive film 112b, the insulating film 116 over the insulating film 114, an oxide semiconductor film 128 over the insulating film 116, a conductive film 122a over the oxide semiconductor film 128, a conductive film 122b over the oxide semiconductor film 128, an insulating film 124 over the oxide semiconductor film 128, the conductive film 122a, and the conductive film 122b, an insulating film 126 over the insulating film 124, and a conductive film 130 over the insulating film 126.

Note that the conductive film 130 is connected to the conductive film 122a through an opening 182 provided in the insulating films 124 and 126.

As illustrated in FIGS. 21A and 21B, the oxide semiconductor film 108 and the oxide semiconductor film 128 partly overlap with each other. Note that it is favorable that, as illustrated in FIGS. 21A and 21B, a channel region formed in the oxide semiconductor film 108 of the transistor Tr1 does not overlap with a channel region formed in the oxide semiconductor film 128 of the transistor Tr2.

If the channel region of the transistor Tr1 overlaps with the channel region of the transistor Tr2, one of the transistors which is active might adversely affect the other. In order to avoid the adverse effect, a structure in which the distance between the transistor Tr1 and the transistor Tr2 is increased, a structure in which a conductive film is provided between the transistor Tr1 and the transistor Tr2, or the like can be used. However, the thickness of the semiconductor device is increased when the former structure is used. Thus, for example, when the semiconductor device 190 is formed over a flexible substrate or the like, a problem might arise in the bendability and the like. When the latter structure is used, there is a problem in that a step of forming the conductive film is needed and the thickness of the semiconductor device is increased.

In the semiconductor device 190 of one embodiment of the present invention, however, the transistor Tr1 overlaps with the transistor Tr2 and their channel regions do not overlap with each other. In addition, since parts of their oxide semiconductor films where the channel regions are formed overlap with each other, the transistor area can be favorably reduced.

In addition, the oxide semiconductor film 108 and the oxide semiconductor film 128 each include In, M (M is Al, Ga, or Y), and Zn. Each of the oxide semiconductor film 108 and the oxide semiconductor film 128 preferably includes a region where the atomic proportion of In is higher than the atomic proportion of M, for example. Note that the semiconductor device of one embodiment of the present invention is not limited thereto: each of them may include a region where the atomic proportion of In is lower than the atomic proportion of M or may include a region where the atomic proportion of In is equal to the atomic proportion of M.

It is preferable that the compositions of the oxide semiconductor film 108 and the oxide semiconductor film 128 be the same or substantially the same. When the compositions of the oxide semiconductor film 108 and the oxide semiconductor film 128 are the same, the manufacturing cost can be reduced. Note that the semiconductor device of one embodiment of the present invention is not limited thereto: the compositions of the oxide semiconductor film 108 and the oxide semiconductor film 128 may be different from each other.

The semiconductor device 190 shown in FIGS. 21A and 21B can be favorably used for a pixel circuit of a display device. The layout shown in FIGS. 21A and 21B can increase the pixel density of the display device. For example, even when the pixel density of a display device exceeds 1000 ppi (pixel per inch) or 2000 ppi, the aperture ratio of pixels can be increased owing to the structure shown in FIGS. 21A and 21B. Note that ppi is a unit for describing the number of pixels per inch.

When the semiconductor device 190 shown in FIGS. 21A and 21B is used for a pixel of a display device, the channel length (L) and the channel width (W) of a transistor, the line widths of a wiring and an electrode connected to the transistor, and the like can be relatively large. The line width and the like can be larger when the transistor Tr1 and the transistor Tr2 overlap with each other at least partly as shown in FIGS. 21A and 21B than those when the transistor Tr1 and the transistor Tr2 are provided on the same plane, for example; thus, variations in processing size can be reduced.

In addition, one or both of a conductive film and an insulating film can be shared by the transistor Tr1 and the transistor Tr2; thus, the number of masks or steps can be reduced.

In the transistor Tr1, for example, the conductive film 104 serves as the first gate electrode, the conductive film 112a serves as the source electrode, the conductive film 112b serves as the drain electrode, and the conductive film 122c serves as the second gate electrode. In addition, in the transistor Tr1, the insulating film 106 serves as a first gate insulating film and the insulating films 114 and 116 serve as second gate insulating films. In the transistor Tr2, the conductive film 112b serves as the first gate electrode, the conductive film 122a serves as the source electrode, the conductive film 122b serves as the drain electrode, and the conductive film 130 serves as the second gate electrode. In addition, in the transistor Tr2, the insulating films 114 and 116 serve as first gate insulating films and the insulating films 124 and 126 serve as second gate insulating films.

Note that in this specification and the like, the insulating film 106 may be referred to as a first insulating film, the insulating films 114 and 116 may be collectively referred to as a second insulating film, and the insulating films 124 and 126 may be collectively referred to as a third insulating film.

An insulating film 134 is provided over the conductive film 130. An insulating film 136 is provided over the insulating film 134. An opening 184 is provided in the insulating films 134 and 136 so as to reach the conductive film 130. In addition, a conductive film 138 is provided over the insulating film 136. Note that the conductive film 138 is connected to the conductive film 130 in the opening 184.

In addition, an insulating film 140, an EL layer 142, and a conductive film 144 are provided over the conductive film 138. The insulating film 140 covers part of a side end portion of the conductive film 138 and prevents a short circuit of the conductive films 138 between adjacent pixels. The EL layer 142 emits light. The light-emitting element 160 is composed of the conductive film 138, the EL layer 142, and the conductive film 144. The conductive film 138 serves as one electrode of the light-emitting element 160. The conductive film 144 serves as the other electrode of the light-emitting element 160.

As described above, in the semiconductor device of one embodiment of the present invention, a plurality of transistors are stacked to be reduced in the transistor area. In addition, since one or both of an insulating film and a conductive film are shared by the plurality of transistors, the number of masks or steps can be reduced.

As shown in FIGS. 21A and 21B, each of the transistor Tr1 and the transistor Tr2 includes two gate electrodes.

Here, the effect of two gate electrodes will be described with reference to FIGS. 21A and 21B and FIG. 22.

Figure 22:
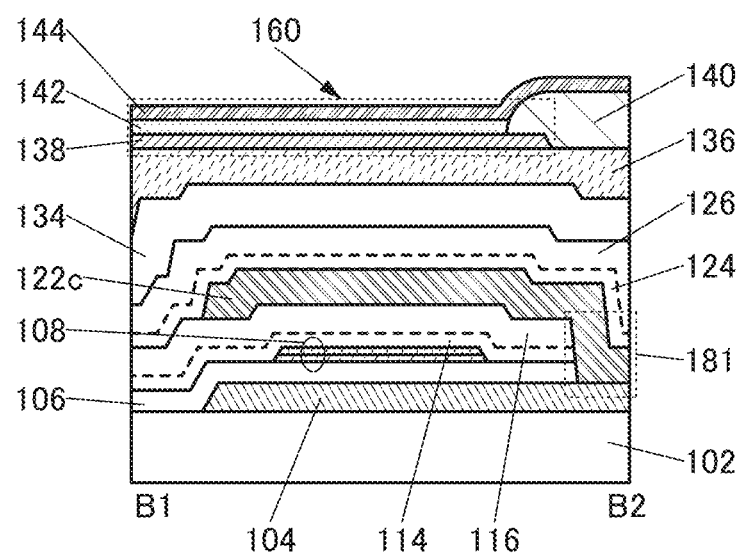
FIG. 22 illustrates a cross section of a semiconductor device.

As shown in FIG. 22, the conductive film 122c serving as the second gate electrode is electrically connected to the conductive film 104 serving as the first gate electrode in an opening 181. Accordingly, the conductive film 104 and the conductive film 122c are supplied with the same potential. In addition, as shown in FIG. 22, the oxide semiconductor film 108 faces the conductive film 104 and the conductive film 122c and is sandwiched between the conductive films serving as the two gate electrodes. The length in the channel width direction of each of the conductive film 104 and the conductive film 122c is greater than the length in the channel width direction of the oxide semiconductor film 108. The entire oxide semiconductor film 108 overlaps with the conductive film 104 and the conductive film 122c with the insulating films 106, 114, and 116 provided therebetween.

In other words, the conductive film 104 and the conductive film 122c are connected in the opening 181 which is provided in the insulating films 106, 114, and 116 and each include a region located outward from the side end portion of the oxide semiconductor film 108. With such a structure, the oxide semiconductor film 108 included in the transistor Tr1 can be electrically surrounded by electric fields of the conductive film 104 and the conductive film 122c. That is, the transistor Tr1 includes a surrounded-channel (S-channel) structure.

Although the structure in which the first gate electrode is electrically connected to the second gate electrode is described above, one embodiment of the present invention is not limited thereto. For example, as in the transistor Tr2 shown in FIG. 21B, the conductive film 130 serving as the second gate electrode may be electrically connected to the conductive film 122a serving as the source electrode or the drain electrode of the transistor Tr2.

<4-2. Components of Semiconductor Device>

Next, components of the semiconductor device of this embodiment will be described in detail. Note that components that are similar to the components in Embodiment 1 are denoted by the same reference numerals, and detailed description thereof is omitted.

[Conductive Film]

The conductive film 122a, the conductive film 122b, the conductive film 122c, the conductive film 130, the conductive film 138, and the conductive film 144 can be formed using a material similar to that for the conductive film 104, the conductive film 112a, the conductive film 112b, the conductive film 120a, and the conductive film 120b.

The conductive film 122a, the conductive film 122b, the conductive film 122c, the conductive film 130, the conductive film 138, and the conductive film 144 can each be formed using an oxide conductor (OC) such as an oxide including indium and tin, an oxide including tungsten and indium, an oxide including tungsten, indium, and zinc, an oxide including titanium and indium, an oxide including titanium, indium, and tin, an oxide including indium and zinc, an oxide including silicon, indium, and tin, an oxide including indium, gallium, and zinc.

The above-listed oxide conductors (OC) are particularly favorable as the conductive film 130.

[Insulating Film]

The insulating film 124, the insulating film 126, and the insulating film 134 can be formed using a material similar to that for the insulating film 106, the insulating film 114, and the insulating film 116.

Note that an insulating film that is in contact with one or both of the oxide semiconductor film 108 and the oxide semiconductor film 128 is preferably an oxide insulating film and preferably includes a region containing oxygen in excess of that in the stoichiometric composition (the oxygen-excess region). In other words, the oxide insulating film including the oxygen-excess region is an insulating film capable of releasing oxygen.

The oxygen-excess region of the oxide insulating film can be formed by any of the following methods, for example: an insulating film is formed in an oxygen atmosphere; an insulating film is formed, and then is subjected to heat treatment in an oxygen atmosphere; or an insulating film is formed, and then oxygen is added to the insulating film. Plasma treatment is preferable for adding oxygen into the formed insulating film.

The insulating film serving as the gate insulating film of each of the transistor Tr1 and the transistor Tr2 may be formed using silicon nitride. When silicon nitride is used for the insulating film serving as the gate insulating film, the following effects are obtained. Silicon nitride has a higher dielectric constant than silicon oxide and needs a larger thickness to obtain capacitance equivalent to that of silicon oxide. Thus, the thickness of the insulating film can be increased. This makes it possible to prevent a decrease in withstand voltage of the transistor Tr1 and the transistor Tr2 and to increase the withstand voltage, thereby preventing electrostatic discharge of the transistor Tr1 and the transistor Tr2.

The insulating films 114, 116, 124, and 126 have a function of supplying oxygen to the oxide semiconductor film 108 and/or the oxide semiconductor film 128. That is, the insulating films 114, 116, 124, and 126 contain oxygen. The insulating films 114 and 124 are insulating films which allow passage of oxygen. Note that the insulating film 114 also functions as a film for relieving damage to the oxide semiconductor film 108 at the time of forming the insulating film 116 in a later step. The insulating film 124 also functions as a film for relieving damage to the oxide semiconductor film 128 at the time of forming the insulating film 126 in a later step.

A silicon oxide film, a silicon oxynitride film, or the like with a thickness greater than or equal to 5 nm and less than or equal to 150 nm, preferably greater than or equal to 5 nm and less than or equal to 50 nm can be used as the insulating films 114 and 124.

In addition, it is preferable that the number of defects in the insulating films 114 and 124 be small, and typically, the spin density of a signal that appears at g=2.001 due to a dangling bond of silicon be lower than or equal to $3\times10^{17}$ spins/cm$^3$ when measured by ESR measurement. This is because if the density of defects in each of the insulating films 114 and 124 is high, oxygen is bonded to the defects and the amount of oxygen that passes through the insulating films 114 and 124 is decreased.

The insulating films 114 and 124 can each be formed using an oxide insulating film having a low density of states due to nitrogen oxide. Note that the density of states due to nitrogen oxide can be formed between the energy of the valence band maximum ($E_{v\_os}$) and the energy of the conduction band minimum ($E_{c\_os}$) of the oxide semiconductor film. A silicon oxynitride film that releases less nitrogen oxide, an aluminum oxynitride film that releases less nitrogen oxide, and the like can be used as the above oxide insulating film.

Note that a silicon oxynitride film that releases less nitrogen oxide is a film of which the release amount of ammonia is larger than the release amount of nitrogen oxide in thermal desorption spectroscopy (TDS); the release amount of ammonia is typically greater than or equal to $1\times10^{18}$ cm$^{-3}$ and less than or equal to $5\times10^{19}$ cm$^{-3}$. Note that the release amount of ammonia is the total amount of ammonia released by heat treatment at a temperature in the range of 50° C. to 650° C. or the range of 50° C. to 550° C. in TDS. The release amount of ammonia is the total release amount of ammonia converted into ammonia molecules in TDS.

The insulating film 134 serves as a protective insulating film of each of the transistor Tr1 and the transistor Tr2.

The insulating film 134 contains one or both of hydrogen and nitrogen. Alternatively, the insulating film 134 contains nitrogen and silicon. The insulating film 134 has a function of blocking oxygen, hydrogen, water, an alkali metal, an alkaline earth metal, or the like. It is possible to prevent outward diffusion of oxygen from the oxide semiconductor film 108 and the oxide semiconductor film 128, outward diffusion of oxygen included in the insulating films 114, 116, 124, and 126, and entry of hydrogen, water, or the like into the oxide semiconductor films 108 and 128 from the outside by providing the insulating film 134.

The insulating film 134 can be formed using a nitride insulating film, for example. The nitride insulating film is formed using silicon nitride, silicon nitride oxide, aluminum nitride, aluminum nitride oxide, or the like.

The insulating film 136 and the insulating film 140 each has a function of covering unevenness and the like caused by the transistor or the like. Each of the insulating films 136 and 140 has an insulating property and is formed using an inorganic or organic material. Examples of the inorganic material include a silicon oxide film, a silicon oxynitride film, a silicon nitride oxide film, a silicon nitride film, an aluminum oxide film, and an aluminum nitride film. Examples of the organic material include photosensitive resin materials such as an acrylic resin and a polyimide resin.

[Oxide Semiconductor Film]

The oxide semiconductor film 128 can be formed using a material similar to that of the oxide semiconductor film 108.

[EL Layer]

The EL layer 142 has a function of emitting light and includes at least a light-emitting layer. Other than the light-emitting layer, the EL layer 142 includes functional layers such as a hole-injection layer, a hole-transport layer, an electron-transport layer, and an electron-injection layer. A low molecular compound or a high molecular compound can be used for the EL layer 142.

At least part of this embodiment can be implemented in combination with any of the other embodiments and example described in this specification as appropriate.

Embodiment 5

In this embodiment, an example of a display panel which can be used for a display portion or the like in a display device including the semiconductor device of one embodiment of the present invention will be described with reference to FIG. 23 and FIG. 24. The display panel described below as an example includes both a reflective liquid crystal element and a light-emitting element and can display an image in both the transmissive mode and the reflective mode.

<5-1. Structure Example of Display Panel>

Figure 23:
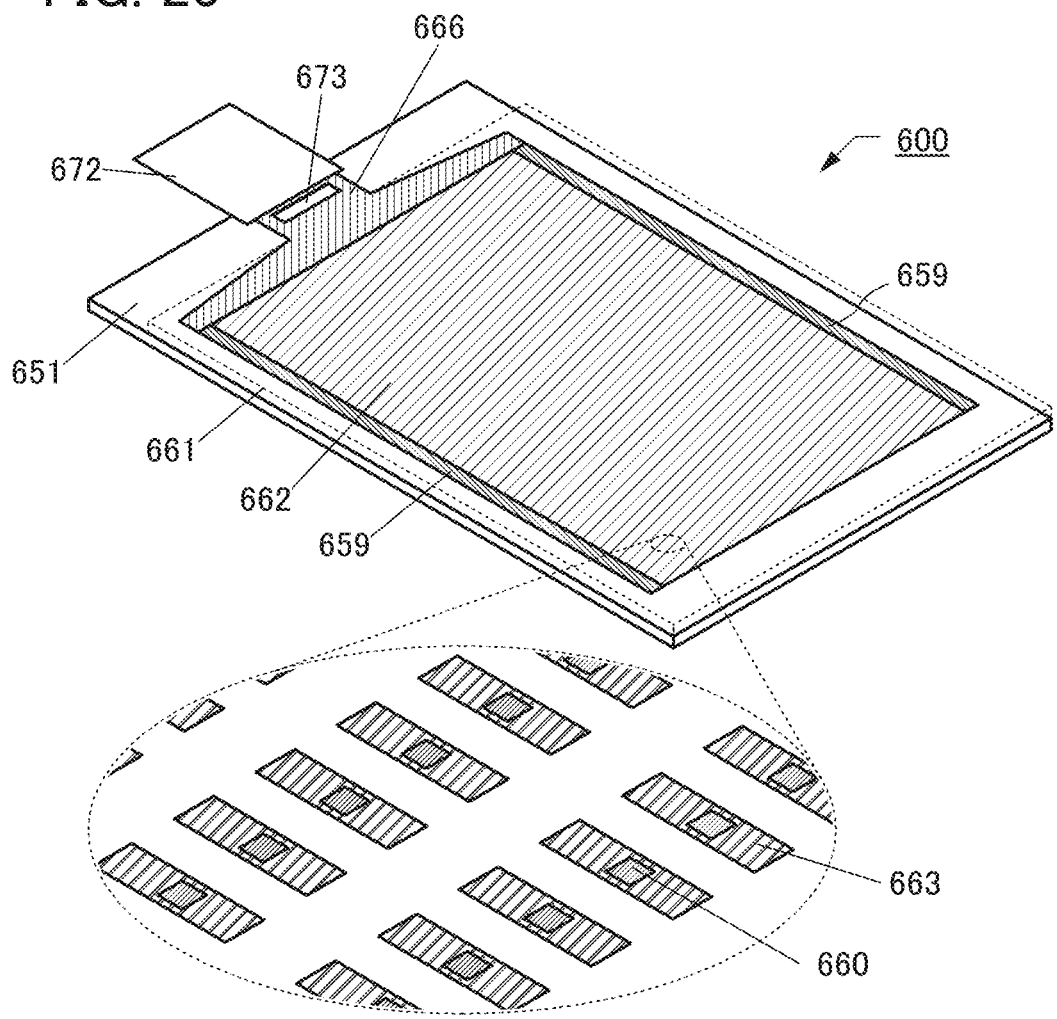
FIG. 23 illustrates a structure example of a display panel.

FIG. 23 is a schematic perspective view illustrating a display panel 600 of one embodiment of the present invention. In the display panel 600, a substrate 651 and a substrate 661 are attached to each other. In FIG. 23, the substrate 661 is denoted by a broken line.

The display panel 600 includes a display portion 662, a circuit 659, a wiring 666, and the like. The substrate 651 is provided with the circuit 659, the wiring 666, a conductive film 663 which serves as a pixel electrode, and the like. In FIG. 23, an IC 673 and an FPC 672 are mounted on the substrate 651. Thus, the structure illustrated in FIG. 23 can be referred to as a display module including the display panel 600, the FPC 672, and the IC 673.

As the circuit 659, for example, a circuit functioning as a scan line driver circuit can be used.

The wiring 666 has a function of supplying a signal or electric power to the display portion or the circuit 659. The signal or electric power is input to the wiring 666 from the outside through the FPC 672 or from the IC 673.

FIG. 23 shows an example in which the IC 673 is provided on the substrate 651 by a chip on glass (COG) method or the like. As the IC 673, an IC functioning as a scan line driver circuit, a signal line driver circuit, or the like can be used. Note that it is possible that the IC 673 is not provided when, for example, the display panel 600 includes circuits serving as a scan line driver circuit and a signal line driver circuit and when the circuits serving as a scan line driver circuit and a signal line driver circuit are provided outside and a signal for driving the display panel 600 is input through the FPC 672. Alternatively, the IC 673 may be mounted on the FPC 672 by a chip on film (COF) method or the like.

FIG. 23 also shows an enlarged view of part of the display portion 662. The conductive films 663 included in a plurality of display elements are arranged in a matrix in the display portion 662. The conductive film 663 has a function of reflecting visible light and serves as a reflective electrode of a liquid crystal element 640 described later.

As illustrated in FIG. 23, the conductive film 663 has an opening. A light-emitting element 660 is positioned closer to the substrate 651 than the conductive film 663 is. Light is emitted from the light-emitting element 660 to the substrate 661 side through the opening in the conductive film 663.

<5-2. Cross-Sectional Structure Example>

Figure 24:
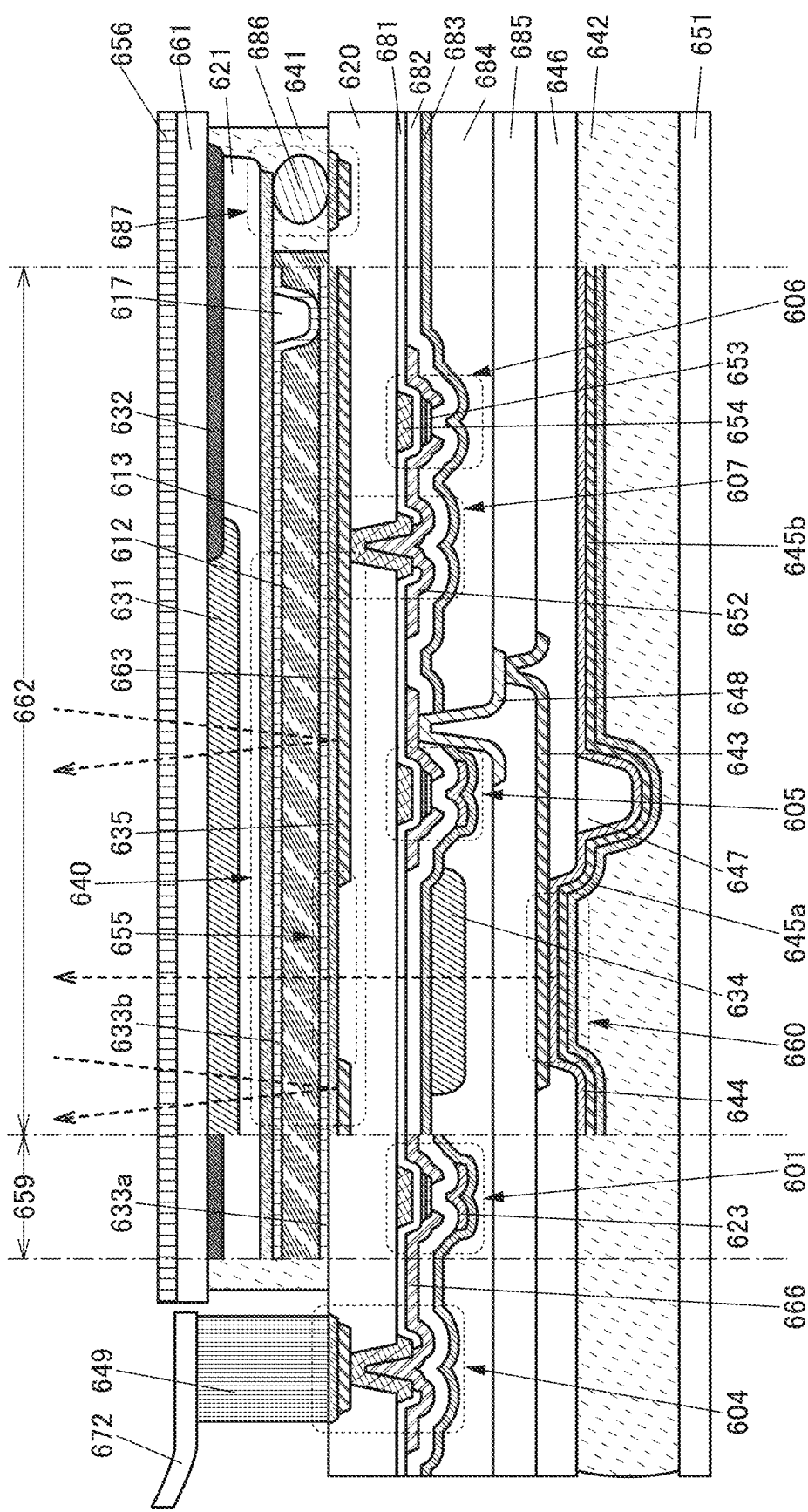
FIG. 24 illustrates a structure example of a display panel.

FIG. 24 shows an example of cross sections of part of a region including the FPC 672, part of a region including the circuit 659, and part of a region including the display portion 662 of the display panel illustrated in FIG. 23.

The display panel includes an insulating film 620 between the substrates 651 and 661. The display panel also includes the light-emitting element 660, a transistor 601, a transistor 605, a transistor 606, a coloring layer 634, and the like between the substrate 651 and the insulating film 620. Furthermore, the display panel includes the liquid crystal element 640, a coloring layer 631, and the like between the insulating film 620 and the substrate 661. The substrate 661 and the insulating film 620 are bonded with an adhesive layer 641. The substrate 651 and the insulating film 620 are bonded with an adhesive layer 642.

The transistor 606 is electrically connected to the liquid crystal element 640 and the transistor 605 is electrically connected to the light-emitting element 660. Since the transistors 605 and 606 are formed on a surface of the insulating film 620 which is on the substrate 651 side, the transistors 605 and 606 can be formed through the same process.

The substrate 661 is provided with the coloring layer 631, a light-blocking film 632, an insulating film 621, a conductive film 613 serving as a common electrode of the liquid crystal element 640, an alignment film 633b, an insulating film 617, and the like. The insulating film 617 serves as a spacer for holding a cell gap of the liquid crystal element 640.

Insulating layers such as an insulating film 681, an insulating film 682, an insulating film 683, an insulating film 684, and an insulating film 685 are provided on the substrate 651 side of the insulating film 620. Part of the insulating film 681 functions as a gate insulating layer of each transistor. The insulating films 682, 683, and 684 are provided to cover each transistor. The insulating film 685 is provided to cover the insulating film 684. The insulating films 684 and 685 each function as a planarization layer. Note that an example where the three insulating layers, the insulating films 682, 683, and 684, are provided to cover the transistors and the like is described here; however, one embodiment of the present invention is not limited to this example, and four or more insulating layers, a single insulating layer, or two insulating layers may be provided. The insulating film 684 functioning as a planarization layer is not necessarily provided when not needed.

The transistors 601, 605, and 606 each include a conductive film 654 part of which functions as a gate, a conductive film 652 part of which functions as a source or a drain, and a semiconductor film 653. Here, a plurality of layers obtained by processing the same conductive film are shown with the same hatching pattern.

The liquid crystal element 640 is a reflective liquid crystal element. The liquid crystal element 640 has a stacked structure of a conductive film 635, a liquid crystal layer 612, and the conductive film 613. In addition, the conductive film 663 which reflects visible light is provided in contact with the surface of the conductive film 635 that faces the substrate 651. The conductive film 663 includes an opening 655. The conductive films 635 and 613 contain a material transmitting visible light. In addition, an alignment film 633a is provided between the liquid crystal layer 612 and the conductive film 635 and the alignment film 633b is provided between the liquid crystal layer 612 and the conductive film 613. A polarizing plate 656 is provided on an outer surface of the substrate 661.

In the liquid crystal element 640, the conductive film 663 has a function of reflecting visible light and the conductive film 613 has a function of transmitting visible light. Light entering from the substrate 661 side is polarized by the polarizing plate 656, passes through the conductive film 613 and the liquid crystal layer 612, and is reflected by the conductive film 663. Then, the light passes through the liquid crystal layer 612 and the conductive film 613 again and reaches the polarizing plate 656. In this case, alignment of the liquid crystal is controlled with a voltage that is applied between the conductive film 613 and the conductive film 663, and thus optical modulation of light can be controlled. That is, the intensity of light emitted through the polarizing plate 656 can be controlled. Light other than that in a particular wavelength region is absorbed by the coloring layer 631, and thus, emitted light is red light, for example.

The light-emitting element 660 is a bottom-emission light-emitting element. The light-emitting element 660 has a structure in which a conductive film 643, an EL layer 644, and a conductive film 645b are stacked in this order from the insulating film 620 side. In addition, a conductive film 645a is provided to cover the conductive film 645b. The conductive film 645b contains a material reflecting visible light, and the conductive films 643 and 645a contain a material transmitting visible light. Light is emitted from the light-emitting element 660 to the substrate 661 side through the coloring layer 634, the insulating film 620, the opening 655, the conductive film 613, and the like.

Here, as illustrated in FIG. 24, the conductive film 635 transmitting visible light is preferably provided for the opening 655. Accordingly, the liquid crystal layer 612 is aligned in a region overlapping with the opening 655 as well as in the other regions, in which case an alignment defect of the liquid crystal is prevented from being generated in the boundary portion of these regions and undesired light leakage can be suppressed.

As the polarizing plate 656 provided on an outer surface of the substrate 661, a linear polarizing plate or a circularly polarizing plate can be used. An example of a circularly polarizing plate is a stack including a linear polarizing plate and a quarter-wave retardation plate. Such a structure can reduce reflection of external light. The cell gap, alignment, drive voltage, and the like of the liquid crystal element used as the liquid crystal element 640 are controlled depending on the kind of the polarizing plate so that desirable contrast is achieved.

In addition, an insulating film 647 is provided in contact with the insulating film 646 covering an end portion of the conductive film 643. The insulating film 647 has a function as a spacer for preventing the insulating film 620 and the substrate 651 from getting closer more than necessary. In the case where the EL layer 644 or the conductive film 645a is formed using a blocking mask (metal mask), the insulating film 647 may have a function as a spacer for preventing the blocking mask from being in contact with a surface on which the EL layer 644 or the conductive film 645a is formed. Note that the insulating film 647 is not necessarily provided when not needed.

One of a source and a drain of the transistor 605 is electrically connected to the conductive film 643 of the light-emitting element 660 through a conductive film 648.

One of a source and a drain of the transistor 606 is electrically connected to the conductive film 663 through a connection portion 607. The conductive films 663 and 635 are in contact with and electrically connected to each other. Here, in the connection portion 607, the conductive layers provided on both surfaces of the insulating film 620 are connected to each other through an opening in the insulating film 620.

A connection portion 604 is provided in a region where the substrates 651 and 661 do not overlap with each other. The connection portion 604 is electrically connected to the FPC 672 through a connection layer 649. The connection portion 604 has a structure similar to that of the connection portion 607. On the top surface of the connection portion 604, a conductive layer obtained by processing the same conductive film as the conductive film 635 is exposed. Thus, the connection portion 604 and the FPC 672 can be electrically connected to each other through the connection layer 649.

A connection portion 687 is provided in part of a region where the adhesive layer 641 is provided. In the connection portion 687, the conductive layer obtained by processing the same conductive film as the conductive film 635 is electrically connected to part of the conductive film 613 with a connector 686. Accordingly, a signal or a potential input from the FPC 672 connected to the substrate 651 side can be supplied to the conductive film 613 formed on the substrate 661 side through the connection portion 687.

As the connector 686, a conductive particle can be used, for example. As the conductive particle, a particle of an organic resin, silica, or the like coated with a metal material can be used. It is preferable to use nickel or gold as the metal material because contact resistance can be reduced. It is also preferable to use a particle coated with layers of two or more kinds of metal materials, such as a particle coated with nickel and further with gold. As the connector 686, a material capable of elastic deformation or plastic deformation is preferably used. As illustrated in FIG. 24, the connector 686 which is the conductive particle has a shape that is vertically crushed in some cases. With the crushed shape, the contact area between the connector 686 and a conductive layer electrically connected to the connector 686 can be increased, thereby reducing contact resistance and suppressing the generation of problems such as disconnection.

The connector 686 is preferably provided so as to be covered with the adhesive layer 641. For example, the connector 686 is dispersed in the adhesive layer 641 before curing of the adhesive layer 641.

FIG. 24 illustrates an example of the circuit 659 in which the transistor 601 is provided.

The structure in which the semiconductor film 653 where a channel is formed is provided between two gates is used as an example of the transistors 601 and 605 in FIG. 24. One gate is formed using the conductive film 654 and the other gate is formed using a conductive film 623 overlapping with the semiconductor film 653 with the insulating film 682 provided therebetween. Such a structure enables control of threshold voltages of a transistor. In that case, the two gates may be connected to each other and supplied with the same signal to operate the transistor. Such a transistor can have higher field-effect mobility and thus have higher on-state current than other transistors. Consequently, a circuit capable of high-speed operation can be obtained. Furthermore, the area occupied by a circuit portion can be reduced. The use of the transistor having high on-state current can reduce signal delay in wirings and can reduce display unevenness even in a display panel in which the number of wirings is increased because of increase in size or resolution.

Note that the transistor included in the circuit 659 and the transistor included in the display portion 662 may have the same structure. A plurality of transistors included in the circuit 659 may have the same structure or different structures. A plurality of transistors included in the display portion 662 may have the same structure or different structures.

A material through which impurities such as water and hydrogen do not easily diffuse is preferably used for at least one of the insulating films 682 and 683 which cover the transistors. That is, the insulating film 682 or the insulating film 683 can function as a barrier film. Such a structure can effectively suppress diffusion of the impurities into the transistors from the outside, and a highly reliable display panel can be achieved.

The insulating film 621 is provided on the substrate 661 side to cover the coloring layer 631 and the light-blocking film 632. The insulating film 621 may have a function as a planarization layer. The insulating film 621 enables the conductive film 613 to have an almost flat surface, resulting in a uniform alignment state of the liquid crystal layer 612.

An example of the manufacturing method of the display panel 600 is described. For example, the conductive film 635, the conductive film 663, and the insulating film 620 are formed in order over a support substrate provided with a separation layer, and the transistor 605, the transistor 606, the light-emitting element 660, and the like are formed. Then, the substrate 651 and the support substrate are bonded with the adhesive layer 642. After that, separation is performed at the interface between the separation layer and each of the insulating film 620 and the conductive film 635, whereby the support substrate and the separation layer are removed. Separately, the coloring layer 631, the light-blocking film 632, the conductive film 613, and the like are formed over the substrate 661 in advance. Then, a liquid crystal is dropped onto the substrate 651 or 661 and the substrates 651 and 661 are bonded with the adhesive layer 641, whereby the display panel 600 can be manufactured.

A material for the separation layer can be selected such that separation at the interface with the insulating film 620 and the conductive film 635 occurs. In particular, it is preferable that a stacked layer of a layer including a high-melting-point metal material, such as tungsten, and a layer including an oxide of the metal material be used as the separation layer, and a stacked layer of a plurality of layers, such as a silicon nitride layer, a silicon oxynitride layer, and a silicon nitride oxide layer be used as the insulating film 620 over the separation layer. The use of the high-melting-point metal material for the separation layer can increase the formation temperature of a layer formed in a later step, which reduces impurity concentration and achieves a highly reliable display panel.

As the conductive film 635, an oxide or a nitride such as a metal oxide, a metal nitride, or an oxide semiconductor whose resistance is reduced is preferably used. In the case of using an oxide semiconductor, a material in which at least one of the concentrations of hydrogen, boron, phosphorus, nitrogen, and other impurities and the number of oxygen vacancies is made to be higher than those in a semiconductor layer of a transistor is used for the conductive film 635.

<5-3. Components>

The above components will be described below. Note that descriptions of structures having functions similar to those in the above embodiments are omitted.

[Adhesive Layer]

As the adhesive layer, a variety of curable adhesives such as a reactive curable adhesive, a thermosetting adhesive, an anaerobic adhesive, and a photocurable adhesive such as an ultraviolet curable adhesive can be used. Examples of these adhesives include an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin. In particular, a material with low moisture permeability, such as an epoxy resin, is preferred. Alternatively, a two-component-mixture-type resin may be used. Further alternatively, an adhesive sheet or the like may be used.

Furthermore, the resin may include a drying agent. For example, a substance that adsorbs moisture by chemical adsorption, such as an oxide of an alkaline earth metal (e.g., calcium oxide or barium oxide), can be used. Alternatively, a substance that adsorbs moisture by physical adsorption, such as zeolite or silica gel, may be used. The drying agent is preferably included because it can prevent impurities such as moisture from entering the element, thereby improving the reliability of the display panel.

In addition, it is preferable to mix a filler with a high refractive index or light-scattering member into the resin, in which case light extraction efficiency can be enhanced. For example, titanium oxide, barium oxide, zeolite, zirconium, or the like can be used.

[Connection Layer]

As the connection layer, an anisotropic conductive film (ACF), an anisotropic conductive paste (ACP), or the like can be used.

[Coloring Layer]

Examples of a material that can be used for the coloring layers include a metal material, a resin material, and a resin material containing a pigment or dye.

[Light-Blocking Layer]

Examples of a material that can be used for the light-blocking layer include carbon black, titanium black, a metal, a metal oxide, and a composite oxide containing a solid solution of a plurality of metal oxides. The light-blocking layer may be a film containing a resin material or a thin film of an inorganic material such as a metal. Stacked films containing the material of the coloring layer can also be used for the light-blocking layer. For example, a stacked-layer structure of a film containing a material of a coloring layer which transmits light of a certain color and a film containing a material of a coloring layer which transmits light of another color can be employed. It is preferable that the coloring layer and the light-blocking layer be formed using the same material because the same manufacturing apparatus can be used and the process can be simplified.

The above is the description of the components.

<5-4. Manufacturing Method Example>

A manufacturing method example of a display panel using a flexible substrate will be described.

Here, layers including a display element, a circuit, a wiring, an electrode, optical members such as a coloring layer and a light-blocking layer, an insulating layer, and the like, are collectively referred to as an element layer. The element layer includes, for example, a display element, and may additionally include a wiring electrically connected to the display element or an element such as a transistor used in a pixel or a circuit.

In addition, here, a flexible member which supports the element layer at a stage at which the display element is completed (the manufacturing process is finished) is referred to as a substrate. For example, a substrate includes an extremely thin film with a thickness greater than or equal to 10 nm and less than or equal to 300 μm and the like.

As a method for forming an element layer over a flexible substrate provided with an insulating surface, typically, there are two methods shown below. One of them is to directly form an element layer over the substrate. The other method is to form an element layer over a support substrate that is different from the substrate and then to separate the element layer from the support substrate to be transferred to the substrate. Although not described in detail here, in addition to the above two methods, there is a method in which an element layer is formed over a substrate which does not have flexibility and the substrate is thinned by polishing or the like to have flexibility.

In the case where a material of the substrate can withstand heating temperature in a process for forming the element layer, it is preferable that the element layer be formed directly over the substrate, in which case a manufacturing process can be simplified. At this time, the element layer is preferably formed in a state where the substrate is fixed to the support substrate, in which case transfer thereof in an apparatus and between apparatuses can be easy.

In the case of employing the method in which the element layer is formed over the support substrate and then transferred to the substrate, first, a separation layer and an insulating layer are stacked over the support substrate, and then the element layer is formed over the insulating layer. Next, the element layer is separated from the support substrate and then transferred to the substrate. At this time, selected is a material with which separation at an interface between the support substrate and the separation layer, at an interface between the separation layer and the insulating layer, or in the separation layer occurs. With the method, it is preferable that a material having high heat resistance be used for the support substrate or the separation layer, in which case the upper limit of the temperature applied when the element layer is formed can be increased, and an element layer including a more highly reliable element can be formed.

It is preferable that a stack of a layer containing a high-melting-point metal material, such as tungsten, and a layer containing an oxide of the metal material be used as the separation layer, and a stack of a plurality of layers, such as a silicon oxide layer, a silicon nitride layer, a silicon oxynitride layer, and a silicon nitride oxide layer be used as the insulating layer over the separation layer, for example.

As the method for separating the support substrate from the element layer, applying mechanical force, etching the separation layer, and making a liquid permeate the separation interface are given as examples. Alternatively, separation may be performed by heating or cooling two layers of the separation interface by utilizing a difference in thermal expansion coefficient.

The separation layer is not necessarily provided in the case where the separation can be performed at an interface between the support substrate and the insulating layer.

Glass and an organic resin such as polyimide can be used as the support substrate and the insulating layer, respectively, for example. In that case, a separation trigger may be formed by, for example, locally heating part of the organic resin with laser light or the like, or by physically cutting part of or making a hole through the organic resin with a sharp tool, and separation may be performed at an interface between the glass and the organic resin. As the above-described organic resin, a photosensitive material is favorably used because an opening or the like can be easily formed. The above-described laser light preferably has a wavelength region, for example, from visible light to ultraviolet light. For example, light having a wavelength of greater than or equal to 200 nm and less than or equal to 400 nm, preferably greater than or equal to 250 nm and less than or equal to 350 nm can be used. In particular, an excimer laser having a wavelength of 308 nm is preferably used because the productivity is increased. Alternatively, a solid-state UV laser (also referred to as a semiconductor UV laser), such as a UV laser having a wavelength of 355 nm which is the third harmonic of an Nd:YAG laser, may be used.

Alternatively, a heat generation layer may be provided between the support substrate and the insulating layer formed of an organic resin, and separation may be performed at an interface between the heat generation layer and the insulating layer by heating the heat generation layer. For the heat generation layer, any of a variety of materials such as a material which generates heat by feeding current, a material which generates heat by absorbing light, and a material which generates heat by applying a magnetic field can be used. For example, for the heat generation layer, a material selected from a semiconductor, a metal, and an insulator can be used.

In the above-described methods, the insulating layer formed of an organic resin can be used as a substrate after the separation.

The above is the description of a manufacturing method of a flexible display panel.

At least part of this embodiment can be implemented in combination with any of the other embodiments and example described in this specification as appropriate.

Embodiment 6

In this embodiment, a display device including a semiconductor device of one embodiment of the present invention will be described with reference to FIG. 25A to 25C.

<6. Circuit Configuration of Display Device>

A display device illustrated in FIG. 25A includes a region including pixels of display elements (hereinafter referred to as a pixel portion 502), a circuit portion that is provided outside the pixel portion 502 and includes a circuit for driving the pixels (hereinafter, the circuit portion is referred to as a driver circuit portion 504), circuits having a function of protecting elements (hereinafter, the circuits are referred to as protection circuits 506), and a terminal portion 507. Note that the protection circuits 506 are not necessarily provided.

Part or the whole of the driver circuit portion 504 is preferably formed over a substrate over which the pixel portion 502 is formed. Thus, the number of components and the number of terminals can be reduced. When part or the whole of the driver circuit portion 504 is not formed over the substrate over which the pixel portion 502 is formed, the part or the whole of the driver circuit portion 504 can be mounted by COG or tape automated bonding (TAB).

The pixel portion 502 includes a plurality of circuits for driving display elements arranged in X (X is a natural number of 2 or more) rows and Y (Y is a natural number of 2 or more) columns (hereinafter, the circuits are referred to as pixel circuits 501). The driver circuit portion 504 includes driver circuits such as a circuit for supplying a signal (scan signal) to select a pixel (hereinafter, the circuit is referred to as a gate driver 504a) and a circuit for supplying a signal (data signal) to drive a display element in a pixel (hereinafter, the circuit is referred to as a source driver 504b).

The gate driver 504a includes a shift register or the like. The gate driver 504a receives a signal for driving the shift register through the terminal portion 507 and outputs a signal. For example, the gate driver 504a receives a start pulse signal, a clock signal, or the like and outputs a pulse signal. The gate driver 504a has a function of controlling the potentials of wirings supplied with scan signals (hereinafter referred to as scan lines GL_1 to GL_X). Note that a plurality of gate drivers 504a may be provided to control the scan lines GL_1 to GL_X separately. Alternatively, the gate driver 504a has a function of supplying an initialization signal. Without being limited thereto, another signal can be supplied from the gate driver 504a.

The source driver 504b includes a shift register or the like. The source driver 504b receives a signal (image signal) from which a data signal is generated, as well as a signal for driving the shift register, through the terminal portion 507. The source driver 504b has a function of generating a data signal to be written to the pixel circuit 501 from the image signal. In addition, the source driver 504b has a function of controlling output of a data signal in response to a pulse signal produced by input of a start pulse signal, a clock signal, or the like. Furthermore, the source driver 504b has a function of controlling the potentials of wirings supplied with data signals (hereinafter referred to as data lines DL_1 to DL_Y). Alternatively, the source driver 504b has a function of supplying an initialization signal. Without being limited thereto, another signal can be supplied from the source driver 504b.

The source driver 504b includes a plurality of analog switches, for example. The source driver 504b can output, as data signals, time-divided image signals obtained by sequentially turning on the plurality of analog switches. The source driver 504b may include a shift register or the like.

A pulse signal and a data signal are input to each of the plurality of pixel circuits 501 through one of the plurality of scan lines GL supplied with scan signals and one of the plurality of data lines DL supplied with data signals, respectively. Writing and holding of the data signal in each of the plurality of pixel circuits 501 are controlled by the gate driver 504a. For example, to the pixel circuit 501 in the m-th row and the n-th column (m is a natural number of X or less, and n is a natural number of Y or less), a pulse signal is input from the gate driver 504a through the scan line GL_m, and a data signal is input from the source driver 504b through the data line DL_n in accordance with the potential of the scan line GL_m.

Figure 25A:
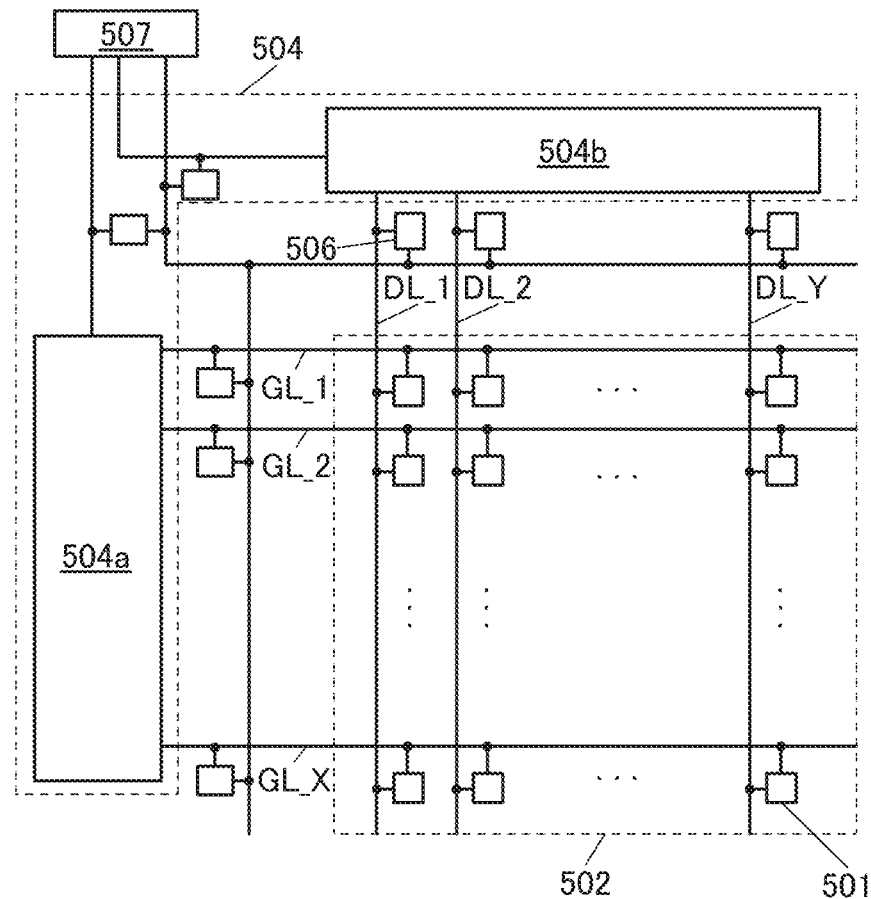
FIGS. 25A to 25C are a block diagram and circuit diagrams each illustrating a display device.

The protection circuit 506 in FIG. 25A is connected to, for example, the scan line GL between the gate driver 504a and the pixel circuit 501. Alternatively, the protection circuit 506 is connected to the data line DL between the source driver 504b and the pixel circuit 501. Alternatively, the protection circuit 506 can be connected to a wiring between the gate driver 504a and the terminal portion 507. Alternatively, the protection circuit 506 can be connected to a wiring between the source driver 504b and the terminal portion 507. Note that the terminal portion 507 refers to a portion having terminals for inputting power, control signals, and image signals from external circuits to the display device.

The protection circuit 506 electrically connects a wiring connected to the protection circuit to another wiring when a potential out of a certain range is supplied to the wiring connected to the protection circuit.

As illustrated in FIG. 25A, the protection circuits 506 provided for the pixel portion 502 and the driver circuit portion 504 can improve the resistance of the display device to overcurrent generated by electrostatic discharge (ESD) or the like. Note that the configuration of the protection circuits 506 is not limited thereto; for example, the protection circuit 506 can be connected to the gate driver 504a or the source driver 504b. Alternatively, the protection circuit 506 can be connected to the terminal portion 507.

One embodiment of the present invention is not limited to the example in FIG. 25A, in which the driver circuit portion 504 includes the gate driver 504a and the source driver 504b. For example, only the gate driver 504a may be formed, and a separately prepared substrate over which a source driver circuit is formed (e.g., a driver circuit board formed using a single crystal semiconductor film or a polycrystalline semiconductor film) may be mounted.

Figure 25B:
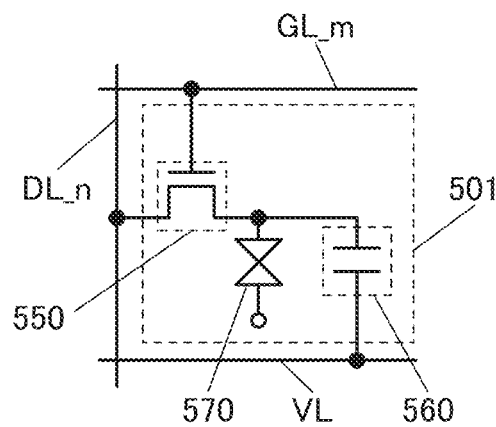

Each of the plurality of pixel circuits 501 in FIG. 25A can have the configuration illustrated in FIG. 25B, for example.

The pixel circuit 501 in FIG. 25B includes a liquid crystal element 570, a transistor 550, and a capacitor 560. As the transistor 550, the transistor described in the above embodiment can be used.

The potential of one of a pair of electrodes of the liquid crystal element 570 is set as appropriate in accordance with the specifications of the pixel circuit 501. The alignment state of the liquid crystal element 570 depends on data written thereto. A common potential may be supplied to the one of the pair of electrodes of the liquid crystal element 570 included in each of the plurality of pixel circuits 501. The potential supplied to the one of the pair of electrodes of the liquid crystal element 570 in the pixel circuit 501 may differ between rows.

Examples of a method for driving the display device including the liquid crystal element 570 include a TN mode, an STN mode, a VA mode, an axially symmetric aligned micro-cell (ASM) mode, an optically compensated birefringence (OCB) mode, a ferroelectric liquid crystal (FLC) mode, an anti-ferroelectric liquid crystal (AFLC) mode, an MVA mode, a patterned vertical alignment (PVA) mode, an IPS mode, an FFS mode, and a transverse bend alignment (TBA) mode. Other examples of the method for driving the display device include an electrically controlled birefringence (ECB) mode, a polymer-dispersed liquid crystal (PDLC) mode, a polymer network liquid crystal (PNLC) mode, and a guest-host mode. Without being limited thereto, various liquid crystal elements and driving methods can be used.

In the pixel circuit 501 in the m-th row and the n-th column, one of a source electrode and a drain electrode of the transistor 550 is electrically connected to the data line DL_n, and the other of the source electrode and the drain electrode of the transistor 550 is electrically connected to the other of the pair of electrodes of the liquid crystal element 570. A gate electrode of the transistor 550 is electrically connected to the scan line GL_m. The transistor 550 is configured to be turned on or off to control whether a data signal is written.

One of a pair of electrodes of the capacitor 560 is electrically connected to a wiring through which a potential is supplied (hereinafter referred to as a potential supply line VL), and the other of the pair of electrodes of the capacitor 560 is electrically connected to the other of the pair of electrodes of the liquid crystal element 570. The potential of the potential supply line VL is set as appropriate in accordance with the specifications of the pixel circuit 501. The capacitor 560 functions as a storage capacitor for storing written data.

In the display device including the pixel circuits 501 in FIG. 25B, for example, the gate driver 504a in FIG. 25A sequentially selects the pixel circuits 501 row by row to turn on the transistors 550, and data signals are written.

When the transistor 550 is turned off, the pixel circuit 501 to which the data has been written is brought into a holding state. This operation is sequentially performed row by row; thus, an image can be displayed.

Figure 25C:
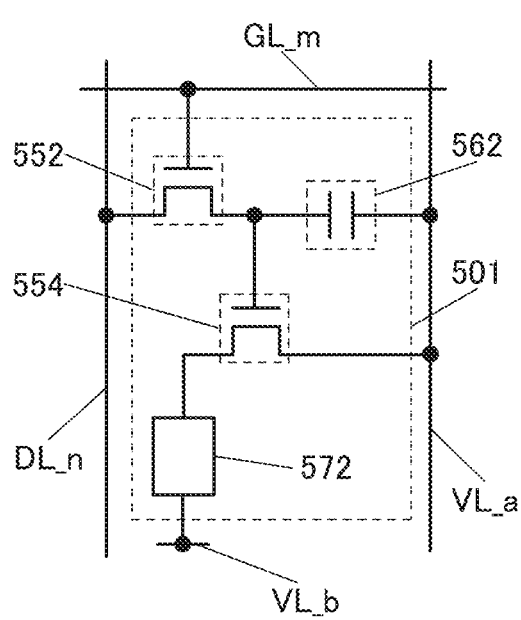

Alternatively, each of the plurality of pixel circuits 501 in FIG. 25A can have the configuration illustrated in FIG. 25C, for example.

The pixel circuit 501 in FIG. 25C includes transistors 552 and 554, a capacitor 562, and a light-emitting element 572. The transistor described in the above embodiment can be used as the transistor 552 and/or the transistor 554.

One of a source electrode and a drain electrode of the transistor 552 is electrically connected to a wiring through which a data signal is supplied (hereinafter referred to as a data line DL_n). A gate electrode of the transistor 552 is electrically connected to a wiring through which a gate signal is supplied (hereinafter referred to as a scan line GL_m).

The transistor 552 is configured to be turned on or off to control whether a data signal is written.

One of a pair of electrodes of the capacitor 562 is electrically connected to a wiring through which a potential is supplied (hereinafter referred to as a potential supply line VL_a), and the other of the pair of electrodes of the capacitor 562 is electrically connected to the other of the source electrode and the drain electrode of the transistor 552.

The capacitor 562 functions as a storage capacitor for storing written data.

One of a source electrode and a drain electrode of the transistor 554 is electrically connected to the potential supply line VL_a. A gate electrode of the transistor 554 is electrically connected to the other of the source electrode and the drain electrode of the transistor 552.

One of an anode and a cathode of the light-emitting element 572 is electrically connected to a potential supply line VL_b, and the other of the anode and the cathode of the light-emitting element 572 is electrically connected to the other of the source electrode and the drain electrode of the transistor 554.

As the light-emitting element 572, an organic electroluminescent element (also referred to as an organic EL element) can be used, for example. Note that the light-emitting element 572 is not limited thereto and may be an inorganic EL element including an inorganic material.

A high power supply potential $V_{DD}$ is supplied to one of the potential supply line VL_a and the potential supply line VL_b, and a low power supply potential $V_{SS}$ is supplied to the other of the potential supply line VL_a and the potential supply line VL_b.

In the display device including the pixel circuits 501 in FIG. 25C, the gate driver 504a in FIG. 25A sequentially selects the pixel circuits 501 row by row to turn on the transistors 552, and data signals are written.

When the transistor 552 is turned off, the pixel circuit 501 to which the data has been written is brought into a holding state. Furthermore, the amount of current flowing between the source electrode and the drain electrode of the transistor 554 is controlled in accordance with the potential of the written data signal. The light-emitting element 572 emits light with a luminance corresponding to the amount of flowing current. This operation is sequentially performed row by row; thus, an image can be displayed.

At least part of this embodiment can be implemented in combination with any of the other embodiments and example described in this specification as appropriate.

Embodiment 7

In this embodiment, a display module and electronic devices, each of which includes a semiconductor device of one embodiment of the present invention, will be described with reference to FIG. 26, FIGS. 27A to 27E, and FIGS. 28A to 28G.

<7-1. Display Module>

Figure 26:
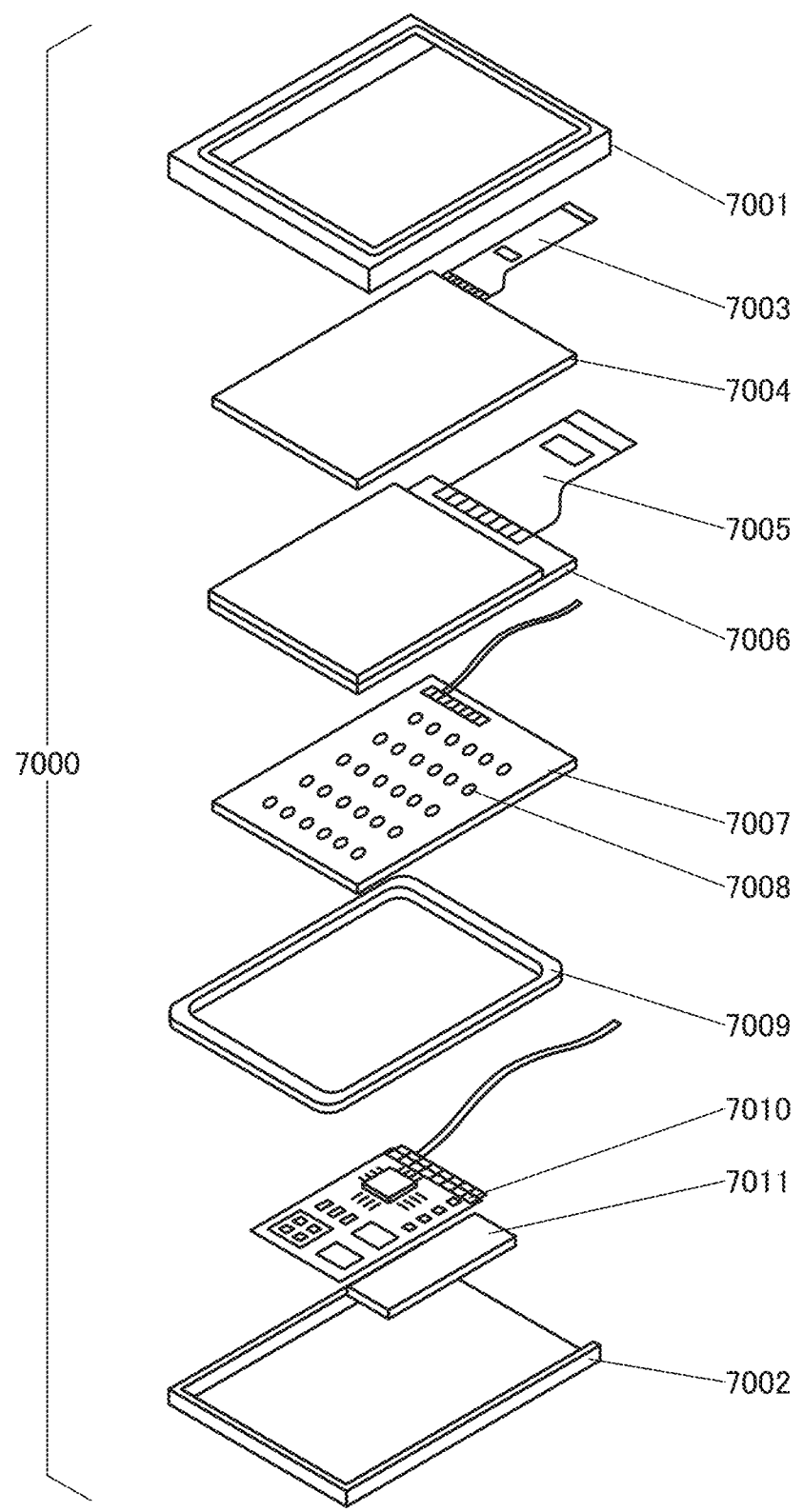
FIG. 26 illustrates a display module.

In a display module 7000 illustrated in FIG. 26, a touch panel 7004 connected to an FPC 7003, a display panel 7006 connected to an FPC 7005, a backlight 7007, a frame 7009, a printed-circuit board 7010, and a battery 7011 are provided between an upper cover 7001 and a lower cover 7002.

The semiconductor device of one embodiment of the present invention can be used for the display panel 7006, for example.

The shapes and sizes of the upper cover 7001 and the lower cover 7002 can be changed as appropriate in accordance with the sizes of the touch panel 7004 and the display panel 7006.

The touch panel 7004 can be a resistive touch panel or a capacitive touch panel and overlap with the display panel 7006. Alternatively, a counter substrate (sealing substrate) of the display panel 7006 can have a touch panel function. Alternatively, a photosensor may be provided in each pixel of the display panel 7006 to form an optical touch panel.

The backlight 7007 includes a light source 7008. One embodiment of the present invention is not limited to the structure in FIG. 26, in which the light source 7008 is provided over the backlight 7007. For example, a structure in which the light source 7008 is provided at an end portion of the backlight 7007 and a light diffusion plate is further provided may be employed. Note that the backlight 7007 need not be provided in the case where a self-luminous light-emitting element such as an organic EL element is used or in the case where a reflective panel or the like is employed.

The frame 7009 protects the display panel 7006 and functions as an electromagnetic shield for blocking electromagnetic waves generated by the operation of the printed-circuit board 7010. The frame 7009 may also function as a radiator plate.

The printed-circuit board 7010 includes a power supply circuit and a signal processing circuit for outputting a video signal and a clock signal. As a power source for supplying power to the power supply circuit, an external commercial power source or the separate battery 7011 may be used. The battery 7011 can be omitted in the case where a commercial power source is used.

The display module 7000 may be additionally provided with a member such as a polarizing plate, a retardation plate, or a prism sheet.

<7-2. Electronic Device 1>

Next, FIGS. 27A to 27E illustrate examples of electronic devices.

Figure 27A:
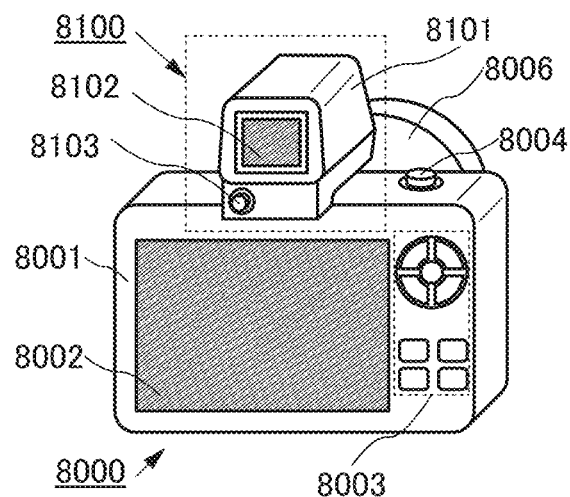
FIGS. 27A to 27E illustrate electronic devices.

FIG. 27A is an external view of a camera 8000 to which a finder 8100 is attached.

The camera 8000 includes a housing 8001, a display portion 8002, an operation button 8003, a shutter button 8004, and the like. Furthermore, an attachable lens 8006 is attached to the camera 8000.

Although the lens 8006 of the camera 8000 here is detachable from the housing 8001 for replacement, the lens 8006 may be included in the housing 8001.

Images can be taken with the camera 8000 at the press of the shutter button 8004. In addition, images can be taken at the touch of the display portion 8002 that serves as a touch panel.

The housing 8001 of the camera 8000 includes a mount including an electrode, so that the finder 8100, a stroboscope, or the like can be connected to the housing 8001.

The finder 8100 includes a housing 8101, a display portion 8102, a button 8103, and the like.

The housing 8101 includes a mount for engagement with the mount of the camera 8000 so that the finder 8100 can be connected to the camera 8000. The mount includes an electrode, and an image or the like received from the camera 8000 through the electrode can be displayed on the display portion 8102.

The button 8103 serves as a power button. The on/off state of the display portion 8102 can be switched with the button 8103.

A display device of one embodiment of the present invention can be used in the display portion 8002 of the camera 8000 and the display portion 8102 of the finder 8100.

Although the camera 8000 and the finder 8100 are separate and detachable electronic devices in FIG. 27A, the housing 8001 of the camera 8000 may include a finder having a display device.

Figure 27B:
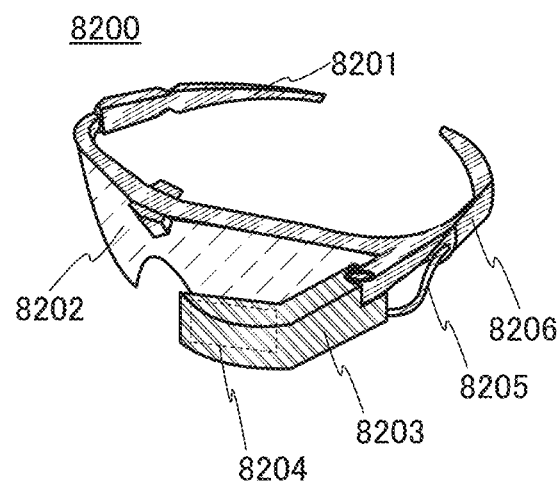

FIG. 27B is an external view of a head-mounted display 8200.

The head-mounted display 8200 includes a mounting portion 8201, a lens 8202, a main body 8203, a display portion 8204, a cable 8205, and the like. The mounting portion 8201 includes a battery 8206.

Power is supplied from the battery 8206 to the main body 8203 through the cable 8205. The main body 8203 includes a wireless receiver or the like to receive video data, such as image data, and display it on the display portion 8204. The movement of the eyeball and the eyelid of a user is captured by a camera in the main body 8203 and then coordinates of the points the user looks at are calculated using the captured data to utilize the eye of the user as an input means.

The mounting portion 8201 may include a plurality of electrodes so as to be in contact with the user. The main body 8203 may be configured to sense current flowing through the electrodes with the movement of the user's eyeball to recognize the direction of his or her eyes. The main body 8203 may be configured to sense current flowing through the electrodes to monitor the user's pulse. The mounting portion 8201 may include sensors, such as a temperature sensor, a pressure sensor, or an acceleration sensor so that the user's biological information can be displayed on the display portion 8204. The main body 8203 may be configured to sense the movement of the user's head or the like to move an image displayed on the display portion 8204 in synchronization with the movement of the user's head or the like.

The display device of one embodiment of the present invention can be used in the display portion 8204.

Figure 27C:
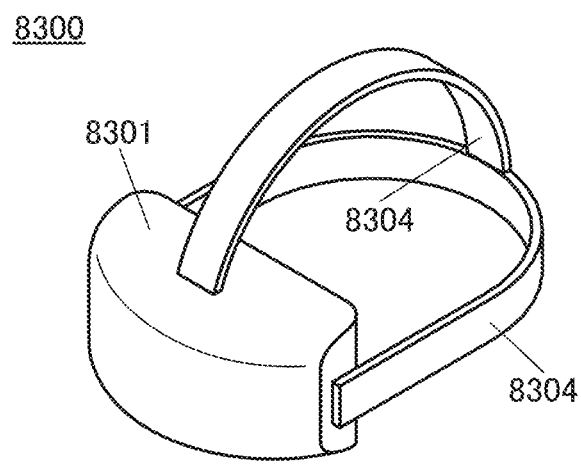
Figure 27D:
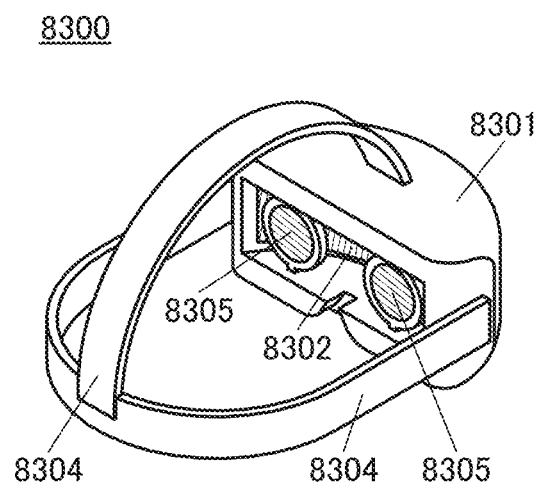
Figure 27E:
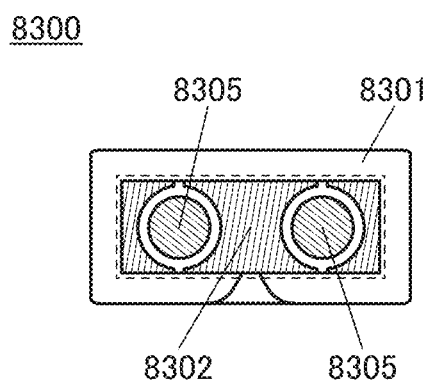

FIGS. 27C to 27E are external views of a head-mounted display 8300. The head-mounted display 8300 includes a housing 8301, a display portion 8302, an object for fixing, such as a band, 8304, and a pair of lenses 8305.

A user can see display on the display portion 8302 through the lenses 8305. It is favorable that the display portion 8302 is curved. When the display portion 8302 is curved, a user can feel high realistic sensation of images. Although the structure described in this embodiment as an example has one display portion 8302, the number of the display portions 8302 provided is not limited to one. For example, two display portions 8302 may be provided, in which case one display portion is provided for one corresponding user's eye, so that three-dimensional display using parallax or the like is possible.

The display device of one embodiment of the present invention can be used in the display portion 8302. The display device including the semiconductor device of one embodiment of the present invention has an extremely high resolution; thus, even when an image is magnified using the lenses 8305 as illustrated in FIG. 27E, the user does not perceive pixels, and thus a more realistic image can be displayed.

<7-3. Electronic Device 2>

Next, FIGS. 28A to 28G illustrate examples of electronic devices that are different from those illustrated in FIGS. 27A to 27E.

Electronic devices illustrated in FIGS. 28A to 28G include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 9008, and the like.

The electronic devices in FIGS. 28A to 28G have a variety of functions such as a function of displaying a variety of information (e.g., a still image, a moving image, and a text image) on the display portion, a touch panel function, a function of displaying a calendar, date, time, and the like, a function of controlling processing with a variety of software (programs), a wireless communication function, a function of being connected to a variety of computer networks with a wireless communication function, a function of transmitting and receiving a variety of data with a wireless communication function, and a function of reading out a program or data stored in a recording medium and displaying it on the display portion. Note that functions of the electronic devices in FIGS. 28A to 28G are not limited thereto, and the electronic devices can have a variety of functions. Although not illustrated in FIGS. 28A to 28G, the electronic devices may each have a plurality of display portions. Furthermore, the electronic devices may each be provided with a camera and the like to have a function of taking a still image, a function of taking a moving image, a function of storing the taken image in a memory medium (an external memory medium or a memory medium incorporated in the camera), a function of displaying the taken image on the display portion, or the like.

The electronic devices in FIGS. 28A to 28G are described in detail below.

Figure 28A:
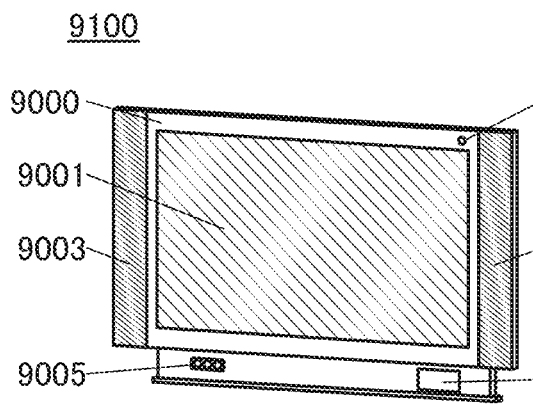
FIGS. 28A to 28G illustrate electronic devices.

FIG. 28A is a perspective view illustrating a television device 9100. The television device 9100 can include the display portion 9001 having a large screen size of, for example, 50 inches or more, or 100 inches or more.

Figure 28D:
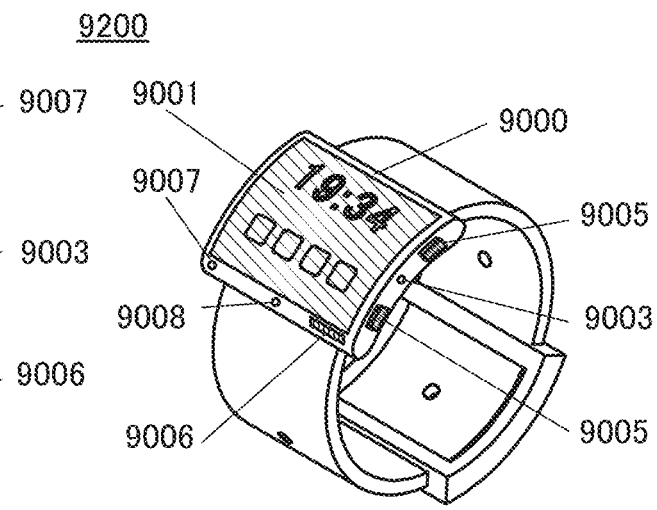
Figure 28B:
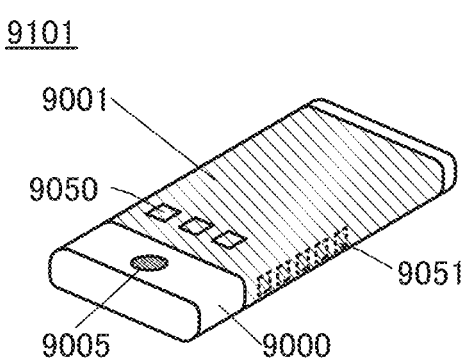

FIG. 28B is a perspective view of a portable information terminal 9101. The portable information terminal 9101 functions as, for example, one or more of a telephone set, a notebook, and an information browsing system. Specifically, the portable information terminal 9101 can be used as a smartphone. Note that the portable information terminal 9101 may include a speaker 9003, a connection terminal 9006, a sensor 9007, or the like. The portable information terminal 9101 can display text and image information on its plurality of surfaces. For example, three operation buttons 9050 (also referred to as operation icons or simply as icons) can be displayed on one surface of the display portion 9001. Furthermore, information 9051 indicated by dashed rectangles can be displayed on another surface of the display portion 9001. Examples of the information 9051 include display indicating reception of an e-mail, a social networking service (SNS) message, or a telephone call, the title and sender of an e-mail or an SNS message, date, time, remaining battery, and reception strength of an antenna. Alternatively, the operation buttons 9050 or the like may be displayed in place of the information 9051.

Figure 28E:
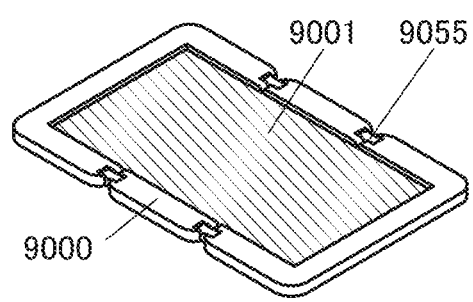
Figure 28C:
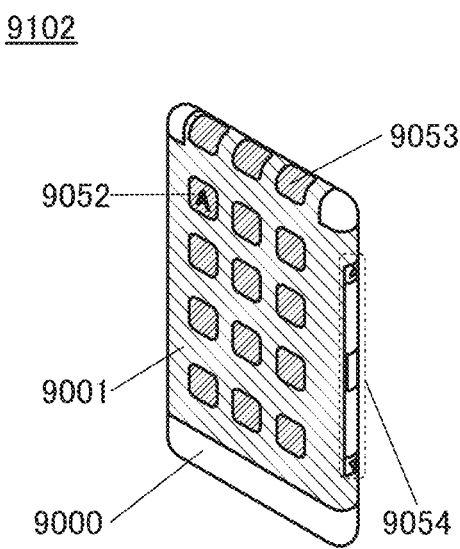

FIG. 28C is a perspective view of a portable information terminal 9102. The portable information terminal 9102 has a function of displaying information on three or more surfaces of the display portion 9001. Here, information 9052, information 9053, and information 9054 are displayed on different surfaces. For example, a user of the portable information terminal 9102 can see the display (here, the information 9053) on the portable information terminal 9102 put in a breast pocket of his/her clothes. Specifically, a caller's phone number, name, or the like of an incoming call is displayed in a position that can be seen from above the portable information terminal 9102. The user can see the display without taking out the portable information terminal 9102 from the pocket and decide whether to answer the call.

FIG. 28D is a perspective view of a watch-type portable information terminal 9200. The portable information terminal 9200 is capable of executing a variety of applications such as mobile phone calls, e-mailing, reading and editing texts, music reproduction, Internet communication, and a computer game. The display surface of the display portion 9001 is curved, and display can be performed on the curved display surface. The portable information terminal 9200 can employ near field communication conformable to a communication standard. For example, hands-free calling can be achieved by mutual communication between the portable information terminal 9200 and a headset capable of wireless communication. Moreover, the portable information terminal 9200 includes the connection terminal 9006 and can perform direct data communication with another information terminal via a connector. Charging through the connection terminal 9006 is also possible. Note that the charging operation may be performed by wireless power feeding without using the connection terminal 9006.

Figure 28F:
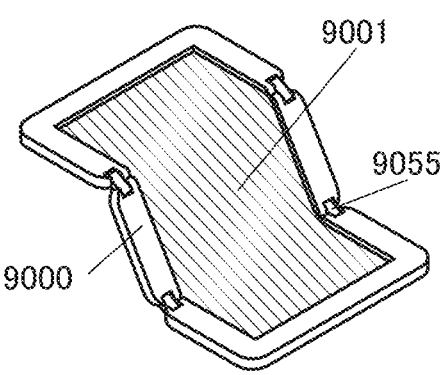
Figure 28G:
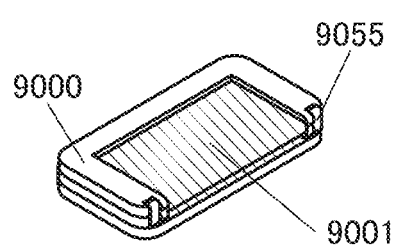

FIGS. 28E, 28F, and 28G are perspective views of a foldable portable information terminal 9201 that is opened, that is shifted from the opened state to the folded state or from the folded state to the opened state, and that is folded, respectively. The portable information terminal 9201 is highly portable when folded. When the portable information terminal 9201 is opened, a seamless large display region is highly browsable. The display portion 9001 of the portable information terminal 9201 is supported by three housings 9000 joined by hinges 9055. By being folded at the hinges 9055 between the two adjacent housings 9000, the portable information terminal 9201 can be reversibly changed in shape from the opened state to the folded state. For example, the portable information terminal 9201 can be bent with a radius of curvature greater than or equal to 1 mm and less than or equal to 150 mm.

The electronic devices described in this embodiment are characterized by having a display portion for displaying some sort of information. Note that the semiconductor device of one embodiment of the present invention can also be used for an electronic device that does not have a display portion.

At least part of this embodiment can be implemented in combination with any of the other embodiments and example described in this specification as appropriate.

EXAMPLE

In this example, an evaluation sample including an oxide semiconductor film was fabricated and the sheet resistance of the evaluation sample was measured.

<1. Structure of Evaluation Sample>

First, the structure of the evaluation sample will be described with reference to FIGS. 29A and 29B.

Figure 29A:
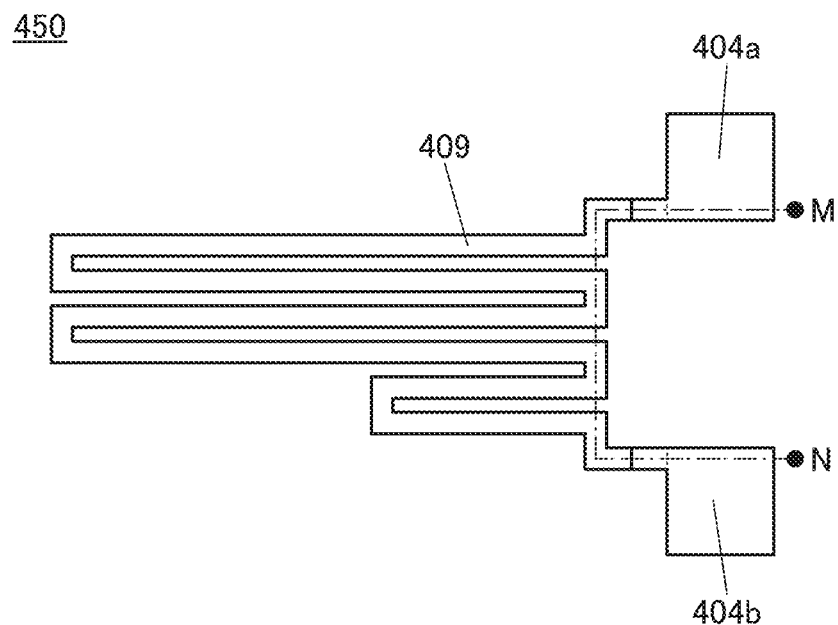
FIGS. 29A and 29B are a top view and a cross-sectional view illustrating one embodiment of an evaluation sample.
Figure 29B:
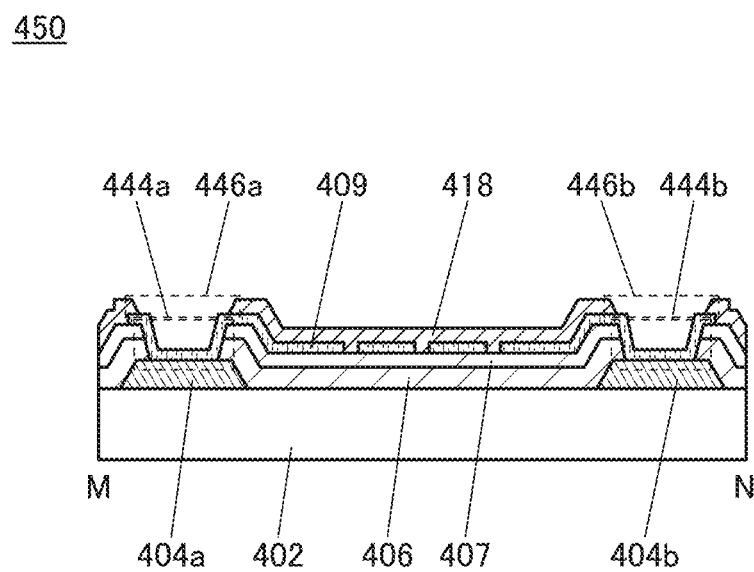

FIG. 29A is a top view of an evaluation sample 450, and FIG. 29B is a cross-sectional view taken along a dashed dotted line M-N in FIG. 29A.

The evaluation sample 450 includes a conductive film 404a and a conductive film 404b over a substrate 402, an insulating film 406 covering the substrate 402 and the conductive films 404a and 404b, an insulating film 407 over the insulating film 406, an oxide conductive film 409 over the insulating film 407, and an insulating film 418 over the insulating film 407 and the oxide conductive film 409. An opening 444a reaching the conductive film 404a and an opening 444b reaching the conductive film 404b are provided in the insulating films 406 and 407. In addition, an opening 446a and an opening 446b reaching the oxide conductive film 409 are provided in the insulating film 418. The conductive film 404a is connected to the oxide conductive film 409 in the opening 444a and the conductive film 404b is connected to the oxide conductive film 409 in the opening 444b.

In this example, a sample corresponding to the evaluation sample 450 in FIGS. 29A and 29B was fabricated and the sheet resistance of the oxide conductive film 409 was measured. Note that three samples (Samples A1 to A3) which were different in the composition of the oxide conductive film 409 were fabricated and evaluated in this example.

The size of the oxide conductive film 409 was W/L=10 μm/1500 μm in each of Samples A1 to A3. Note that each of Samples A1 and A3 was a sample of one embodiment of the present invention and Sample A2 was a sample for comparison.

<2. Fabrication Method of Samples>

Next, a fabrication method of the three samples (Samples A1 to A3) will be described.

First, the conductive films 404a and 404b were formed over the substrate 402. A glass substrate was used as the substrate 402. As the conductive films 404a and 404b, a 50-nm-thick tungsten film, a 400-nm-thick aluminum film, and a 100-nm-thick titanium film were formed with a sputtering apparatus.

Next, the insulating films 406 and 407 were formed over the substrate 402 and the conductive films 404a and 404b. As the insulating film 406, a 30-nm-thick silicon oxynitride film was formed with a PECVD apparatus. Moreover, as the insulating film 407, a 400-nm-thick silicon oxynitride film was formed with a PECVD apparatus.

Next, heat treatment was performed. The heat treatment was performed at 350° C. in a nitrogen atmosphere for one hour.

Next, a resist mask was formed over the insulating film 407, and a desired region was etched to form the openings 444a and 444b reaching the conductive films 404a and 404b, respectively. The openings 444a and 444b were formed with a dry etching apparatus. Note that the resist mask was removed after the openings 444a and 444b were formed.

Then, an oxide semiconductor film to be the oxide conductive film 409 was formed over the insulating film 407 so as to cover the openings 444a and 444b. Note that Samples A1 to A3 were different in the formation conditions of the oxide semiconductor film.

[Sample A1]

For an oxide semiconductor film of Sample A1, a 100-nm-thick In—Sn—Si oxide (hereinafter also referred to as ITSO) was formed by a sputtering method. Note that the composition of a target used for forming the In—Sn—Si oxide of Sample A1 was In:Sn:Si=85:10:5 (weight ratio).

[Sample A2]

For an oxide semiconductor film of Sample A2, a 100-nm-thick In—Ga—Zn oxide was formed by a sputtering method. Note that the composition of a target used for forming the In—Ga—Zn oxide of Sample A2 was In:Ga:Zn=1:1:1.2 (atomic ratio).

[Sample A3]

For an oxide semiconductor film of Sample A3, a 100-nm-thick In—Ga—Zn oxide was formed by a sputtering method. Note that the composition of a target used for forming the In—Ga—Zn oxide of Sample A3 was In:Ga:Zn=4:2:4.1 (atomic ratio).

Next, the oxide semiconductor film was processed into an island shape, and the insulating film 418 was formed over the insulating film 407 and the island-shaped oxide semiconductor film. As the insulating film 418, a 100-nm-thick silicon nitride film was formed with a PECVD apparatus.

Note that when the insulating film 418 is formed, hydrogen in the insulating film 418 enters the oxide semiconductor film, so that the oxide semiconductor film serves as the oxide conductive film 409.

Next, a resist mask was formed over the insulating film 418, and a desired region was etched to form the openings 446a and 446b reaching the oxide conductive film 409. The openings 446a and 446b were formed with a dry etching apparatus. Note that the resist mask was removed after the openings 446a and 446b were formed.

Through the above process, Samples A1 to A3 were fabricated.

<3. Evaluation of Sheet Resistance>

Figure 30:
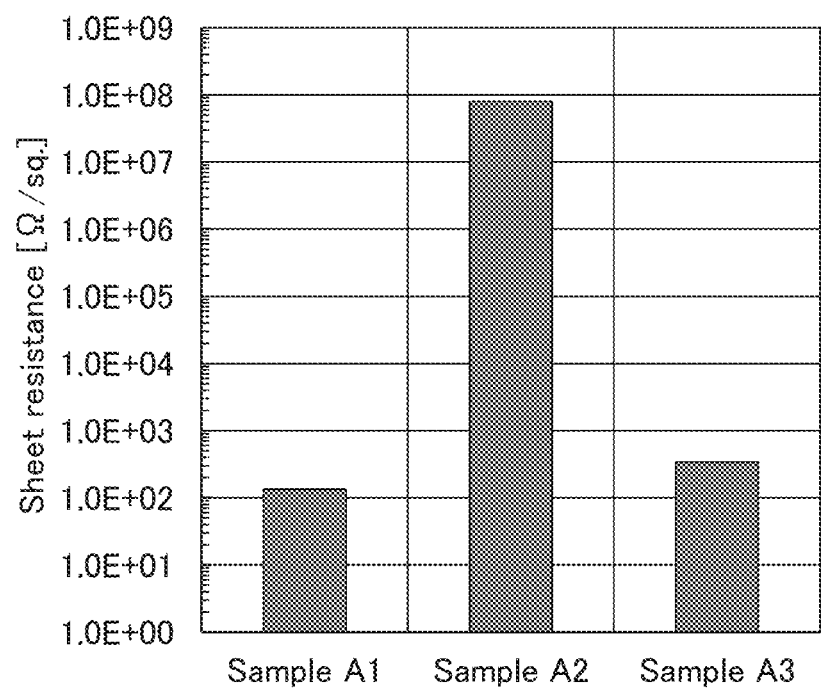
FIG. 30 shows the sheet resistances of evaluation samples.

Then, the sheet resistances of the fabricated Samples A1 to A3 were measured. FIG. 30 shows measurement results of the sheet resistances of Samples A1 to A3.

As shown in FIG. 30, the sheet resistance of Sample A1 was $1.3 \times 10^2$ Ω/sq., the sheet resistance of Sample A2 was $7.9 \times 10^7$ Ω/sq., and the sheet resistance of Sample A3 was $3.4 \times 10^2$ Ω/sq.

As described above, the sheet resistance of Sample A1 was the lowest, followed in order by those of Sample A3 and Sample A2. The oxide conductive film 409 of each of Samples A2 and A3 was formed using In—Ga—Zn oxide. A comparison between Samples A2 and A3 shows that sheet resistance differs by more than five digits when the composition of the In—Ga—Zn oxide is changed.

It is suggested that when the oxide conductive film 409 of Sample A1 or A3 is used as the oxide semiconductor film 108_2 of the transistor 100 in FIGS. 1A to 1C, for example, the contact resistance between the oxide semiconductor film 108 and the pair of electrodes (the conductive films 112a and 112b) is lowered.

Note that excess oxygen is supplied from the insulating films 114 and 116 to a region where the oxide semiconductor film 108 is not in contact with the pair of electrodes; accordingly, when the oxide conductive film 409 is used as the oxide semiconductor film 108 in FIGS. 1A to 1C, the resistance of a channel region can be sufficiently increased and the contact resistance between the oxide semiconductor film 108 and the pair of electrodes can be sufficiently reduced.

At least part of this embodiment can be implemented in combination with any of the other embodiments described in this specification as appropriate.

This application is based on Japanese Patent Application serial no. 2016-094012 filed with Japan Patent Office on May 9, 2016, the entire contents of which are hereby incorporated by reference.

What is claimed is:

1. A semiconductor device comprising:
    a gate electrode;
    an insulating film over the gate electrode;
    an oxide semiconductor film over the insulating film; and
    a pair of electrodes over the oxide semiconductor film,
    wherein the oxide semiconductor film comprises a first oxide semiconductor film and a second oxide semiconductor film over the first oxide semiconductor film,
    wherein the first oxide semiconductor film is In oxide or In—Zn oxide,
    wherein the second oxide semiconductor film is In-M-Zn oxide,
    wherein M is Al, Ga, or Y, and
    wherein the second oxide semiconductor film comprises a region where a number of the In atoms is greater than or equal to 40% and less than or equal to 50% of a total number of the In atoms, the M atoms, and the Zn atoms, and a region where a number of the M atoms is greater than or equal to 5% and less than or equal to 30% of the total number of the In atoms, the M atoms, and the Zn atoms.

2. The semiconductor device according to claim 1, wherein the second oxide semiconductor film comprises a region whose sheet resistance is higher than or equal to $1 \times 10^2$ Ω/square and lower than $1 \times 10^6$ Ω/square in a region in contact with the pair of electrodes.

3. The semiconductor device according to claim 1, wherein a peak is observed at around $2\theta=31°$ not in the first oxide semiconductor film but in the second oxide semiconductor film when a crystal structure of the oxide semiconductor film is measured by XRD analysis.

4. The semiconductor device according to claim 1,
wherein the first oxide semiconductor film comprises a region not comprising the M.

5. The semiconductor device according to claim 1,
wherein when an atomic ratio of the In to the M to the Zn is x:y:z and x is 4, the second oxide semiconductor film comprises a region where y is higher than or equal to 1.5 and lower than or equal to 2.5 and z is higher than or equal to 2 and lower than or equal to 4.

6. The semiconductor device according to claim 5,
wherein the atomic ratio of the In to the M to the Zn is 4:2:3 or in a neighborhood of 4:2:3.

7. The semiconductor device according to claim 1,
wherein when an atomic ratio of the In to the M to the Zn is x:y:z and x is 5, the second oxide semiconductor film comprises a region where y is higher than or equal to 0.5 and lower than or equal to 1.5 and z is higher than or equal to 5 and lower than or equal to 7.

8. The semiconductor device according to claim 7,
wherein the atomic ratio of the In to the M to the Zn is 5:1:6 or in a neighborhood of 5:1:6.

9. A display device comprising:
the semiconductor device according to claim 1; and
a display element.

10. An electronic device comprising:
the display device according to claim 9; and
an operation key or a battery.

* * * * *